United States Patent
Buller et al.

(10) Patent No.: US 10,065,270 B2
(45) Date of Patent: Sep. 4, 2018

(54) THREE-DIMENSIONAL PRINTING IN REAL TIME

(71) Applicant: Velo3D, Inc., Campbell, CA (US)

(72) Inventors: Benyamin Buller, Cupertino, CA (US); Tasso Lappas, Pasadena, CA (US); Rueben Mendelsberg, Santa Clara, CA (US); Sergey Korepanov, Los Altos, CA (US)

(73) Assignee: VELO3D, INC., Campbell, CA (US)

( * ) Notice: Subject to any disclaimer, the term of this patent is extended or adjusted under 35 U.S.C. 154(b) by 0 days.

(21) Appl. No.: 15/339,712

(22) Filed: Oct. 31, 2016

(65) Prior Publication Data

US 2017/0129052 A1   May 11, 2017

Related U.S. Application Data

(60) Provisional application No. 62/252,330, filed on Nov. 6, 2015, provisional application No. 62/396,584, filed on Sep. 19, 2016.

(51) Int. Cl.
*B33Y 10/00* (2015.01)
*B33Y 30/00* (2015.01)
(Continued)

(52) U.S. Cl.
CPC .......... *B23K 26/342* (2015.10); *B22F 3/1055* (2013.01); *B23K 15/0086* (2013.01); *B23K 15/02* (2013.01); *B23K 26/0884* (2013.01); *B23K 26/702* (2015.10); *B28B 1/001* (2013.01); *B29C 67/0077* (2013.01); *B29C 67/0088* (2013.01); *B29C 67/0092* (2013.01); *B33Y 10/00* (2014.12); *B33Y 30/00* (2014.12); (Continued)

(58) Field of Classification Search
CPC ........ B33Y 50/00; B33Y 50/02; B29C 64/386
See application file for complete search history.

(56) References Cited

U.S. PATENT DOCUMENTS

| 430,047 A | 6/1890 | Tylee |
|---|---|---|
| 3,790,787 A | 2/1974 | Geller |

(Continued)

FOREIGN PATENT DOCUMENTS

| CN | 101835554 A | 9/2010 |
|---|---|---|
| CN | 102076456 A | 5/2011 |

(Continued)

OTHER PUBLICATIONS

Xiao et al., "Numerical Simulation of Direct Metal Laser Sintering of Single-Component Powder on Top of Sintered Layers", Aug. 2008, Journal of Manufacturing Science and Engineering, vol. 130, pp. 041002-1 to 041002-10.*

(Continued)

*Primary Examiner* — Geoffrey S Evans
(74) *Attorney, Agent, or Firm* — Wilson Sonsini Goodrich & Rosati

(57) ABSTRACT

The present disclosure provides three-dimensional (3D) printing methods, apparatuses, systems, and non-transitory computer-readable medium. The disclosure delineates real time manipulation of three-dimensional printing to reduce deformation. The present disclosure further provides 3D object formed using the methods, apparatuses, and systems.

30 Claims, 18 Drawing Sheets

(51) Int. Cl.

| | | |
|---|---|---|
| *B23K 26/342* | (2014.01) | |
| *B28B 1/00* | (2006.01) | |
| *B29C 67/00* | (2017.01) | |
| *B33Y 50/02* | (2015.01) | |
| *B23K 15/00* | (2006.01) | |
| *B23K 15/02* | (2006.01) | |
| *B23K 26/08* | (2014.01) | |
| *B23K 26/70* | (2014.01) | |
| *B22F 3/105* | (2006.01) | |
| *B29K 105/00* | (2006.01) | |

(52) U.S. Cl.
CPC ....... *B33Y 50/02* (2014.12); *B22F 2003/1057* (2013.01); *B29K 2105/251* (2013.01)

(56) References Cited

U.S. PATENT DOCUMENTS

| | | |
|---|---|---|
| 4,177,087 A | 12/1979 | Hills et al. |
| 4,323,756 A | 4/1982 | Brown et al. |
| 4,863,538 A | 9/1989 | Deckard |
| 4,927,582 A | 5/1990 | Bryson |
| 4,938,816 A | 7/1990 | Beaman et al. |
| 4,961,154 A | 10/1990 | Pomerantz et al. |
| 4,962,988 A | 10/1990 | Swann |
| 5,088,047 A | 2/1992 | Bynum |
| 5,127,037 A | 6/1992 | Bynum |
| 5,155,321 A | 10/1992 | Grube et al. |
| 5,156,697 A | 10/1992 | Bourell et al. |
| 5,162,660 A | 11/1992 | Popil |
| 5,202,837 A | 4/1993 | Coe et al. |
| 5,203,944 A | 4/1993 | Prinz et al. |
| 5,204,055 A | 4/1993 | Sachs et al. |
| 5,208,431 A | 5/1993 | Uchiyama et al. |
| 5,252,264 A | 10/1993 | Forderhase et al. |
| 5,255,057 A | 10/1993 | Stelter et al. |
| 5,286,573 A | 2/1994 | Prinz et al. |
| 5,296,062 A | 3/1994 | Bourell et al. |
| 5,303,141 A | 4/1994 | Batchelder et al. |
| 5,342,919 A | 8/1994 | Dickens, Jr. et al. |
| 5,352,405 A | 10/1994 | Beaman et al. |
| 5,354,414 A | 10/1994 | Feygin |
| 5,387,380 A | 2/1995 | Cima et al. |
| 5,393,482 A | 2/1995 | Benda et al. |
| 5,430,666 A | 7/1995 | Deangelis et al. |
| 5,460,758 A | 10/1995 | Langer et al. |
| 5,508,489 A | 4/1996 | Benda et al. |
| 5,527,877 A | 6/1996 | Dickens, Jr. et al. |
| 5,534,104 A | 7/1996 | Langer et al. |
| 5,536,467 A | 7/1996 | Reichle et al. |
| 5,582,876 A | 12/1996 | Langer et al. |
| 5,593,531 A | 1/1997 | Penn |
| 5,594,652 A | 1/1997 | Penn et al. |
| 5,647,931 A | 7/1997 | Retallick et al. |
| 5,648,450 A | 7/1997 | Dickens, Jr. et al. |
| 5,658,412 A | 8/1997 | Retallick et al. |
| 5,665,401 A | 9/1997 | Serbin et al. |
| 5,730,925 A | 3/1998 | Mattes et al. |
| 5,733,497 A | 3/1998 | McAlea et al. |
| 5,745,834 A | 4/1998 | Bampton et al. |
| 5,749,041 A | 5/1998 | Lakshminarayan et al. |
| 5,753,171 A | 5/1998 | Serbin et al. |
| 5,753,274 A | 5/1998 | Wilkening et al. |
| 5,786,562 A | 7/1998 | Larson |
| 5,818,718 A | 10/1998 | Thomas et al. |
| 5,821,475 A | 10/1998 | Morehead et al. |
| 5,824,259 A | 10/1998 | Allanic et al. |
| 5,832,415 A | 11/1998 | Wilkening et al. |
| 5,876,550 A | 3/1999 | Feygin et al. |
| 5,876,767 A | 3/1999 | Mattes et al. |
| 5,904,890 A | 5/1999 | Lohner et al. |
| 5,908,569 A | 6/1999 | Wilkening et al. |
| 5,932,059 A | 8/1999 | Langer et al. |
| 6,042,774 A | 3/2000 | Wilkening et al. |
| 6,066,285 A | 5/2000 | Kumar |
| 6,085,122 A | 7/2000 | Manning |
| 6,106,659 A | 8/2000 | Spence et al. |
| 6,126,276 A | 10/2000 | Davis et al. |
| 6,136,257 A | 10/2000 | Graf et al. |
| 6,143,378 A | 11/2000 | Harwell et al. |
| 6,151,345 A | 11/2000 | Gray |
| 6,169,605 B1 | 1/2001 | Penn et al. |
| 6,175,422 B1 | 1/2001 | Penn et al. |
| 6,206,672 B1 | 3/2001 | Grenda |
| 6,207,097 B1 | 3/2001 | Iverson |
| 6,215,093 B1 | 4/2001 | Meiners et al. |
| 6,251,488 B1 | 6/2001 | Miller et al. |
| 6,261,077 B1 | 7/2001 | Bishop et al. |
| 6,268,584 B1 | 7/2001 | Keicher et al. |
| 6,336,480 B2 | 1/2002 | Gaylo et al. |
| 6,376,148 B1 | 4/2002 | Liu et al. |
| 6,391,251 B1 | 5/2002 | Keicher et al. |
| 6,483,596 B1 | 11/2002 | Philippi et al. |
| 6,531,086 B1 | 3/2003 | Larsson |
| 6,554,600 B1 | 4/2003 | Hofmann et al. |
| 6,636,676 B1 | 10/2003 | Renn |
| 6,656,409 B1 | 12/2003 | Keicher et al. |
| 6,656,410 B2 | 12/2003 | Hull et al. |
| 6,672,343 B1 | 1/2004 | Perret et al. |
| 6,767,499 B1 | 7/2004 | Hory et al. |
| 6,811,744 B2 | 11/2004 | Keicher et al. |
| 6,814,823 B1 | 11/2004 | White |
| 6,815,636 B2 | 11/2004 | Chung et al. |
| 6,823,124 B1 | 11/2004 | Renn et al. |
| 6,824,714 B1 | 11/2004 | Tuerck et al. |
| 6,861,613 B1 | 3/2005 | Meiners et al. |
| 6,905,645 B2 | 6/2005 | Iskra |
| 6,930,278 B1 | 8/2005 | Chung et al. |
| 6,932,935 B1 | 8/2005 | Oberhofer et al. |
| 6,945,638 B2 | 9/2005 | Teung et al. |
| 6,955,023 B2 | 10/2005 | Rotheroe |
| 6,986,654 B2 | 1/2006 | Imiolek et al. |
| 6,989,115 B2 | 1/2006 | Russell et al. |
| 6,994,894 B2 | 2/2006 | Hofmeister |
| 7,008,209 B2 | 3/2006 | Iskra et al. |
| 7,027,887 B2 | 4/2006 | Gaylo et al. |
| 7,045,015 B2 | 5/2006 | Renn et al. |
| 7,047,098 B2 | 5/2006 | Lindemann et al. |
| 7,073,442 B2 | 7/2006 | Fedor et al. |
| 7,084,370 B2 | 8/2006 | Hagemeister et al. |
| 7,108,894 B2 | 9/2006 | Renn |
| 7,149,596 B2 | 12/2006 | Berger et al. |
| 7,153,463 B2 | 12/2006 | Leuterer et al. |
| 7,229,272 B2 | 6/2007 | Leuterer et al. |
| 7,241,415 B2 | 7/2007 | Khoshnevis |
| 7,261,542 B2 | 8/2007 | Hickerson et al. |
| 7,261,550 B2 | 8/2007 | Herzog |
| 7,270,844 B2 | 9/2007 | Renn |
| 7,294,366 B2 | 11/2007 | Renn et al. |
| 7,326,377 B2 | 2/2008 | Adams |
| 7,419,632 B2 | 9/2008 | Keller |
| 7,435,368 B2 | 10/2008 | Davidson et al. |
| 7,452,500 B2 | 11/2008 | Uckelmann |
| 7,454,262 B2 | 11/2008 | Larsson |
| 7,485,345 B2 | 2/2009 | Renn et al. |
| 7,515,986 B2 | 4/2009 | Huskamp |
| 7,521,652 B2 | 4/2009 | Chung et al. |
| 7,537,722 B2 | 5/2009 | Andersson et al. |
| 7,540,738 B2 | 6/2009 | Larsson et al. |
| 7,604,768 B2 | 10/2009 | Kritchman |
| 7,615,179 B2 | 11/2009 | Dumond et al. |
| 7,628,600 B2 | 12/2009 | Perret |
| 7,635,825 B2 | 12/2009 | Larsson |
| 7,639,267 B1 | 12/2009 | Desimone et al. |
| 7,658,163 B2 | 2/2010 | Renn et al. |
| 7,661,948 B2 | 2/2010 | Perret et al. |
| 7,665,979 B2 | 2/2010 | Heugel |
| 7,674,107 B2 | 3/2010 | Perret et al. |
| 7,674,671 B2 | 3/2010 | Renn et al. |
| 7,686,605 B2 | 3/2010 | Perret et al. |
| 7,704,432 B2 | 4/2010 | Dumond et al. |
| 7,713,048 B2 | 5/2010 | Perret et al. |
| 7,713,454 B2 | 5/2010 | Larsson |
| 7,740,683 B2 | 6/2010 | Thorsson et al. |

(56) References Cited

U.S. PATENT DOCUMENTS

| | | |
|---|---|---|
| 7,741,578 B2 | 6/2010 | Adams et al. |
| 7,789,037 B2 | 9/2010 | Teulet et al. |
| 7,820,241 B2 | 10/2010 | Perret et al. |
| 7,833,465 B2 | 11/2010 | Larsson |
| 7,837,458 B2 | 11/2010 | Perret et al. |
| 7,847,212 B2 | 12/2010 | Renz et al. |
| 7,850,885 B2 | 12/2010 | Philippi et al. |
| 7,863,544 B2 | 1/2011 | Serruys et al. |
| 7,871,551 B2 | 1/2011 | Wallgren et al. |
| 7,879,394 B1 | 2/2011 | Keicher et al. |
| 7,891,095 B2 | 2/2011 | Jonsson et al. |
| 7,901,604 B2 | 3/2011 | Oberhofer et al. |
| 7,931,462 B2 | 4/2011 | Mattes |
| 7,936,352 B2 | 5/2011 | Baran et al. |
| 7,938,079 B2 | 5/2011 | King et al. |
| 7,938,341 B2 | 5/2011 | Renn et al. |
| 7,946,840 B2 | 5/2011 | Perret et al. |
| 7,976,302 B2 | 7/2011 | Halder et al. |
| 7,987,813 B2 | 8/2011 | Renn et al. |
| 8,025,831 B2 | 9/2011 | Kong et al. |
| 8,031,384 B2 | 10/2011 | Perret et al. |
| 8,034,279 B2 | 10/2011 | Dimter et al. |
| 8,073,315 B2 | 12/2011 | Philippi |
| 8,075,814 B2 | 12/2011 | Fruth et al. |
| 8,083,513 B2 | 12/2011 | Montero-Escuder et al. |
| 8,110,247 B2 | 2/2012 | Renn et al. |
| 8,124,192 B2 | 2/2012 | Paasche et al. |
| 8,132,744 B2 | 3/2012 | Renn et al. |
| 8,137,739 B2 | 3/2012 | Philippi et al. |
| 8,172,562 B2 | 5/2012 | Mattes |
| 8,186,414 B2 | 5/2012 | Furlong et al. |
| 8,186,990 B2 | 5/2012 | Perret et al. |
| 8,187,521 B2 | 5/2012 | Larsson et al. |
| 8,187,522 B2 | 5/2012 | Higashi et al. |
| 8,249,480 B2 | 8/2012 | Aslam et al. |
| 8,260,447 B2 | 9/2012 | Mattes et al. |
| 8,272,579 B2 | 9/2012 | King et al. |
| 8,299,208 B2 | 10/2012 | Ller et al. |
| 8,303,886 B2 | 11/2012 | Philippi |
| 8,308,466 B2 | 11/2012 | Ackelid et al. |
| 8,313,087 B2 | 11/2012 | Hesse et al. |
| 8,317,508 B2 | 11/2012 | Bokodi et al. |
| 8,366,432 B2 | 2/2013 | Perret et al. |
| 8,414,281 B2 | 4/2013 | Schleiss et al. |
| 8,455,051 B2 | 6/2013 | Renn et al. |
| 8,488,994 B2 | 7/2013 | Hanson et al. |
| 8,501,075 B2 | 8/2013 | Philippi et al. |
| 8,502,107 B2 | 8/2013 | Uckelmann |
| 8,524,142 B2 | 9/2013 | Uckelmann et al. |
| 8,525,071 B2 | 9/2013 | Leuterer |
| 8,570,534 B1 | 10/2013 | Loewgren |
| 8,590,157 B2 | 11/2013 | Kruth et al. |
| 8,640,975 B2 | 2/2014 | King |
| 8,658,078 B2 | 2/2014 | Weidinger et al. |
| 8,705,144 B2 | 4/2014 | Gullentops et al. |
| 8,710,144 B2 | 4/2014 | Hesse et al. |
| 8,728,387 B2 | 5/2014 | Jones et al. |
| 8,734,694 B2 | 5/2014 | Perret et al. |
| 8,753,105 B2 | 6/2014 | Scott |
| 8,784,720 B2 | 7/2014 | Oberhofer et al. |
| 8,784,721 B2 | 7/2014 | Philippi et al. |
| 8,794,263 B2 | 8/2014 | Scott et al. |
| 8,796,146 B2 | 8/2014 | Renn et al. |
| 8,803,073 B2 | 8/2014 | Philippi |
| 8,845,319 B2 | 9/2014 | Oberhofer et al. |
| 8,884,186 B2 | 11/2014 | Uckelmann et al. |
| 8,887,658 B2 | 11/2014 | Essien et al. |
| 8,895,893 B2 | 11/2014 | Perret et al. |
| 8,967,990 B2 | 3/2015 | Weidinger et al. |
| 8,968,625 B2 | 3/2015 | Tan |
| 8,994,592 B2 | 3/2015 | Scott et al. |
| 9,011,982 B2 | 4/2015 | Muller et al. |
| 9,064,671 B2 | 6/2015 | Ljungblad et al. |
| 9,073,265 B2 | 7/2015 | Snis |
| 9,079,248 B2 | 7/2015 | Ackelid |
| 9,114,478 B2 | 8/2015 | Scott et al. |
| 9,114,652 B1 | 8/2015 | Wayman |
| 9,117,039 B1 | 8/2015 | Mosterman et al. |
| 9,126,167 B2 | 9/2015 | Ljungblad |
| 9,162,393 B2 | 10/2015 | Ackelid |
| 9,162,394 B2 | 10/2015 | Ackelid |
| 9,192,054 B2 | 11/2015 | King et al. |
| 9,205,691 B1 | 12/2015 | Jones et al. |
| 9,221,100 B2 | 12/2015 | Schwarze et al. |
| 9,233,507 B2 | 1/2016 | Bibas |
| 9,254,535 B2 | 2/2016 | Buller et al. |
| 9,314,972 B2 | 4/2016 | Green |
| 9,327,450 B2 | 5/2016 | Hein et al. |
| 9,327,451 B2 | 5/2016 | Teulet |
| 9,346,127 B2 | 5/2016 | Buller et al. |
| 9,399,256 B2 | 7/2016 | Buller et al. |
| 9,403,235 B2 | 8/2016 | Buller et al. |
| 9,415,443 B2 | 8/2016 | Ljungblad et al. |
| 9,486,878 B2 | 11/2016 | Buller et al. |
| 9,498,921 B2 | 11/2016 | Teulet et al. |
| 9,505,057 B2 | 11/2016 | Nordkvist et al. |
| 9,522,426 B2 | 12/2016 | Das et al. |
| 9,527,246 B2 | 12/2016 | Wiesner et al. |
| 9,533,452 B2 | 1/2017 | Guenster et al. |
| 9,550,207 B2 | 1/2017 | Ackelid et al. |
| 9,573,193 B2 | 2/2017 | Buller et al. |
| 9,573,225 B2 | 2/2017 | Buller et al. |
| 9,586,290 B2 | 3/2017 | Buller et al. |
| 9,592,554 B2 | 3/2017 | Abe et al. |
| 9,700,908 B2 | 7/2017 | Baker et al. |
| 9,827,717 B2 | 11/2017 | Huang et al. |
| 9,886,526 B2 | 2/2018 | Huang et al. |
| 2002/0020945 A1 | 2/2002 | Cho et al. |
| 2002/0041818 A1 | 4/2002 | Abe et al. |
| 2002/0104973 A1 | 8/2002 | Kerekes |
| 2002/0152002 A1 | 10/2002 | Lindemann et al. |
| 2002/0158054 A1 | 10/2002 | Manetsberger et al. |
| 2002/0195747 A1 | 12/2002 | Hull et al. |
| 2003/0201255 A1 | 10/2003 | Manetsberger et al. |
| 2003/0222066 A1 | 12/2003 | Low et al. |
| 2003/0232512 A1 | 12/2003 | Dickinson et al. |
| 2004/0003738 A1 | 1/2004 | Imiolek et al. |
| 2004/0003741 A1 | 1/2004 | Iskra et al. |
| 2004/0004303 A1 | 1/2004 | Iskra |
| 2004/0004653 A1 | 1/2004 | Pryor et al. |
| 2004/0005182 A1 | 1/2004 | Gaylo et al. |
| 2004/0026807 A1 | 2/2004 | Andersson et al. |
| 2004/0045941 A1 | 3/2004 | Herzog et al. |
| 2004/0056022 A1 | 3/2004 | Meiners et al. |
| 2004/0061260 A1 | 4/2004 | Heugel |
| 2004/0084814 A1 | 5/2004 | Boyd et al. |
| 2004/0094728 A1 | 5/2004 | Herzog et al. |
| 2004/0099996 A1 | 5/2004 | Herzog |
| 2004/0118309 A1 | 6/2004 | Fedor et al. |
| 2004/0173946 A1 | 9/2004 | Pfeifer et al. |
| 2004/0179808 A1 | 9/2004 | Renn |
| 2004/0197493 A1 | 10/2004 | Renn et al. |
| 2004/0204785 A1 | 10/2004 | Richardson |
| 2004/0217095 A1 | 11/2004 | Herzog |
| 2004/0222549 A1 | 11/2004 | Sano et al. |
| 2004/0228004 A1 | 11/2004 | Sercel et al. |
| 2004/0262261 A1 | 12/2004 | Fink et al. |
| 2005/0035285 A1 | 2/2005 | Tan et al. |
| 2005/0116391 A1 | 6/2005 | Lindemann et al. |
| 2005/0133527 A1 | 6/2005 | Dullea et al. |
| 2005/0142024 A1 | 6/2005 | Herzog |
| 2005/0156991 A1 | 7/2005 | Renn |
| 2005/0163917 A1 | 7/2005 | Renn |
| 2005/0186716 A1 | 8/2005 | Kasumi |
| 2005/0207901 A1 | 9/2005 | Klobucar et al. |
| 2005/0258570 A1 | 11/2005 | Kong et al. |
| 2005/0278933 A1 | 12/2005 | Macke, Jr. et al. |
| 2005/0287031 A1 | 12/2005 | Macke, Jr. et al. |
| 2006/0003095 A1 | 1/2006 | Bullen et al. |
| 2006/0019232 A1 | 1/2006 | Fischer et al. |
| 2006/0054079 A1 | 3/2006 | Withey et al. |
| 2006/0118532 A1 | 6/2006 | Chung et al. |
| 2006/0192322 A1 | 8/2006 | Abe et al. |
| 2006/0208396 A1 | 9/2006 | Abe et al. |

(56) References Cited

U.S. PATENT DOCUMENTS

| | | |
|---|---|---|
| 2006/0228248 A1 | 10/2006 | Larsson |
| 2006/0249485 A1 | 11/2006 | Partanen et al. |
| 2006/0280866 A1 | 12/2006 | Marquez et al. |
| 2007/0001342 A1 | 1/2007 | Oberhofer et al. |
| 2007/0003656 A1 | 1/2007 | Labossiere et al. |
| 2007/0019028 A1 | 1/2007 | Renn et al. |
| 2007/0023977 A1 | 2/2007 | Braun et al. |
| 2007/0035069 A1 | 2/2007 | Wust et al. |
| 2007/0051704 A1 | 3/2007 | Husmann et al. |
| 2007/0057412 A1 | 3/2007 | Weiskopf et al. |
| 2007/0122562 A1 | 5/2007 | Adams |
| 2007/0142914 A1 | 6/2007 | Jones et al. |
| 2007/0154634 A1 | 7/2007 | Renn |
| 2007/0175875 A1 | 8/2007 | Uckelmann et al. |
| 2007/0183918 A1 | 8/2007 | Monsheimer et al. |
| 2007/0196561 A1 | 8/2007 | Philippi et al. |
| 2007/0241482 A1 | 10/2007 | Giller et al. |
| 2007/0290409 A1 | 12/2007 | Brice et al. |
| 2008/0006334 A1 | 1/2008 | Davidson et al. |
| 2008/0013299 A1 | 1/2008 | Renn |
| 2008/0014457 A1 | 1/2008 | Gennaro et al. |
| 2008/0060330 A1 | 3/2008 | Davidson et al. |
| 2008/0131540 A1 | 6/2008 | Perret et al. |
| 2008/0138515 A1 | 6/2008 | Williams |
| 2008/0206460 A1 | 8/2008 | Rhoades et al. |
| 2008/0208268 A1 | 8/2008 | Bartic et al. |
| 2009/0004380 A1 | 1/2009 | Hochsmann et al. |
| 2009/0017220 A1 | 1/2009 | Muller et al. |
| 2009/0025638 A1 | 1/2009 | Inoue |
| 2009/0035411 A1 | 2/2009 | Seibert et al. |
| 2009/0039570 A1 | 2/2009 | Clark |
| 2009/0042050 A1 | 2/2009 | Matteazzi et al. |
| 2009/0045553 A1 | 2/2009 | Weidinger et al. |
| 2009/0047165 A1 | 2/2009 | Syvanen et al. |
| 2009/0061077 A1 | 3/2009 | King et al. |
| 2009/0090298 A1 | 4/2009 | King et al. |
| 2009/0114151 A1 | 5/2009 | Renn et al. |
| 2009/0152771 A1 | 6/2009 | Philippi et al. |
| 2009/0206065 A1 | 8/2009 | Kruth et al. |
| 2009/0206522 A1 | 8/2009 | Hein et al. |
| 2009/0314391 A1 | 12/2009 | Crump et al. |
| 2010/0006228 A1 | 1/2010 | Abe et al. |
| 2010/0044547 A1 | 2/2010 | Higashi et al. |
| 2010/0125356 A1 | 5/2010 | Shkolnik et al. |
| 2010/0140550 A1 | 6/2010 | Keller et al. |
| 2010/0163405 A1 | 7/2010 | Ackelid |
| 2010/0173096 A1 | 7/2010 | Kritchman et al. |
| 2010/0233012 A1 | 9/2010 | Higashi et al. |
| 2010/0242843 A1 | 9/2010 | Peretti et al. |
| 2010/0305743 A1 | 12/2010 | Larsson |
| 2011/0029093 A1 | 2/2011 | Bojarski et al. |
| 2011/0042031 A1 | 2/2011 | Furlong et al. |
| 2011/0052927 A1 | 3/2011 | Martinoni et al. |
| 2011/0106290 A1 | 5/2011 | Hoevel et al. |
| 2011/0123383 A1 | 5/2011 | Fuwa et al. |
| 2011/0133367 A1 | 6/2011 | Weidinger et al. |
| 2011/0135840 A1 | 6/2011 | Doye et al. |
| 2011/0165339 A1 | 7/2011 | Skoglund et al. |
| 2011/0165340 A1 | 7/2011 | Baumann |
| 2011/0168091 A1 | 7/2011 | Baumann et al. |
| 2011/0221100 A1 | 9/2011 | Wesselky et al. |
| 2011/0223349 A1 | 9/2011 | Scott |
| 2011/0259862 A1 | 10/2011 | Scott et al. |
| 2011/0278773 A1 | 11/2011 | Bokodi et al. |
| 2011/0293771 A1* | 12/2011 | Oberhofer ............. B22F 3/1055 425/182 |
| 2012/0010741 A1 | 1/2012 | Hull et al. |
| 2012/0090734 A1 | 4/2012 | Heinlein |
| 2012/0100031 A1 | 4/2012 | Ljungblad et al. |
| 2012/0106150 A1 | 5/2012 | Vaes et al. |
| 2012/0107496 A1 | 5/2012 | Thoma |
| 2012/0119399 A1 | 5/2012 | Fruth |
| 2012/0126457 A1 | 5/2012 | Abe et al. |
| 2012/0134386 A1 | 5/2012 | Bender et al. |
| 2012/0139166 A1 | 6/2012 | Abe et al. |
| 2012/0145806 A1 | 6/2012 | Yang |
| 2012/0164322 A1 | 6/2012 | Teulet |
| 2012/0186779 A1 | 7/2012 | Tan et al. |
| 2012/0211926 A1 | 8/2012 | Larsson et al. |
| 2012/0213615 A1 | 8/2012 | Sakaue |
| 2012/0223059 A1 | 9/2012 | Ackelid |
| 2012/0228492 A1 | 9/2012 | Franzen |
| 2012/0228807 A1 | 9/2012 | Teulet |
| 2012/0231175 A1 | 9/2012 | Tan |
| 2012/0231576 A1 | 9/2012 | King et al. |
| 2012/0234671 A1 | 9/2012 | Ackelid |
| 2012/0235548 A1 | 9/2012 | Cordes et al. |
| 2012/0251378 A1 | 10/2012 | Abe et al. |
| 2012/0267347 A1 | 10/2012 | Arjakine et al. |
| 2012/0308781 A1 | 12/2012 | Abe et al. |
| 2012/0318777 A1 | 12/2012 | Kwok et al. |
| 2013/0016400 A1 | 1/2013 | Yamashita |
| 2013/0064706 A1 | 3/2013 | Schwarze et al. |
| 2013/0112672 A1 | 5/2013 | Keremes et al. |
| 2013/0134637 A1 | 5/2013 | Wiesner et al. |
| 2013/0162643 A1 | 6/2013 | Cardle |
| 2013/0168902 A1 | 7/2013 | Herzog et al. |
| 2013/0171019 A1 | 7/2013 | Gessler et al. |
| 2013/0180959 A1 | 7/2013 | Weston et al. |
| 2013/0228302 A1 | 9/2013 | Rickenbacher et al. |
| 2013/0256953 A1 | 10/2013 | Teulet |
| 2013/0270750 A1 | 10/2013 | Green |
| 2013/0272746 A1 | 10/2013 | Hanson et al. |
| 2013/0277891 A1 | 10/2013 | Teulet |
| 2013/0280547 A1 | 10/2013 | Brandl et al. |
| 2013/0300035 A1 | 11/2013 | Snis |
| 2013/0300286 A1 | 11/2013 | Ljungblad et al. |
| 2013/0312928 A1 | 11/2013 | Mercelis et al. |
| 2013/0330470 A1 | 12/2013 | Gersch et al. |
| 2014/0034626 A1 | 2/2014 | Illston |
| 2014/0049964 A1 | 2/2014 | McClure et al. |
| 2014/0065194 A1 | 3/2014 | Yoo et al. |
| 2014/0086654 A1 | 3/2014 | Kojima |
| 2014/0086780 A1 | 3/2014 | Miller et al. |
| 2014/0123458 A1 | 5/2014 | Fearon et al. |
| 2014/0150992 A1 | 6/2014 | Koontz et al. |
| 2014/0154088 A1 | 6/2014 | Etter et al. |
| 2014/0157579 A1 | 6/2014 | Chhabra et al. |
| 2014/0163717 A1* | 6/2014 | Das .................. B22F 3/1055 700/119 |
| 2014/0176127 A1 | 6/2014 | Kogej et al. |
| 2014/0251481 A1 | 9/2014 | Kroll et al. |
| 2014/0252687 A1 | 9/2014 | El-Dasher et al. |
| 2014/0265045 A1 | 9/2014 | Cullen et al. |
| 2014/0271221 A1 | 9/2014 | Soucy et al. |
| 2014/0271328 A1 | 9/2014 | Burris et al. |
| 2014/0287080 A1 | 9/2014 | Scott et al. |
| 2014/0288890 A1* | 9/2014 | Khainson ............ G06F 17/5004 703/1 |
| 2014/0301883 A1 | 10/2014 | Wiesner et al. |
| 2014/0314609 A1 | 10/2014 | Ljungblad et al. |
| 2014/0314964 A1 | 10/2014 | Ackelid |
| 2014/0329953 A1 | 11/2014 | Paternoster |
| 2014/0332507 A1 | 11/2014 | Fockele et al. |
| 2014/0335313 A1 | 11/2014 | Chou et al. |
| 2014/0348691 A1 | 11/2014 | Ljungblad et al. |
| 2014/0348692 A1 | 11/2014 | Bessac et al. |
| 2014/0348969 A1 | 11/2014 | Scott |
| 2014/0361464 A1 | 12/2014 | Holcomb |
| 2014/0363585 A1 | 12/2014 | Pialot et al. |
| 2014/0370323 A1 | 12/2014 | Ackelid |
| 2014/0377117 A1 | 12/2014 | Herrmann et al. |
| 2015/0004046 A1* | 1/2015 | Graham .................. G06T 19/00 419/53 |
| 2015/0014281 A1 | 1/2015 | Trimmer et al. |
| 2015/0017013 A1 | 1/2015 | Tozzi et al. |
| 2015/0021815 A1 | 1/2015 | Albrecht et al. |
| 2015/0021832 A1 | 1/2015 | Yerazunis et al. |
| 2015/0034606 A1 | 2/2015 | Blackmore |
| 2015/0037599 A1 | 2/2015 | Blackmore |
| 2015/0048528 A1 | 2/2015 | Barton |
| 2015/0049082 A1 | 2/2015 | Coffey et al. |
| 2015/0050463 A1 | 2/2015 | Nakano et al. |
| 2015/0054191 A1 | 2/2015 | Ljungblad |

(56) References Cited

U.S. PATENT DOCUMENTS

| | | |
|---|---|---|
| 2015/0060042 A1 | 3/2015 | Shilpiekandula et al. |
| 2015/0061170 A1 | 3/2015 | Engel et al. |
| 2015/0061195 A1 | 3/2015 | Defelice et al. |
| 2015/0064047 A1 | 3/2015 | Hyde et al. |
| 2015/0071809 A1 | 3/2015 | Nordkvist et al. |
| 2015/0076739 A1 | 3/2015 | Batchelder |
| 2015/0088295 A1 | 3/2015 | Hellestam |
| 2015/0093720 A1 | 4/2015 | Beeby et al. |
| 2015/0097307 A1 | 4/2015 | Batchelder et al. |
| 2015/0097308 A1 | 4/2015 | Batchelder et al. |
| 2015/0110910 A1 | 4/2015 | Hartmann et al. |
| 2015/0115490 A1 | 4/2015 | Reinarz |
| 2015/0139849 A1 | 5/2015 | Pialot, Jr. et al. |
| 2015/0142153 A1 | 5/2015 | Chun et al. |
| 2015/0158249 A1 | 6/2015 | Goto |
| 2015/0165525 A1 | 6/2015 | Jonasson |
| 2015/0165545 A1 | 6/2015 | Goehler et al. |
| 2015/0165681 A1 | 6/2015 | Fish et al. |
| 2015/0165684 A1 | 6/2015 | Deane et al. |
| 2015/0174658 A1 | 6/2015 | Ljungblad |
| 2015/0174822 A1 | 6/2015 | Huang et al. |
| 2015/0198052 A1 | 7/2015 | Pavlov et al. |
| 2015/0210013 A1 | 7/2015 | Teulet |
| 2015/0246485 A1 | 9/2015 | Guenster et al. |
| 2015/0251355 A1 | 9/2015 | Rehme |
| 2015/0268099 A1 | 9/2015 | Craig et al. |
| 2015/0283610 A1 | 10/2015 | Ljungblad et al. |
| 2015/0283611 A1 | 10/2015 | Takezawa et al. |
| 2015/0283613 A1 | 10/2015 | Backlund et al. |
| 2015/0298211 A1 | 10/2015 | Abe et al. |
| 2015/0306667 A1 | 10/2015 | Yao |
| 2015/0306820 A1 | 10/2015 | Colin et al. |
| 2015/0321422 A1 | 11/2015 | Boyer |
| 2015/0328839 A1* | 11/2015 | Willis ................. B29C 67/0088 700/98 |
| 2015/0331402 A1* | 11/2015 | Lin ........................ G05B 15/02 700/119 |
| 2015/0336330 A1 | 11/2015 | Herzog |
| 2015/0367415 A1 | 12/2015 | Buller et al. |
| 2015/0367416 A1 | 12/2015 | Buller et al. |
| 2015/0367417 A1 | 12/2015 | Buller et al. |
| 2015/0367418 A1 | 12/2015 | Buller et al. |
| 2015/0367419 A1 | 12/2015 | Buller et al. |
| 2015/0367446 A1 | 12/2015 | Buller et al. |
| 2015/0367447 A1 | 12/2015 | Buller et al. |
| 2015/0367448 A1 | 12/2015 | Buller et al. |
| 2015/0367453 A1 | 12/2015 | Herzog |
| 2015/0367574 A1 | 12/2015 | Araie et al. |
| 2015/0375456 A1 | 12/2015 | Cheverton et al. |
| 2016/0001401 A1 | 1/2016 | Dimter et al. |
| 2016/0022336 A1 | 1/2016 | Bateman |
| 2016/0059352 A1 | 3/2016 | Sparks et al. |
| 2016/0067779 A1 | 3/2016 | Dautova et al. |
| 2016/0082668 A1 | 3/2016 | Perret et al. |
| 2016/0107263 A1 | 4/2016 | Koerber |
| 2016/0114431 A1* | 4/2016 | Cheverton ........... B23K 26/342 219/76.1 |
| 2016/0114432 A1 | 4/2016 | Ferrar et al. |
| 2016/0114531 A1 | 4/2016 | Chuang et al. |
| 2016/0121399 A1 | 5/2016 | Buller et al. |
| 2016/0129502 A1 | 5/2016 | Varetti |
| 2016/0136896 A1 | 5/2016 | Wighton |
| 2016/0154906 A1 | 6/2016 | Schmidt et al. |
| 2016/0179064 A1* | 6/2016 | Arthur ................ B29C 67/0088 700/98 |
| 2016/0185048 A1* | 6/2016 | Dave .................. B29C 67/0077 700/119 |
| 2016/0193696 A1 | 7/2016 | McFarland et al. |
| 2016/0193790 A1 | 7/2016 | Shuck et al. |
| 2016/0207109 A1 | 7/2016 | Buller et al. |
| 2016/0214175 A1 | 7/2016 | Nordstrom |
| 2016/0236279 A1 | 8/2016 | Ashton et al. |
| 2016/0236419 A1* | 8/2016 | Griffin .................... B32B 41/00 |
| 2016/0246908 A1* | 8/2016 | Komzsik ................ G06T 17/20 |
| 2016/0250717 A1 | 9/2016 | Kruger et al. |
| 2016/0258045 A1 | 9/2016 | Carter, Jr. et al. |
| 2016/0271698 A1 | 9/2016 | Schmidt |
| 2016/0271884 A1 | 9/2016 | Herzog |
| 2016/0279706 A1 | 9/2016 | Domrose et al. |
| 2016/0297006 A1 | 10/2016 | Buller et al. |
| 2016/0297007 A1 | 10/2016 | Buller et al. |
| 2016/0299996 A1 | 10/2016 | Huang |
| 2016/0303687 A1 | 10/2016 | Ljungblad |
| 2016/0311025 A1 | 10/2016 | Kaneko |
| 2016/0320771 A1 | 11/2016 | Huang |
| 2016/0332384 A1* | 11/2016 | De Pena ................ B33Y 30/00 |
| 2016/0339639 A1 | 11/2016 | Chivel |
| 2017/0001379 A1 | 1/2017 | Long |
| 2017/0014902 A1 | 1/2017 | Tanaka et al. |
| 2017/0021420 A1 | 1/2017 | Buller et al. |
| 2017/0021455 A1 | 1/2017 | Dallarosa et al. |
| 2017/0036404 A1 | 2/2017 | Rengers et al. |
| 2017/0066052 A1 | 3/2017 | Abe et al. |
| 2017/0066084 A1 | 3/2017 | Ladewig et al. |
| 2017/0090461 A1 | 3/2017 | Chong et al. |
| 2017/0102689 A1 | 4/2017 | Khajepour et al. |
| 2017/0123222 A1 | 5/2017 | Demuth et al. |
| 2017/0136574 A1 | 5/2017 | Zenzinger et al. |
| 2017/0136703 A1 | 5/2017 | Hayes et al. |
| 2017/0144874 A1 | 5/2017 | Huebinger et al. |
| 2017/0145586 A1 | 5/2017 | Xiao |
| 2017/0157845 A1 | 6/2017 | Bihari et al. |
| 2017/0165792 A1 | 6/2017 | Buller et al. |
| 2017/0216917 A1 | 8/2017 | Zhang et al. |
| 2017/0246810 A1* | 8/2017 | Gold ....................... B33Y 50/02 |
| 2017/0259337 A1 | 9/2017 | Furukawa |
| 2017/0266878 A1 | 9/2017 | Furukawa |
| 2017/0266887 A1 | 9/2017 | Roviaro et al. |
| 2017/0282245 A1 | 10/2017 | Yasuda et al. |
| 2017/0297110 A1 | 10/2017 | Echigo et al. |
| 2017/0320265 A1 | 11/2017 | Baumann et al. |
| 2017/0333994 A1 | 11/2017 | Schmitt et al. |
| 2017/0341143 A1 | 11/2017 | Abe et al. |
| 2018/0015670 A1 | 1/2018 | Gu et al. |
| 2018/0071986 A1 | 3/2018 | Buller et al. |
| 2018/0099454 A1 | 4/2018 | Hümmeler et al. |
| 2018/0117845 A1 | 5/2018 | Buller et al. |

FOREIGN PATENT DOCUMENTS

| | | |
|---|---|---|
| CN | 103392153 A | 11/2013 |
| CN | 103561891 A | 2/2014 |
| CN | 103611934 A | 3/2014 |
| CN | 103612393 A | 3/2014 |
| CN | 103629198 A | 3/2014 |
| CN | 103676588 A | 3/2014 |
| DE | 19939616 A1 | 3/2001 |
| DE | 102004061836 A1 | 7/2006 |
| DE | 102007029142 A1 | 1/2009 |
| DE | 102009036153 A1 | 2/2011 |
| DE | 102010048335 A1 | 4/2012 |
| DE | 202013009787 U1 | 12/2013 |
| DE | 102013208651 A1 | 11/2014 |
| DE | 102014204528 A1 | 9/2015 |
| EP | 0296818 B1 | 4/1993 |
| EP | 1466718 A2 | 10/2004 |
| EP | 1622086 B1 | 9/2008 |
| EP | 1992709 A1 | 11/2008 |
| EP | 2277687 A1 | 1/2011 |
| EP | 2361704 A1 | 8/2011 |
| EP | 2522446 A1 | 11/2012 |
| EP | 2620241 A1 | 7/2013 |
| EP | 2789413 A1 | 10/2014 |
| EP | 2832473 A1 | 2/2015 |
| EP | 3208077 A1 | 8/2017 |
| EP | 3263316 A1 | 1/2018 |
| JP | 2003502184 A | 1/2003 |
| JP | 2006150977 A | 6/2006 |
| JP | 2008291318 A | 12/2008 |
| JP | 2009001900 A | 1/2009 |
| JP | 2009512579 A | 3/2009 |
| JP | 2012502178 A | 1/2012 |
| JP | 2012213971 A | 11/2012 |

(56) References Cited

FOREIGN PATENT DOCUMENTS

| | | |
|---|---|---|
| KR | 20160059726 A | 5/2016 |
| KR | 20160076708 A | 7/2016 |
| NO | 317085 B1 | 8/2004 |
| SE | 524467 C2 | 8/2004 |
| WO | WO-9208592 A1 | 5/1992 |
| WO | WO-9511100 A1 | 4/1995 |
| WO | WO-9711837 A1 | 4/1997 |
| WO | WO-9828124 A2 | 7/1998 |
| WO | WO-9933641 A1 | 7/1999 |
| WO | WO-0177988 A2 | 10/2001 |
| WO | WO-2004037469 A1 | 5/2004 |
| WO | WO-2006066939 A1 | 6/2006 |
| WO | WO-2008028443 A2 | 3/2008 |
| WO | WO-2008049384 A1 | 5/2008 |
| WO | WO-2008064620 A1 | 6/2008 |
| WO | WO-2008067496 A2 | 6/2008 |
| WO | WO-2008074287 A1 | 6/2008 |
| WO | WO-2008096105 A1 | 8/2008 |
| WO | WO-2008128502 A2 | 10/2008 |
| WO | WO-2009015619 A2 | 2/2009 |
| WO | WO-2009096750 A2 | 8/2009 |
| WO | WO-2013092997 A1 | 6/2013 |
| WO | WO-2013160188 A1 | 10/2013 |
| WO | WO-2013167903 A1 | 11/2013 |
| WO | WO-2013178825 A2 | 12/2013 |
| WO | WO-2013179017 A1 | 12/2013 |
| WO | WO-2013189473 A1 | 12/2013 |
| WO | WO-2014023657 A1 | 2/2014 |
| WO | WO-2014042970 A1 | 3/2014 |
| WO | WO-2014044589 A1 | 3/2014 |
| WO | WO-2014049159 A1 | 4/2014 |
| WO | WO-2014083292 A1 | 6/2014 |
| WO | WO-2014118783 A1 | 8/2014 |
| WO | WO-2014120991 A1 | 8/2014 |
| WO | WO-2014135136 A1 | 9/2014 |
| WO | WO-2014144255 A2 | 9/2014 |
| WO | WO-2014144482 A1 | 9/2014 |
| WO | WO-2014144630 A1 | 9/2014 |
| WO | WO-2014193406 A1 | 12/2014 |
| WO | WO-2015023612 A2 | 2/2015 |
| WO | WO-2015025171 A2 | 2/2015 |
| WO | WO-2015040433 A2 | 3/2015 |
| WO | WO-2015053946 A1 | 4/2015 |
| WO | WO-2015082677 A1 | 6/2015 |
| WO | WO-2015176709 A1 | 11/2015 |
| WO | WO-2015196149 A1 | 12/2015 |
| WO | WO-2016026852 A1 | 2/2016 |
| WO | WO-2016026853 A1 | 2/2016 |
| WO | WO-2016055523 A1 | 4/2016 |
| WO | WO-2016075025 A1 | 5/2016 |
| WO | WO-2016075026 A1 | 5/2016 |
| WO | WO-2016077250 A1 | 5/2016 |
| WO | WO-2016094827 A1 | 6/2016 |
| WO | WO-2016113253 A1 | 7/2016 |
| WO | WO-2016169768 A1 | 10/2016 |
| WO | WO-2016196223 A1 | 12/2016 |
| WO | WO-2016196382 A1 | 12/2016 |
| WO | WO-2017011456 A1 | 1/2017 |
| WO | WO-2017015217 A2 | 1/2017 |
| WO | WO-2017079091 A1 | 5/2017 |
| WO | WO-2017100695 A1 | 6/2017 |
| WO | WO-2017179001 A1 | 10/2017 |

OTHER PUBLICATIONS

Manzhirov et al.,"Mathematical Modeling of Additive Manufacturing Technologies", Jul. 2014, Proceedings of the World Congress on Engineering, ISBN 978-988-19253-5-0.*
Adam, et al. Design for additive manufacturing—element transitions and aggregated structures. CIRP Journal of Manufacturing Science and Technology. Nov. 2014; 7:20-28.
Additive Manufacturing Research Group. Loughborough University. Accessed Jul. 29, 2015. 7 pages. http://www.lboro.ac.uk/research/amrg/about/the7categoriesofadditivemanufacturing/powderbedfusion/.
Arcam AB (ARCM.ST) (AMAVF). Powder Removal from 3D Structures. Posted Thursday, Apr. 23, 2015 11:23:59 AM. 4 pages. http://investorshub.advfn.com/boards/read_msg.aspx?message_id=113029094.
Arcam EBM at Sirris Belgium. Uploaded Jun. 17, 2010. 2 pages. https://www.youtube.com/watch?v=nR7EtduqVYw &list=PLD7ckJoR_kR6ua0GOMlyJ1mpCKh342iLI.
Cheng, et al. Thermal Stresses Associated with Part Overhang Geometry in Electron Beam Additive Manufacturing: Process Parameter Effects. 25th Annual International Solid Freeform Fabrication Symposium—An Additive Manufacturing Conference, Austin, TX, USA. Aug. 4-6, 2014. 1076-1087.
Childs, et al. Raster scan of selective laser melting of the surface layer of a tool steel powder bed. Proc. IMechE. Jan. 26, 2005; vol. 219, Part B, pp. 379-384.
Childs, et al. Selective laser sintering (melting) of stainless and tool steel powders: experimental modelling. Proc. IMechE. 2005, Published Oct. 18, 2004; vol. 219 Part B, J. Engineering Manufacture, pp. 338-357.
Chivel, et al. On-line temperature monitoring in selective laser sintering/melting. Physics Procedia. Dec. 31, 2010; (5):515-521.
Cloots, et al. Assessing new support minimizing strategies for the additive manufacturing technology SLM. Aug. 16, 2013. sffsymposium.engr.utexas.edu/Manuscripts/2013/2013-50-Cloots.pdf. 13 pages.
Co-pending U.S. Appl. No. 15/339,759, filed Oct. 31, 2016.
Co-pending U.S. Appl. No. 15/339,775, filed Oct. 31, 2016.
Craeghs, et al. Feedback control of layerwise laser melting using optical sensors. Physics Procedia. Dec. 2010; 5:505-514.
Criales, et al. Laser material processing methods: micromachining, laser exfoliation and selective laser melting: prediction modeling of temperature field and melt pool size using finite element modeling of selective laser melting for inconel 625. Atilim University. Metal Forming Center of Excellence, Ankara, Turkey. Nov. 14, 2014. 77 pages.
Direct Manufacturing: ARCAM. Uploaded on Jun. 6, 2011. 2 pages. https://www.youtube.com/watch?v=M_qSnjKN7f8.
EOS. Direct Metal Laser Sintering Published Aug. 22, 2012. https://www.youtube.com/watch?v=cRE-Pzl6uZA.
Ghosh, et al. Selective Laser Sintering: A Case Study of Tungsten Carbide and Cobalt Powder Sintering by Pulsed Nd:YAG Laser. Lasers Based Manufacturing, Dec. 2014, pp. 441-458.
Gibson, et al. Additive Manufacturing Technologies, Springer 2010, Chapter 5, pp. 103-142. ISBN978-1-4419-1119-3 (Print978-1-4419-1120-9 (Online). Published: Dec. 14, 2009.
Gibson, et al. Additive Manufacturing Technologies, Springer 2015. Chapter 5, pp. 107-145. ISBN 978-1-4939-2113-3 (978-1-4939-2112-6; 978-1-4939-2113-3); DOI 10.1007/978-1-4939-2113-3. Published: Nov. 27, 2014.
Hauser, et al. Further Developments in Process Mapping and modelling in direct metal selective laser melting. Aug. 2004, 15th solid Free Form Fabrication Proceedings. Austin, Texas, pp. 448-459.
Hussein. The development of Lightweight Cellular Structures for Metal Additive Manufacturing. Nov. 2013, thesis of University of Exeter, pp. 1-228.
International search report and written opinion dated Feb. 19, 2016 for PCT/US2015/059790.
International search report and written opinion dated Apr. 11, 2016 for PCT/US2015/065297.
International search report and written opinion dated Sep. 20, 2016 for PCT/US2016/034454.
International search report and written opinion dated Oct. 30, 2015 for PCT Application No. US2015/036802.
International search report and written opinion dated Sep. 13, 2016 for PCT Application No. US-2016034857.
Kannatey-Asibu Jr, Elijah. Principles of laser materials processing. John Wiley & Sons, 2009, Chapter 10, pp. 231-405. Published: Apr. 20, 2009.

(56) References Cited

OTHER PUBLICATIONS

Kannatey-Asibu Jr, Elijah. Principles of laser materials processing. John Wiley & Sons, 2009, Chapter 16, pp. 502-668. Published: Apr. 20, 2009.

Kruth, et al. Feedback control of selective laser melting. Proceedings of the 3rd International Conference on Advanced Research in Virtual and Rapid Prototyping, Leiria, Portugal, Sep. 2007. 521-527.

Kruth, et al. Selective laser melting of iron-based power. Journal of Materials Processing Technology. Nov. 2004; 149:616-622.

Kumar. Development of an electrophotographic-based layered manufacturing test bed. Project proposal. Department of Mechanical Engineering, University of Florida. 2009. http://www.cis.rit.edu/microgrants/2008/Esterman_proposal.pdf (accessed on Jun. 29, 2015).

Kumar, et al. Designing and slicing heterogenous components for rapid prototyping. Department of Mechanical Engineering, University of Florida. Aug. 2000; 428-436.

Kumar, et al. Electrophotographic Layered Manufacturing. J. Manuf. Sci. Eng 126(3), 571-576 (Sep. 7, 2004) (6 pages) doi:10.1115/1.1765146.

Kumar, et al. Electrophotographic powder deposition for freeform fabrication. Department of Mechanical Engineering, University of Florida. Aug. 1999; 647-654.

Kumar, et al. Electrophotographic printing of part and binder powders. Rapid Prototyping Journal. Jul. 2004; 10(1):7-13.

Kumar, et al. Layered Manufacturing by Electrophotographic Printing. ASME 2003 International Design Engineering Technical Conferences and Computers and Information in Engineering Conference. vol. 2: 29th Design Automation Conference, Parts A and B. Chicago, Illinois, USA, Sep. 2-6, 2003. Paper No. DETC2003/DAC-48724, pp. 205-211; 7 pages.

Kumar, et al. Solid freeform fabrication by electrophotographic printing. Department of Mechanical and Aerospace Engineering, University of Florida. Aug. 2003; 39-49.

Kumar. Powder deposition and sintering for a two-powder approach to solid freeform fabrication. Department of Mechanical Engineering, University of Florida. Aug. 1998; 169-173.

Laser Engineered Net Shaping (LENS) 850-R system overview. System features and example application video clips. Published Jun. 3, 2012. https://www.youtube.com/watch?v=mkUVURLIkxS4.

Leirvag. Additive Manufacturing for Large Products. Feb. 2013, thesis. Norwegian University of Science and Technology.

Lyckfeldt. Powder rheology of steel powders for additive manufacturing. Swerea IVF. Oct. 24, 2013.

Manfredi, et al. From Powders to Dense Metal Parts: Characterization of a Commercial AlSiMg Alloy Processed through Direct Metal Laser Sinterin Mar. 2013, Materials, vol. 6, pp. 856-869.

Mertens, et al. Optimization fo scan strategies in selective laser melting of aluminum parts with downfacing areas. Journal of Manufacturing Science and Technology. Dec. 2014; 136:061012-1-7.

Moridi, et al. Cold spray coating: review of material systems and future perspectives. Surface engineering. Jun. 2014; 36(6):36*-395.

Mumtaz, et al. A method to eliminate anchors/supports from directly laser melted metal powder bed processes. Additive Manufacturing Research Group, Wolfson School of Mechanical Engineering, Loughborough University. Reviewed Aug. 17, 2011. 10 pages.

Papadakis, et al. Numerical computation of component shape distortion manufactured by selective laser melting. Procedia CIRP. Aug. 2014; 18:90-95.

Proto Labs. Direct Metal Laser Sintering (DMLS). Published Sep. 10, 2014. https://www.protolabs.com/additive-manufacturing/direct-metal-laser-sintering 2 pages.

Riecker, et al. 3D multi-material metal printing of delicate structures. EuroPM 2014—AM Technologies, http://www.ifam.fraunhofer.de/content/dam/ifam/de/documents/dd/Publikationen/2014/Euro_PM_2014_Riecker_3D%20Multi-Material_Metal_Printing_of Delicate_Structures_EPMA.pdf (accessed on Jun. 29, 2015).

Selective Laser Sintering (SLS) Process at Loughborough University. Published May 4, 2015. 2 pages. https://www.youtube.com/watch?v=oO77VKDB891.

Spears, et al. In-process sensing in selective laser melting (SLM) additive manufacturing. Integrating Materials and Manufacturing Innovation. Feb. 11, 2016; 5:2. DOI: 10.1186/s40192-016-0045-4.

Strano, et al. A new approach to the design and optimisation of support structures in additive manufacturing. Int J Adv Manuf Technol (2013) 66:1247-1254 DOI 10.1007/s00170-012-4403-x. Published online: Aug. 2, 2012.

Stratasys. Direct Manufacturing. Direct Metal Laser Sintering (DMLS). Published Oct. 11, 2013. https://www.stratasysdirect.com/resources/direct-metal-laser-sintering-dmls/ 7 pages.

Van Der Eijk, et al. Metal printing process: development of a new rapid manufacturing process for metal parts. Proceedings of the World PM 2004 conference held in Vienna. Oct. 17-21, 2004. 5 pages.

Wang, et al. Research on the fabricating quality optimization of the overhanging surface in SLM process. Int J Adv Manuf Technol (2013) 65:1471-1484 DOI 10.1007/s00170-012-4271-4. Published online: Jun. 16, 2012.

Wilkes, et al. Emerald Article: Additive manufacturing of ZrO2—Al2O3 ceramic components by selective laser melting. Rapid Prototyping Journal, vol. 19, Issue 1, Aug. 7, 2012.

Wright, Roger. Wire Technology, Process Engineering and Metallurgry, Ch. 19, Elsevier, 2011, pp. 279-283. Published: Nov. 17, 2010.

Yin. Accurately quantifying process-relevant powder properties for AMPM applications. Freeman Technology. May 2014. 39 pages.

Notice of allowance dated Mar. 1, 2016 for U.S. Appl. No. 14/745,108.

Notice of allowance dated May 11, 2016 for U.S. Appl. No. 14/744,955.

Notice of allowance dated May 25, 2016 for U.S. Appl. No. 14/744,675.

Notice of allowance dated Jun. 20, 2016 for U.S. Appl. No. 14/744,675.

Notice of allowance dated Aug. 10, 2016 for U.S. Appl. No. 14/967,118.

Notice of allowance dated Sep. 6, 2016 for U.S. Appl. No. 14/745,032.

Notice of allowance dated Sep. 17, 2015 for U.S. Appl. No. 14/745,081.

Notice of allowance dated Sep. 28, 2015 for U.S. Appl. No. 14/745,081.

Notice of allowance dated Nov. 30, 2015 for U.S. Appl. No. 14/745,081.

Notice of allowance dated Dec. 14, 2015 for U.S. Appl. No. 14/745,081.

Notice of allowance dated Dec. 15, 2015 for U.S. Appl. No. 14/745,081.

Office action dated Jan. 7, 2016 for U.S. Appl. No. 14/744,859.
Office action dated Jan. 11, 2016 for U.S. Appl. No. 14/745,032.
Office action dated Feb. 10, 2016 for U.S. Appl. No. 14/744,910.
Office action dated Feb. 16, 2016 for U.S. Appl. No. 14/744,955.
Office action dated Mar. 4, 2016 for U.S. Appl. No. 14/744,988.
Office action dated Mar. 10, 2016 for U.S. Appl. No. 14/744,675.
Office action dated Jun. 29, 2016 for U.S. Appl. No. 14/744,859.
Office action dated Jul. 1, 2016 for U.S. Appl. No. 14/745,032.
Office action dated Jul. 19, 2016 for U.S. Appl. No. 15/085,884.
Office action dated Jul. 21, 2016 for U.S. Appl. No. 14/744,910.
Office action dated Aug. 25, 2016 for U.S. Appl. No. 14/744,988.
Office action dated Sep. 10, 2015 for U.S. Appl. No. 14/744,675.
Office action dated Sep. 13, 2016 for U.S. Appl. No. 15/188,939.
Office action dated Oct. 2, 2015 for U.S. Appl. No. 14/744,955.
Office action dated Nov. 1, 2016 for U.S. Appl. No. 15/085,884.
Office action dated Nov. 12, 2015 for U.S. Appl. No. 14/745,108.
Office action dated Nov. 18, 2016 for U.S. Appl. No. 15/188,939.
NETFABB-Professional 5.2, User Manual, Netfabb GmbH 2014, Version: Jul. 29, 2014, Chapter 6: sections 6.1, 6.3; Chapter 7: section 7.7; Chapter 9: section 9.6.

International Search Report and Written Opinion dated Apr. 5, 2017 for International PCT Patent Application No. PCT/US2016/066000.

(56) References Cited

OTHER PUBLICATIONS

International Search Report and Written Opinion dated May 18, 2017 for International PCT Patent Application No. PCT/US2017/018191.
Morgan, et al. Experimental investigation of nanosecond pulsed Nd:YAG laser re-melted pre-placed powder beds. Rapid Prototyping Journal, Aug. 1, 2001, vol. 7 Issue: 3, pp. 159- 172, doi: 10.1108/13552540110395565.
Office Action dated Jun. 15, 2017 for U.S. Appl. No. 15/288,251.
Office Action dated Jun. 29, 2017 for U.S. Appl. No. 15/435,128.
Co-pending U.S. Appl. No. 15/374,318, filed Dec. 9, 2016.
Co-pending U.S. Appl. No. 15/374,442, filed Dec. 9, 2016.
Co-pending U.S. Appl. No. 15/374,535, filed Dec. 9, 2016.
Co-pending U.S. Appl. No. 15/374,616, filed Dec. 9, 2016.
Co-pending U.S. Appl. No. 15/435,065, filed Feb. 16, 2017.
Co-pending U.S. Appl. No. 15/435,078, filed Feb. 16, 2017.
Co-pending U.S. Appl. No. 15/435,090, filed Feb. 16, 2017.
Co-pending U.S. Appl. No. 15/435,110, filed Feb. 16, 2017.
Co-pending U.S. Appl. No. 15/435,120, filed Feb. 16, 2017.
Co-pending U.S. Appl. No. 15/435,128, filed Feb. 16, 2017.
Co-pending U.S. Appl. No. 15/436,558, filed Feb. 17, 2017.
Co-pending U.S. Appl. No. 15/490,219, filed Apr. 18, 2017.
Ex Parte Quayle Action dated Apr. 19, 2017 for U.S. Appl. No. 15/374,821.
Morgan, et al. Experimental investigation of nanosecond pulsed Nd:YAG laser re-melted pre-placed powder beds. Rapid Prototyping Journal, 2001, vol. 7 Issue: 3, pp. 159-172, doi: 10.1108/13552540110395565.
Notice of allowance dated Jan. 5, 2017 for U.S. Appl. No. 15/085,884.
Notice of Allowance dated Mar. 16, 2017 for U.S. Appl. No. 15/339,775.
Notice of Allowance dated Mar. 20, 2017 for U.S. Appl. No. 15/339,759.
Notice of Allowance (second) dated Apr. 6, 2017 for U.S. Appl. No. 15/339,759.
Office Action dated Feb. 7, 2017 for U.S. Appl. No. 14/744,988.
Office Action dated Feb. 8, 2017 for U.S. Appl. No. 14/744,859.
Office Action dated Mar. 6, 2017 for U.S. Appl. No. 14/744,910.
Office Action dated Mar. 23, 2017 for U.S. Appl. No. 15/399,186.
Office Action dated Apr. 28, 2017 for U.S. Appl. No. 15/374,616.
Co-pending U.S. Appl. No. 15/668,662, filed Aug. 3, 2017.
Co-pending U.S. Appl. No. 15/719,084, filed Sep. 28, 2017.
Co-pending U.S. Appl. No. 15/719,133, filed Sep. 28, 2017.
Co-pending U.S. Appl. No. 15/719,229, filed Sep. 28, 2017.
Co-pending U.S. Appl. No. 15/788,364, filed Oct. 19, 2017.
Co-pending U.S. Appl. No. 15/788,418, filed Oct. 19, 2017.
Co-pending U.S. Appl. No. 15/788,463, filed Oct. 19, 2017.
Co-pending U.S. Appl. No. 15/788,495, filed Oct. 19, 2017.
Co-pending U.S. Appl. No. 15/788,532, filed Oct. 19, 2017.
Co-pending U.S. Appl. No. 15/788,568, filed Oct. 19, 2017.
Co-pending U.S. Appl. No. 15/788,662, filed Oct. 19, 2017.
Extended European Search Report dated Jul. 7, 2017 for European Patent Application No. EP17156707.6.
International Search Report and Written Opinion dated Aug. 30, 2017 for International PCT Patent Application No. PCT/US2017/039422.
Notice of Allowability dated Oct. 17, 2017 for U.S. Appl. No. 14/744,910.
Notice of Allowance dated Aug. 7, 2017 for U.S. Appl. No. 14/744,910.
Office Action dated Jul. 3, 2017 for U.S. Appl. No. 15/435,120.
Office Action dated Jul. 28, 2017 for U.S. Appl. No. 14/744,988.
Office Action dated Aug. 2, 2017 for U.S. Appl. No. 15/435,090.
Office Action dated Aug. 18, 2017 for U.S. Appl. No. 15/374,318.
Office Action dated Sep. 11, 2017 for U.S. Appl. No. 15/374,821.
Office Action dated Sep. 15, 2017 for U.S. Appl. No. 15/374,616.
Office Action dated Oct. 19, 2017 for U.S. Appl. No. 15/399,186.
Co-pending International PCT Patent Application No. PCT/US17/39422, filed Jun. 27, 2017.

Rhinehart, R.R. §2.13 Control Theory: Mode-Based Control, in Bela G. Liptak, Instrument Engineers' Handbook, vol. 2: Process Control and Optimization, 209-213 (4th ed., CRC Press (part of Taylor & Francis Group), 2006), ISBN-13: 978-0849310812.
Anusci, Victor. Aerosint Is Developing the First Commercial Multi-powder SLS 3D Printer. 3D Printing Media Network. Web. Published Jan. 28, 2018. 4 pages. URL:< https://www.3dprintingmedia.network/aerosint-multi-powder-sls-3d-printer/>.
Saunders, Marc. Real-time AM monitoring opens up new process control opportunities. Web: LinkedIn. Published on Jan. 3, 2018. 12 pages. URL:<https://www.linkedin.com/pulse/real-time-am-monitoring-opens-new-process-control-marc-saunders/>.
Co-pending U.S. Appl. No. 15/803,675, filed Nov. 3, 2017.
Co-pending U.S. Appl. No. 15/803,683, filed Nov. 3, 2017.
Co-pending U.S. Appl. No. 15/803,686, filed Nov. 3, 2017.
Co-pending U.S. Appl. No. 15/803,688, filed Nov. 3, 2017.
Co-pending U.S. Appl. No. 15/803,692, filed Nov. 3, 2017.
Co-pending U.S. Appl. No. 15/830,421, filed Dec. 4, 2017.
Co-pending U.S. Appl. No. 15/830,470, filed Dec. 4, 2017.
Co-pending U.S. Appl. No. 15/853,700, filed Dec. 22, 2017.
Co-pending U.S. Appl. No. 15/861,544, filed Jan. 3, 2018.
Co-pending U.S. Appl. No. 15/861,548, filed Jan. 3, 2018.
Co-pending U.S. Appl. No. 15/861,553, filed Jan. 3, 2018.
Co-pending U.S. Appl. No. 15/861,561, filed Jan. 3, 2018.
Dahotre et al. Laser Fabrication and Machining of Materials. Springer. 2008. 561 pages. DOI: 10.1007/978-0-387-72344-0.
European Search Report and Search Opinion dated Nov. 30, 2017 for European Patent Application No. EP17178143.8.
International Search Report and Written Opinion dated Jan. 9, 2018 for International PCT Patent Application No. PCT/2017/054043.
Merriam-Webster. Definition of "reservoir". Retrieved Dec. 21, 2017. 13 pages. URL:<https://merriam-webster.com/dictionary/reservoir>.
Notice of Allowance dated Jan. 12, 2018 for U.S. Appl. No. 15/435,128.
Notice of Allowance dated Dec. 8, 2017 for U.S. Appl. No. 15/435,128.
Notice of Allowance dated Dec. 11, 2017 for U.S. Appl. No. 15/435,120.
Office Action dated Jan. 2, 2018 for U.S. Appl. No. 15/288,251.
Office Action dated Nov. 16, 2017 for U.S. Appl. No. 15/634,267.
Office Action dated Nov. 27, 2017 for U.S. Appl. No. 15/374,318.
Office Action dated Dec. 8, 2017 for U.S. Appl. No. 15/435,090.
Office Action dated Dec. 15, 2017 for U.S. Appl. No. 15/435,110.
Scime et al. Anomaly detection and classification in a laser powder bed additive manufacturing process using a trained computer vision algorithm. Additive Manufacturing. vol. 19, Jan. 2018, pp. 114-126.
Co-pending U.S. Appl. No. 15/909,388, filed Mar. 1, 2018.
Co-pending U.S. Appl. No. 15/909,396, filed Mar. 1, 2018.
Co-pending U.S. Appl. No. 15/909,783, filed Mar. 1, 2018.
Co-pending U.S. Appl. No. 15/909,784, filed Mar. 1, 2018.
Co-pending U.S. Appl. No. 15/909,806, filed Mar. 1, 2018.
Co-pending U.S. Appl. No. 15/909,809, filed Mar. 1, 2018.
Co-pending U.S. Appl. No. 15/909,826, filed Mar. 1, 2018.
Gaudin, Sharon. Researcher works to make 3D-printed metals stronger, customizable. Oct. 2014. Accessed online on Mar. 22, 2018. 4 pages. URL:<https://www.computerworld.com/article/2838780/researcher-works-to-make-3d-printed-materials-stronger-customizable.html>.
International Search Report and Written Opinion dated Feb. 12, 2018 for International PCT Patent Application No. PCT/US2017/057340.
Notice of Allowance dated Feb. 16, 2018 for U.S. Appl. No. 15/435,120.
Notice of Allowance dated Feb. 21, 2018 for U.S. Appl. No. 15/435,128.
Notice of Allowance dated Feb. 28, 2018 for U.S. Appl. No. 15/374,821.
Office Action dated Feb. 14, 2018 for U.S. Appl. No. 15/634,228.
Office Action dated Mar. 7, 2018 for U.S. Appl. No. 15/399,186.

(56) References Cited

OTHER PUBLICATIONS

Thorlabs, Inc. Fiber Optic Reflection/Backscatter Probe Bundles. Web. Copyright 1999-2018. Printed Mar. 28, 2018. 5 pages. URL:< https://www.thorlabs.com/newgrouppage9.cfm?objectgroup_id=7794>.
U.S. Appl. No. 15/374,318 Notice of Allowance dated Apr. 20, 2018.
U.S. Appl. No. 15/374,535 Office Action dated Apr. 20, 2018.
U.S. Appl. No. 15/374,616 Office Action dated Mar. 26, 2018.
U.S. Appl. No. 15/374,821 Notice of Allowance dated Apr. 4, 2018.
U.S. Appl. No. 15/435,110 Office Action dated Apr. 19, 2018.
U.S. Appl. No. 15/634,267 Office Action dated Apr. 3, 2018.
U.S. Appl. No. 15/719,133 Office Action dated Mar. 28, 2018.
U.S. Appl. No. 15/853,700 Office Action dated Apr. 6, 2018.
U.S. Appl. No. 15/855,744 Office Action dated Apr. 27, 2018.
U.S. Appl. No. 15/871,763 Office Action dated Apr. 19, 2018.
U.S. Appl. No. 15/909,826 Office Action dated May 2, 2018.
U.S. Appl. No. 15/893,523 Notice of Allowance dated May 7, 2018.
Co-pending U.S. Appl. No. 15/288,251, filed Oct. 7, 2016.
Co-pending U.S. Appl. No. 15/399,186, filed Jan. 5, 2017.
International Search Report and Written Opinion dated Jan. 16, 2017 for International PCT Patent Application No. PCT/US2016/059781.
Notice of Allowance dated Dec. 9, 2016 for U.S. Appl. No. 15/188,939.
Anusci, Victor. Aerosint is Developing the First Commercial Multi-powder SLS 3D Printer. 3D Printing Media Network. Web. Published Jan. 28, 2018. 4 pages. URL:<https://www.3dprintingmedia.network/aerosint-multi-powder-sls-3d-printer/>.
Co-pending U.S. Appl. No. 15/855,744, filed Dec. 27, 2017.
Co-pending U.S. Appl. No. 15/870,561, filed Jan. 12, 2018.
Co-pending U.S. Appl. No. 15/871,763, filed Jan. 15, 2018.
Co-pending U.S. Appl. No. 15/873,832, filed Jan. 17, 2018.
Co-pending U.S. Appl. No. 15/886,544, filed Feb. 1, 2018.
Co-pending U.S. Appl. No. 15/893,523, filed Feb. 9, 2018.
David et al. Welding: Solidification and microstructure. The Journal of the Minerals, Metals & Materials Society (TMS). Jun. 2003, vol. 55, Issue 6, pp. 14-20.
Notice of Allowance dated Jan. 12, 2018 for U.S. Appl. No. 15/435,120.
Notice of Allowance dated Feb. 6, 2018 for U.S. Appl. No. 15/374,821.
Office Action dated Jan. 24, 2018 for U.S. Appl. No. 15/615,004.
Office Action dated Jan. 25, 2018 for U.S. Appl. No. 15/634,727.
Office Action dated Feb. 7, 2018 for U.S. Appl. No. 15/614,979.
Office Action dated Feb. 7, 2018 for U.S. Appl. No. 15/719,229.
Optomec. Lens 850R 3D Printer for Structual Metals. Optomec. YouTube—Web. Published on Jun 3, 2012. 3 pages. URL:<https://www.youtube.com/watch?v=mkUVURLkxS4>.
Saunders, Marc. Real-time AM monitoring opens up new process control opportunities. Web: LinkedIn. Published on Jan. 3, 2018. 12 pages. URL:<https://www.linkedin.com/pulse/real-time-am-monitoring-opens-new-process-control-marc-saunders/>.
SCHOTT. TIE-19: Temperature Coefficient of the Refractive Index. Technical Information: Advanced Optics. SCHOTT AG. Jul. 2016. 10 pages.
SCHOTT. TIE-19: Temperature Coefficient of the Refractive Index. Technical Information: Advanced Optics. SCHOTT North America, Inc. Jul. 2008. 12 pages.
Wang et al. Effects of thermal cycles on the microstructure evolution of Inconel 718 during selective laser melting process. Additive Manufacturing. vol. 18, Dec. 2017, pp. 1-14.
Bohnet, M. Advances in the Design of Pneumatic Conveyors. International Chemical Engineering, vol. 25, No. 3, Jul. 1985, pp. 387-405.
De Dietrich Process Systems, Inc. Powder Pump™. Product Brochure. Created Jul. 3, 2012. 2 pages.
PCT/US2017/064474 International Search Report and Written Opinion dated Apr. 30, 2018.
PCT/US2018/012250 International Search Report and Written Opinion dated Apr. 30, 2018.
RP Photonics Consulting GmbH. Definition of "Optical Intensity". Encyclopedia of Laser Physics and Technology. Jun. 2012. 3 pages. URL:<https://www.rp-photonics.com/optical_intensity.html>.
U.S. Appl. No. 15/374,442 Office Action dated May 21, 2018.
U.S. Appl. No. 15/435,090 Office Action dated May 18, 2018.
U.S. Appl. No. 15/614,979 Office Action dated Jun. 8, 2018.
U.S. Appl. No. 15/615,004 Office Action dated Jun. 8, 2018.
U.S. Appl. No. 15/634,228 Office Action dated Jun. 14, 2018.
U.S. Appl. No. 15/634,727 Office Action dated May 25, 2018.
U.S. Appl. No. 15/870,561 Office Action dated Jun. 15, 2018.
U.S. Appl. No. 15/893,523 Notice of Allowance dated Jun. 15, 2018.

\* cited by examiner

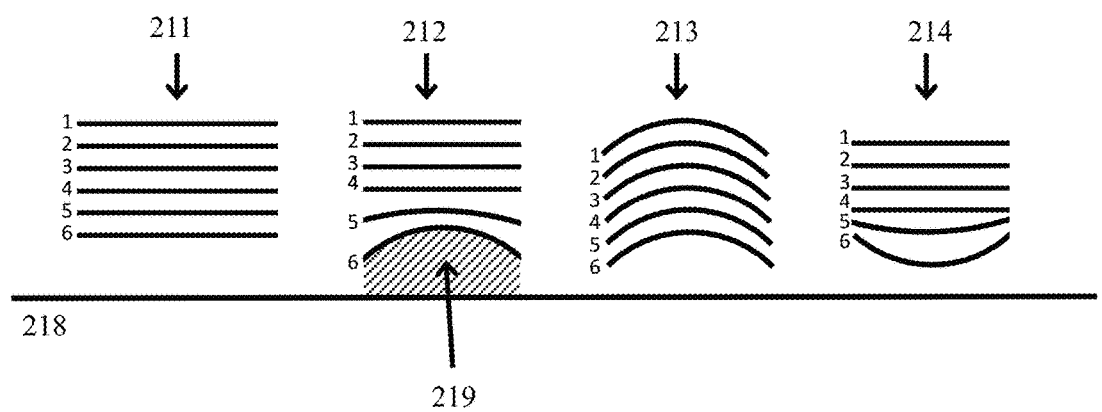
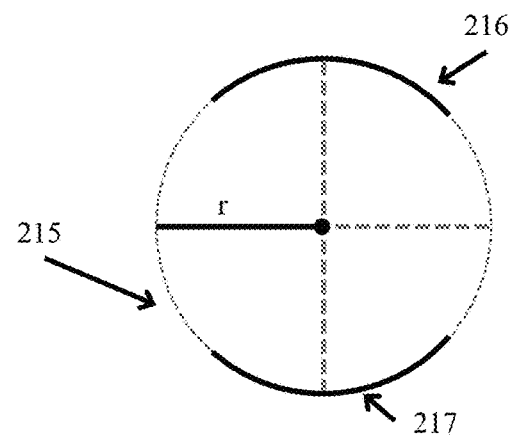

311

341

322

321

352

351

332
331

362
361

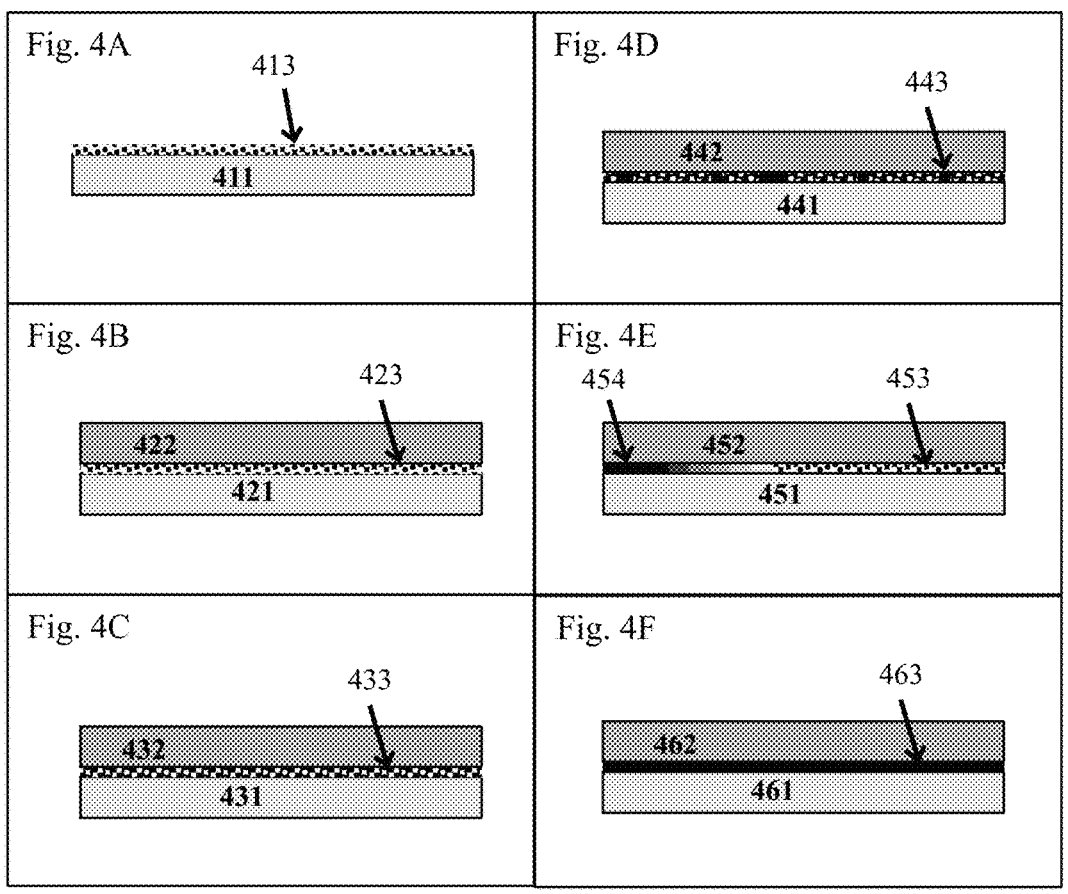

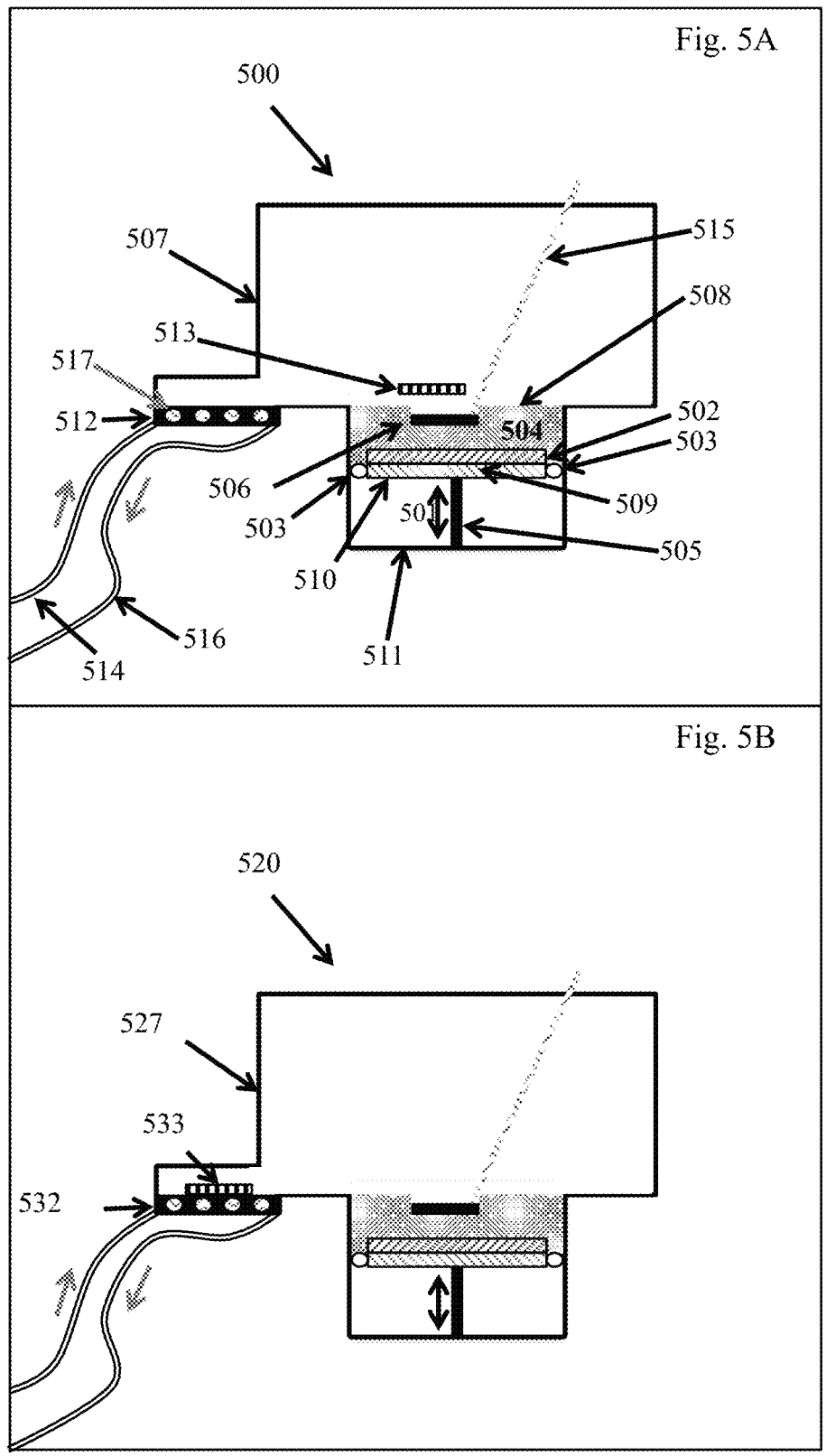

THREE-DIMENSIONAL PRINTING IN REAL TIME

CROSS-REFERENCE

This application claim priority to U.S. Provisional Patent Application Ser. No. 62/252,330 that was filed on 6 Nov. 2015, and U.S. Provisional Patent Application Ser. No. 62/396,584 that was filed on 19 Sep. 2016; each of which is entirely incorporated herein by reference.

BACKGROUND

Three-dimensional (3D) printing (e.g., additive manufacturing) is a process for making a three-dimensional (3D) object of any shape from a design. The design may be in the form of a data source such as an electronic data source, or may be in the form of a hard copy. The hard copy may be a two-dimensional representation of a 3D object. The data source may be an electronic 3D model. 3D printing may use an additive process in which successive layers of material are laid down one on top of each other. This process may be controlled (e.g., automatically and/or manually controlled). A 3D printer can be an industrial robot.

3D printing can generate custom parts quickly and efficiently. A variety of materials can be used in a 3D printing process including elemental metal, metal alloy, ceramic, elemental carbon, and/or polymeric material. In a typical additive 3D printing process, a first material-layer is formed, and thereafter, successive material-layers (or parts thereof) are added one by one, wherein each new material-layer is added on (e.g., and connected to) a pre-formed material-layer, until the entire designed three-dimensional structure (3D object) is materialized.

3D models may be created utilizing a computer aided design package and/or via 3D scanner. The manual modeling process of preparing geometric data for 3D computer graphics may be similar to plastic arts, such as sculpting or animating. 3D scanning is a process of analyzing and collecting digital data on the shape and appearance of a real object. Based on this data, 3D models of the scanned object can be produced. The 3D models may include computer-aided design (CAD).

A large number of additive processes are currently available. They may differ in the manner layers are deposited to create the materialized structure. They may vary in the material or materials that are used to generate the designed structure. Some methods melt or soften material to produce the layers.

SUMMARY

At times, the printed three-dimensional (3D) object may bend, warp, roll, curl, or otherwise deform during and/or after the 3D printing process. Some formations may accumulate during the 3D printing. For example, some deformations may comprise accumulative residual deformation. Some deformations are particularly prevalent when the first one or more of layers is 3D printed (e.g., up to a total thickness of from about one (1) millimeters to about two (2) millimeters). In some embodiments, the following disclosure proposes ways to reduce a degree of the deformation. The degree reduction of the deformation may comprise a 3D printing methodology that comprises using: (i) a real time control (e.g., of the temperature in the material bed, energy beam power, and/or height of the printed 3D part), (ii) object pre-print correction, (iii) at least one cooling mechanism, or (iv) any combination thereof. In some embodiments, the real time control during the 3D printing is achieved using fast, efficient, and/or parallel processing.

Auxiliary supports may be inserted to reduce the deformation. These auxiliary supports may be removed from the printed 3D object after the 3D printing, to produce a desired 3D product (e.g., 3D object). In some embodiments, the present disclosure illustrates generation of 3D objects with reduced degree of deformation. In some embodiments, these 3D objects are fabricated with diminished number (e.g., absence) of auxiliary supports.

In an aspect, the present disclosure delineates methods, systems, apparatuses, and software that facilitate materialization of 3D objects with a reduced amount of design constraints (e.g., no design constraints).

In some instances, it is desired to control (e.g., in real time) the manner in which at least a portion of a layer of hardened material (e.g., as part of the 3D object) is formed. For example, it may be desired to control the manner, type, direction, and/or degree of deformation of at least a layer portion of the 3D object. For example, it may be desired to control a deformation of at least a surface of the 3D object.

In some instances, in order to achieve the desired 3D object, it may be desired to control the 3D object during its formation (e.g., in real time). For example, it may be desired to control the formation of the 3D object using open loop and/or closed loop control. For example, it may be desired to control the formation of the 3D object using feed forward and/or feedback control. In various embodiments, the present disclosure delineates detection, and control of at least the deformations disclosed herein using at least one of the control methodologies disclosed herein.

In another aspect, a method for forming a 3D object comprises: (a) transforming a portion of a material bed with an energy beam to form at least a portion of the 3D object; and (b) controlling in real time at least one characteristic of the energy beam with a controller comprising a control-model related that is related to a requested 3D object. The controller may comprise an electronic circuit. In some examples, related to comprises geometric (e.g., shape and/or layers) or material properties of the requested three-dimensional object.

The control-model may comprise information relating to a slice of the requested 3D object. The control-model may comprise a state-observer-model. The control-model can be adjusted in real time during the forming of the 3D object. The control-model can be configured to the controller. The control-model can be wired to the controller. Real time may be during a dwell time of the energy beam along a hatch line forming a melt pool. The controlling can use a processor comprising at least 3 Tera floating point operations per second, according to a benchmark. The method may further comprises adjusting the at least one characteristic of the energy beam and repeating (a) to (b). The closed loop control may use at least one threshold value. The control-model can comprise a simulation. The simulation can comprise a temperature or mechanical simulation of the 3D printing. The simulation can comprise a thermo-mechanical simulation. The simulation can comprise a material property of the 3D object. The simulation can comprise a geometry of the 3D object. The control-model can be dynamically adjusted in real time. The control-model can comprise a simplified model relative to the requested model of the 3D object. The 3D object can be substantially similar to the requested 3D object. Substantially can be relative to the intended purpose of the 3D object. The 3D object may deviate from a requested 3D object by at most about 100 micrometers.

In another aspect, a system for forming at least one 3D object comprises: (a) an energy beam that transforms at least a portion of a material bed to a transformed material; and (b) a controller comprising a control-model that is related to a requested 3D object, which controller is operative coupled to the energy beam and is programmed to direct the energy beam to transform the at least a portion of the material bed to form the at least one 3D object using the control-model.

The control-model can be adjusted in real time during the forming of the at least one 3D object. Real time is during a dwell time of the energy beam along a hatch line forming a melt pool. The control-model can be configured to the controller. The control-model can be wired to the controller. The parameter can comprise a temperature, height, or power density. At least one 3D object can be a plurality of 3D objects. The plurality of 3D objects can be formed in the same material bed. The plurality of 3D objects can be formed in parallel. The plurality of 3D objects can be formed sequentially. The controller can comprise a closed loop or open loop control. The controller can comprise a feedback or feed-forward control. The controller can comprise a simulation. The simulation can comprise a temperature or mechanical simulation of the 3D printing. The simulation may comprise thermo-mechanical simulation. The simulation can comprise a material property of the requested 3D object. The mechanical simulation can comprise elastic or plastic simulation. The controller can comprise a graphical processing unit (GPU), system-on-chip (SOC), application specific integrated circuit (ASIC), application specific instruction-set processor (ASIPs), programmable logic device (PLD), or field programmable gate array (FPGA).

In another aspect, an apparatus for forming at least one 3D object comprises: (a) an energy source generating an energy beam that transforms at least a portion of a material bed to a transformed material; and (b) a controller comprising a control-model that is related to a requested 3D object, which controller is operative coupled to the energy beam and is programmed to direct the energy beam to transform the at least a portion of the material bed to form the at least one 3D object using the control-model. The control-model can be configured to the controller. The control-model can be wired to the controller.

In another aspect, an apparatus for forming at least one 3D object comprises (a) a first controller that directs an energy beam to transform at least a portion of a material bed to form the at least one 3D object, which first controller is operatively coupled to the energy beam; and (b) a second controller comprising a control-model that is related to a requested 3D object, which second controller alters at least one characteristic of the energy beam in real time using the control-model, wherein the second controller is operatively coupled to the energy beam and to the first controller.

The first controller and the second controller may be the same controller. The first controller and the second controller may be different controllers. Real time can be during the forming of the 3D object. For example, during forming of a layer of the 3D object. For example, during a dwell time of the energy beam along: (i) a path, or (ii) a hatch line forming a melt pool. The control-model may comprise a simulation. The control-model may relate to a simplified model of the 3D object. The control-model may comprise a simplified model of the 3D object. The altered model can be configured to the controller. The altered model can be wired to the controller.

In another aspect, a computer software product for 3D printing of at least one 3D object comprises a non-transitory computer-readable medium in which program instructions are stored, which instructions, when read by a computer, cause the computer to perform operations comprising: (a) direct an energy beam to transform at least a portion of a material bed to form the at least one 3D object; and (c) direct at least one controller that comprises a control-model that is related to a requested 3D object, to control in real time at least one characteristic of the energy beam using the altered model. The altered model can be configured to the controller. The altered model can be wired to the controller.

In another aspect, a method for forming a 3D object comprises: (a) transforming a portion of a material bed with an energy beam to form a portion of the 3D object; (b) measuring a parameter at one or more locations of the material bed; and (c) controlling in real time at least one characteristic of the energy beam with a closed loop control by using the measured parameter, wherein real time is during a dwell time of the energy beam along: (i) a path, or (ii) a hatch line forming a melt pool.

Real time can be during a dwell time of the energy beam along a hatch line forming a melt pool. The controlling can utilize a processor comprising at least 3 Tera floating point operations per second, according to a benchmark. The parameter can comprise a temperature, height, or power density. The at least one characteristic can comprise a power per unit area, trajectory, dwell time, footprint, cross section, or focus. The controlling can comprise altering. The method can further comprise altering the at least one characteristic of the energy beam and repeating operations (a) to (c). The closed loop control may use one or more target parameters comprising temperature, metrology, or power per unit area. The closed loop control may utilize at least one threshold value. The closed loop control may utilize a control-model comprising a simulation. The simulation can comprise a temperature or mechanical simulation of the 3D printing. The simulation can comprise a material property of the 3D object. The simulation can comprise a geometry of the 3D object. The control-model can be dynamically adjusted in the real time. The control-model can comprise a simplified model relative to a requested model of the 3D object. The 3D object may deviate from a requested 3D object by at most about 100 micrometers. The one or more locations of the material bed can comprise one or more locations of the 3D object during its formation.

In another aspect, a system for forming at least one 3D object comprises: (a) an energy beam that transforms at least a portion of a material bed to a transformed material; (b) one or more sensors measuring a parameter of one or more locations in the material bed; and (c) at least one controller comprising a closed loop control, which at least one controller is operative coupled to the energy beam and to the one or more sensors and is programmed to: (i) direct the energy beam to transform the at least a portion of the material bed to form the at least one 3D object; (ii) direct the one or more sensors to measure one or more parameters of one or more locations on at least a portion of the at least one 3D object; and (iii) control in real time at least one characteristic of the energy beam using the measured one or more parameters, wherein real time is during a dwell time of the energy beam along: (1) a path, or (2) a hatch line forming a melt pool.

At least two of operations (i) to (iii) are controlled by the same controller. The at least one controller can be a multiplicity of controllers. At least two of operations (i) to (iii) are controlled by the multiplicity of controllers respectively, which multiplicity of controllers are operatively coupled.

The at least one 3D object can be a plurality of 3D objects. The plurality of 3D objects can be formed in the same material bed. The plurality of 3D objects can be formed in parallel. The plurality of 3D objects can be formed sequentially. The one or more locations of the material bed can comprise one or more locations of the at least one 3D object during its formation.

In another aspect, an apparatus for forming at least one 3D object comprises at least one controller that is programmed to: (a) direct an energy beam to transform at least a portion of a material bed to form the at least one 3D object; (b) direct one or more sensors to measure one or more parameters of one or more locations of the material bed; and (c) control in real time at least one characteristic of the energy beam using the measured one or more parameters, wherein real time is during a dwell time of the energy beam along (i) a path, or (ii) a hatch line forming a melt pool.

At least two of operations (a) to (c) can be controlled by the same controller. The at least one controller can be a multiplicity of controllers. At least two of operations (a) to (c) can be controlled by two different controllers respectively. The one or more sensors can measure the one or more parameters respectively. The one or more locations of the material bed may comprise one or more locations of the at least one 3D object during its formation.

In another aspect, an apparatus for forming a 3D object comprises: (a) an energy beam that transforms at least a portion of a material bed to form at least a portion of the 3D object; (b) one or more sensors that measure one or more parameters of one or more locations of the material bed, which one or more sensors are disposed adjacent to the material bed; and (c) a controller that controls in real time at least one characteristic of the energy beam based on the measured one or more parameters, wherein real time is during a dwell time of the energy beam along: (i) a path, or (ii) a hatch line forming a melt pool, which controller is operatively coupled to the energy beam and to the one or more sensors.

In another aspect, a computer software product for 3D printing of at least one 3D object comprises a non-transitory computer-readable medium in which program instructions are stored, which instructions, when read by a computer, cause the computer to perform operations comprising: (a) direct an energy beam to transform at least a portion of a material bed to form the at least one 3D object; (b) direct one or more sensors to measure one or more parameters of one or more locations of the material bed; and (c) direct at least one controller to control in real time at least one characteristic of the energy beam using the measured one or more parameters, wherein real time is during a dwell time of the energy beam along: (i) a path, or (ii) a hatch line forming a melt pool.

In another aspect, a method for forming a 3D object comprises: (a) altering a 3D model of a requested 3D object to form an altered model, which altering comprises a structural alteration, wherein at least a first derivative of the difference between (i) the altered model and (ii) the 3D model that is related to the requested 3D object, is continuous; and (b) transforming at least a portion of a material bed with an energy beam according to the altered model to form the 3D object, wherein the 3D object is substantially similar to the requested 3D object.

The transforming can comprise dynamically adjusting the altered model in real time the formation of the 3D object. The method may further comprise after operation (a) and before operation (b): generating a printing instruction by using the altered model. Transforming at least a portion of a material bed with an energy beam in operation (b) may be according to the printing instruction. The generation of the printing instruction can comprise dynamically adjusting the altered model in real time during the transformation of the at least a portion of the material bed. The dynamically adjusting can comprise using a closed loop control. The dynamically adjusting can comprise using a real time measurement of one or more sensors. The generation of the printing instruction can comprise using a simulation comprising thermal, mechanical, geometric, or material properties of the 3D object (or a portion thereof). The generation of the printing instruction can comprise using a simulation comprising thermal, mechanical, geometric, or material properties of the 3D model of the requested 3D object (or a portion thereof). Generating the printing instruction can comprise using a geometric information deriving from a previously formed portion of the three-dimensional object. The geometric information can comprise a local thickness below a given layer, local build angle, proximity to an edge on a given layer, or proximity to layer boundary. The simulation can be dynamically adjusted in real time during the formation of the three-dimensional object (e.g., during a layer thereof, an energy beam path, or a hatch forming at least one melt pool). The substantially similar can be relative to the intended purpose of the 3D object. The 3D object may deviate from the model of the 3D object by at most about 100 micrometers. The at least the first derivative may be a plurality of derivatives. For example, the plurality of derivatives can comprise the first three derivatives. The 3D model of the requested 3D object may comprise slices. The altering may comprise a structural adjustment of a plurality of the slices. The 3D object may comprise layers. The slices may correspond to layers in the 3D object (e.g., respectively). The 3D object may be formed by additive manufacturing.

In another aspect, a system for forming at least one 3D object comprises: (a) an energy beam that transforms at least a portion of a material bed to a transformed material; (b) a first processor that alters a 3D model of a requested 3D object to an altered model, which altered model comprises a structural alteration, wherein at least a first derivative of the difference between (i) the altered model and (ii) the 3D model of the requested 3D object, is continuous; and (c) at least one controller that is operative coupled to the energy beam and to the second processor and is programmed to: direct the energy beam to transform at least a portion of a material bed according to the altered model to form the 3D object, wherein the 3D object is substantially similar to the requested 3D object.

The system may further comprise a second processor that generates a printing instruction using the altered model. The second processor may be operatively coupled to the first processor. Transformation of the at least a portion of a material bed may be according to the printing instruction. The first processor and the second processor may be different. The first processor and the second processor may be the same processor. The material bed can comprise a powder material. The powder material can be flowable during the forming of the at least one 3D object. The powder material in the powder bed can be unfixed during the forming of the at least one 3D object. The material bed can be can be at ambient pressure during the forming of the at least one 3D object. The material bed can be at ambient temperature during the forming of the at least one 3D object. The material bed can include a powder bed comprising individual (e.g., solid) particles formed of at least one member selected from the group consisting of an elemental metal, metal alloy, ceramic, and an allotrope of elemental carbon.

Transforming can comprise melting or sintering. Melting can comprise complete melting. The energy beam can comprise an electromagnetic or charged particle beam. The energy beam can comprise a laser or an electron gun. The controller can comprise closed loop control or open loop control. The controller can comprise feedback control or feed-forward control. The controller can comprise parallel processing. The parallel processing can comprise a graphical processing unit (GPU), system-on-chip (SOC), application specific integrated circuit (ASIC), application specific instruction-set processor (ASIPs), programmable logic device (PLD), or field programmable gate array (FPGA). The controller can use a threshold value for the direct. The controller can use a sensor input for the direct.

In another aspect, an apparatus for generating a 3D object comprises a controller that is programmed to direct an energy beam to transform at least a portion of a material bed according to an altered model of a requested 3D object to generate the 3D object, which altered model comprises a structural (e.g., geometric) alteration of a 3D model of the requested 3D object, wherein at least a first derivative of the difference between (i) the altered model and (ii) the 3D model of the requested 3D object, is continuous, and wherein the 3D object is substantially similar to the requested 3D object. The transformation of at least a portion of a material bed may be according to a printing instruction, which printing instruction uses the altered model.

In another aspect, an apparatus for forming a 3D object comprises: (a) a first processor that alters a 3D model of a requested 3D object to an altered model, which altered model comprises a structural (e.g., geometric) alteration, wherein at least a first derivative of the difference between (i) the altered model and (ii) the 3D model of the requested 3D object, is continuous; and (b) an energy beam that transforms at least a portion of a material bed to a transformed material as part of the 3D object according to the altered model, wherein the 3D object is substantially similar to the requested 3D object. The apparatus may further comprise a second processor that generates a printing instruction using the altered model. The energy beam may be operatively coupled to the second processor. The first processor may be operatively coupled to the second processor. The first processor and the second processor can be different. The first processor and the second processor can be the same processor. The transformation of at least the portion of the material bed may be according to the printing instruction that is related to (e.g., comprises) the altered model. In some examples, related to comprises geometric (e.g., shape and/or layers) or material properties of the requested three-dimensional object.

In another aspect, a computer software product for 3D printing of at least one 3D object comprises a non-transitory computer-readable medium in which program instructions are stored, which instructions, when read by at least one computer, cause the at last one computer to perform operations comprising: (a) alter a 3D model of a requested 3D object to an altered model, which altered model comprises a structural (e.g., geometric) alteration, wherein at least a first derivative of the difference between (i) the altered model and (ii) the 3D model of the requested 3D object, is continuous; and (b) direct an energy beam to transform at least a portion of a material bed to form the 3D object according to the altered model, wherein the 3D object is substantially similar to the requested 3D object. The operation may further comprise (c) generate a printing instruction using the altered model. The operation (c) may take place after (a) and before (b). The transformation of the at least the portion of the material bed may be according to the printing instruction. The printing instruction may relate to the altered model. The printing instruction may comprise the altered model. At least two of operations (a) to (c) can be performed by the same computer. The at least one computer can be a multiplicity of computers. At least two of operations (a) to (c) can be performed by the multiplicity of computers (e.g., respectively). The multiplicity of computers may be operatively coupled.

In another aspect, a system for forming at least one 3D object comprises: (a) an energy beam that transforms at least a portion of a material bed to a transformed material; (b) a first processor that alters a 3D model of a requested 3D object to an altered model, which altered model comprises a structural adjustment, wherein the 3D model of the requested 3D object comprises slices, which altered model comprises a structural adjustment of a plurality of the slices; (c) a second processor that generates a printing instruction using the altered model, wherein the second processor is operatively coupled to the first processor; and (d) at least one controller that is operative coupled to the energy beam and to the second processor and is programmed to: direct the energy beam to transform at least a portion of a material bed according to the printing instruction to form the 3D object, wherein the 3D object is substantially similar to the requested 3D object.

The first processor and the second processor can be different. The first processor and the second processor can be the same processor. The material bed can comprise a powder material. The powder material can be flowable during the forming of the at least one 3D object. The material in the material bed (e.g., powder material) can be unfixed during the forming of the at least one 3D object. The material bed can be at ambient pressure during the forming of the at least one 3D object. The material bed can be at ambient temperature during the forming of the at least one 3D object. The material bed can comprise a powder bed comprises individual particles formed of at least one member selected from the group consisting of an elemental metal, metal alloy, ceramic, and an allotrope of elemental carbon. Transforming can comprise melting or sintering. Melting can comprise complete melting. The energy beam can comprise an electromagnetic or charged particle beam. The energy beam can comprise a laser or an electron gun. The controller can comprise closed loop control or open loop control. The controller can comprise feedback control or feed-forward control. The controller can comprise parallel processing. The parallel processing can comprise a graphical processing unit (GPU), system-on-chip (SOC), application specific integrated circuit (ASIC), application specific instruction-set processor (ASIPs), programmable logic device (PLD), or field programmable gate array (FPGA). The controller can use a threshold value for the direct. The controller can use a sensor input for the direct.

In another aspect, an apparatus for generating a 3D object comprises a controller that is programmed to direct an energy beam to transform at least a portion of a material bed according to a printing instruction to generate the 3D object, which printing instruction uses an altered model of a requested 3D object, which altered model comprises a structural alteration of the 3D model of the requested 3D object, wherein the 3D model of the requested 3D object comprises slices, which altered model comprises a structural adjustment of a plurality of the slices, and wherein the 3D object is substantially similar to the requested 3D object.

In another aspect, an apparatus for forming a 3D object comprises: (a) a first processor that alters a 3D model of a requested 3D object to an altered model, which altered model comprises a structural alteration, wherein the 3D model of the requested 3D object comprises slices, which altered model comprises a structural alteration of a plurality of the slices; (b) a second processor that generates a printing instruction using the altered model, wherein the energy beam is operatively coupled to the second processor, wherein the first processor is operatively coupled to the second processor; and (c) an energy beam that transforms at least a portion of a material bed to a transformed material as part of the 3D object according to the printing instruction, wherein the 3D object is substantially similar to the requested 3D object. The first processor and the second processor can be different. The first processor and the second processor can be the same processor.

In another aspect, a computer software product for 3D printing of at least one 3D object, comprises a non-transitory computer-readable medium in which program instructions are stored, which instructions, when read by at least one computer, cause the at last one computer to perform operations comprising: (a) alter a 3D model of a requested 3D object to an altered model, which altered model comprises a structural alteration, wherein the 3D model of the requested 3D object comprises slices, which altered model comprises a structural adjustment of a plurality of the slices; (b) generate a printing instruction using the altered model; and (c) direct an energy beam to transform at least a portion of a material bed to form the 3D object according to the printing instruction, wherein the 3D object is substantially similar to the requested 3D object. At least two of (a) to (c) can be performed by the same computer. The at least one computer can be a multiplicity of computers. At least two of (a) to (c) can be performed by the multiplicity of computers respectively, wherein the multiplicity of computers is operatively coupled.

In another aspect, a method for forming a 3D object comprises: (a) transforming at least a portion of a material bed with an energy beam, wherein the material bed is disposed in an enclosure; (b) cooling the material bed during the transforming with a first cooling member that is mobile during the forming of the three-dimensional object, wherein the first cooling member is disposed in the enclosure, wherein the first cooling member is separated from the exposed surface of the material bed by a gap comprising a gas, wherein the first cooling member comprises a heat conductive material; and (c) cooling the first cooling member with a second cooling member that is disposed (i) at an enclosure wall or (ii) outside of the enclosure, wherein the second cooling member is stationary, wherein the second cooling member comprises an opening.

During the forming of the three-dimensional object can comprise during the transforming of the at least a portion of the material bed. The cooling can comprise a physical contact. The physical contact can be a direct physical conduct between the first cooling member and the second cooling member. The physical contact can be an indirect physical conduct between the first cooling member and the second cooling member. The second cooling member can comprise active cooling using a coolant. The coolant may travel through the second cooling member during the cooling in (c). The second cooling member can comprise an exit opening and an entrance opening. The second cooling member can comprise active cooling using a coolant that enters through the entrance opening and exits through the exit opening. The first cooling member can comprise a heat sink. The second cooling member can comprise a heat exchanger. The heat conductive material can be at least about 20 Watts per meter times Kelvin (W/mK), as measured at an ambient temperature. The first cooling member and the second cooling members may be disposed in different atmospheres. The first cooling member can be disposed at an inert atmosphere. The second cooling member can be disposed at an ambient atmosphere. The first cooling member may follow the energy beam during the forming of the three-dimensional object (e.g., during the transforming). The movement of the first cooling member may be synchronized with the movement of the energy beam during the forming of the three-dimensional object (e.g., during the transforming). The first cooling member can comprise an opening to let the energy beam travel through. The first cooling member can be disposed along a trajectory of the energy beam to the material bed. The method may further comprise cooling the material bed during the forming of the three-dimensional object (e.g., during the transforming) with a third cooling member. The third cooling member can be mobile during the forming of the three-dimensional object (e.g., during the transforming). The third cooling member can be disposed in the enclosure. The third cooling member can be separated from the exposed surface of the material bed by a gap comprising a gas. The third cooling member can comprise a heat conductive material. The heat conductive material can be at least about 20 Watts per meter times Kelvin (W/mK), as measured at an ambient temperature. The third cooling member can be passive. The third cooling member can comprise a heat sink. The third cooling member can comprise a heat sink. The method may further comprise cooling the third cooling member with the second cooling member. Cooling of the third cooling member with the second cooling member can comprise a physical contact. The physical contact can be a direct physical conduct between the third cooling member and the second cooling member. The physical contact can be an indirect physical conduct between the third cooling member and the second cooling member.

In another aspect, a system for forming a 3D object comprises: (a) a material bed disposed in an enclosure; (b) an energy source generating an energy beam that transforms at least a portion of the material bed, wherein the energy source is disposed adjacent to the enclosure; (c) a first cooling member comprising a heat conductive material, which first cooling member is separated from the material bed by a gap comprising a gas, which first cooling member is mobile, wherein the first cooling member is disposed in the enclosure; (d) a second cooling member comprising an opening, which second cooling member is stationary, wherein the second cooling member is disposed at a wall of the enclosure or outside of the enclosure; and (e) at least one controller that is operatively coupled to the energy beam, the first cooling member, and the second cooling member, and is programmed to (i) direct the energy beam to transform at least a portion of the material bed to form the 3D object, (ii) direct the first cooling member to cool the material bed while moving during the forming of the three-dimensional object, and (iii) direct the first cooling member to exchange heat with the second cooling member during formation of the 3D object.

During the forming of the three-dimensional object can comprise during the transformation of the at least a portion of the material bed to form the 3D object (e.g., during operation (i)). The first cooling member can exchange heat with the second cooling member when the first cooling member reaches a temperature threshold. The system may further comprise a temperature sensor that senses the temperature of the first cooling member. The first cooling member may exchange heat with the second cooling member after formation of a prescribed number of layers of hardened material as part of the 3D object. The prescribed number of layers may be one layer. The system may further comprise a third cooling member comprising a heat conductive material. The third cooling member can be separated from the material bed by a gap comprising a gas. The third cooling member may be mobile during formation of the third-dimensional object. The third cooling member may be mobile during operation (i). The third cooling member may be disposed in the enclosure. The controller may be operatively coupled to the third cooling member. The controller may further be programmed to direct the third cooling member to exchange heat with the second cooling member (e.g., during formation of the 3D object).

In another aspect, an apparatus for generating a 3D object comprises at least one controller that is programmed to (a) direct an energy beam to transform at least a portion of a material bed to form the 3D object, wherein the material bed is disposed in an enclosure; (b) direct a first cooling member to cool the material bed while moving during the generating of the 3D object (e.g., during operation (a)), wherein the first cooling member comprises a heat conductive material, wherein the first cooling member is separated from an exposed surface of the material bed by a gap; and (c) direct the first cooling member to exchange heat with a second cooling member during formation of the 3D object, wherein the second cooling member comprises an opening, wherein the second cooling member is disposed outside of the enclosure or at a wall of the enclosure, wherein the controller is operatively coupled to the energy beam, the first cooling member, and the second cooling member. A at least one of operations (a) to (c) may be controlled by the same controller. At least one controller may comprise a multiplicity of controllers. At least one of (a) to (c) may be controlled by different controllers.

In another aspect, an apparatus for forming a 3D object comprises: (a) a material bed disposed in an enclosure; (b) an energy source generating an energy beam that transforms at least a portion of the material bed to form the 3D object, wherein the energy source is disposed adjacent to the enclosure; (c) a first cooling member comprising a heat conductive material, which first cooling member is separated from the material bed by a gap comprising a gas, which first cooling member is mobile, wherein the first cooling member is disposed in the enclosure; and (d) a second cooling member comprising an opening, which second cooling member is stationary, wherein the second cooling member is disposed at a wall of the enclosure or outside of and adjacent to the enclosure.

The second cooling member can be actively cooling the first cooling member that is passive. The first cooling member can be mobile during formation of the 3D object. The second cooling member may cool the first cooling member during formation of the 3D object.

In another aspect, a computer software product for 3D printing of at least one 3D object, comprises a non-transitory computer-readable medium in which program instructions are stored, which instructions, when read by at least one computer, cause the at last one computer to perform operations comprising: (a) direct an energy beam to transform at least a portion of a material bed to the 3D object, wherein the material bed is disposed in an enclosure; (b) direct a first cooling member to cool the material bed during formation of the 3D object, wherein the first cooling member is mobile during the formation, wherein the first cooling member is disposed in the enclosure, wherein the first cooling member is separated from an exposed surface of the material bed by a gap comprising a gas, wherein the first cooling member comprises a heat conductive material; and (c) direct the first cooling member to physically contact a second cooling member to cool the first cooling member, wherein the second cooling member is disposed (i) at an enclosure wall or (ii) outside of the enclosure, wherein the second cooling member is stationary, wherein the second cooling member comprises an opening, wherein the first cooling member, the second cooling member, the energy beam and the at least one computer are operatively coupled.

The physically contact can comprise a direct physical contact between the first and second cooling member. The physically contact may comprise an indirect physical contact between the first and second cooling member through one or more materials (e.g., mediators). The one or more materials can comprise a solid material. The at least one computer can be a multiplicity of computers. At least two of operations (a) to (c) may be performed by different computers. The multiplicity of computers may be operatively coupled. At least two of operations (a) to (c) can be performed by the same computer.

In another aspect, a method for forming a 3D object comprises: (a) providing a first structure having a bottom surface with a first curvature that is negative, which structure comprises a hardened material and is disposed in a material bed adjacent to a platform; and (b) transforming at least a portion of the material bed into a transformed material that is coupled to the top of the first structure to form a second structure, which transformed material hardens into a hardened material as part of the 3D object, wherein a bottom surface of the second structure has a second curvature that is greater than the first curvature, wherein the first curvature is negative when a volume bound from the bottom surface to the platform is a convex object, which bottom surface is disposed above the platform, wherein bottom faces the platform, wherein top faces away from the platform.

Coupled may be attached. The curvature of the bottom surface of the second structure may be at most about 0.02 millimeter$^{(-1)}$. The material bed can be a powder bed. During formation the 3D object may be suspended (e.g., float) anchorless in the material bed. The 3D may be formed without one or more auxiliary support features. The method may further comprise prior to operation (a), transforming at least a portion of the material bed into a transformed material, which transformed material hardens into a hardened material as part of the negatively warped object. The first structure may be generated by 3D printing. The 3D printing may be additive manufacturing. The additive manufacturing may comprise selective laser sintering or selective laser melting.

In another aspect, a system for forming a 3D object, comprises: (a) a material bed disposed adjacent to a platform comprising a first structure having a bottom surface with a first curvature that is negative, which structure comprises a hardened material; (b) an energy source generating an energy beam that transforms at least a portion of the material bed into a transformed material; and (c) a controller operatively coupled to the material bed and to the energy beam and is programmed to direct the energy beam to transform at least a portion of the material bed into a transformed material that couples to the top of the first structure to form a second structure, which transformed material hardens into a hardened material as part of the 3D object, wherein a bottom surface of the second structure has a second curvature that is greater than the first curvature, wherein the first curvature is negative when a volume bound from the bottom surface to the platform is a convex object, which bottom surface is disposed above the platform, wherein bottom faces the platform, wherein top faces away from the platform. The curvature of the bottom surface of the second structure may be at most about 0.02 (1/millimeter).

In another aspect, an apparatus for forming a 3D object comprises: a controller that is operatively coupled to an energy beam and is programmed to direct the energy beam to transform at least a portion of a material bed into a transformed material that couples to a top surface of a first structure to form a second structure, which first structure has a bottom surface with a first curvature that is negative and is disposed in the material bed, which transformed material hardens into a hardened material as part of the 3D object, wherein a bottom surface of the second structure has a second curvature that is greater than the first curvature, wherein the first curvature is negative when a volume bound from the bottom surface to the platform is a convex object, which bottom surface is disposed above the platform, wherein bottom faces the platform, wherein top faces away from the platform.

The controller may be operatively coupled to a leveling member and is programmed to direct the leveling member to level the exposed surface of the material bed. The controller may be operatively coupled to a material removal member and is programmed to direct the material removal member to remove material from the material bed. The removal of the material from the material bed may result in a substantially planar exposed surface of the material bed. The removal may exclude contacting the exposed surface of the material bed.

In another aspect, an apparatus for forming a 3D object comprises: (a) a material bed comprising a first structure of hardened material; and (b) an energy source generating an energy beam, which energy source is disposed adjacent to the material bed, which energy beam transforms at least a portion of the material bed into a transformed material that couples to a top surface of a first structure to form a second structure, which first structure has a bottom surface with a first curvature that is negative and is disposed in the material bed, which transformed material hardens into a hardened material as part of the 3D object, wherein a bottom surface of the second structure has a second curvature that is greater than the first curvature, wherein the first curvature is negative when a volume bound from the bottom surface to the platform is a convex object, which bottom surface is disposed above the platform, wherein bottom faces the platform, wherein top faces away from the platform.

In another aspect, a method for forming a 3D object comprises: (a) forming a first layer of hardened material in a material bed that comprises an pre-transformed material, which material bed is disposed adjacent to a platform; (b) disposing an upper layer of pre-transformed material above the first layer of hardened material; (c) generating a layer of hardened material from at least a portion of the upper layer of pre-transformed material, wherein the first layer of hardened material is separated from the second layer of hardened material by a gap, wherein the gap comprises a material that is less dense than either the first layer of hardened material and the second layer of hardened material, wherein above is relative to a direction away from the platform.

The method may further comprise after operation (a) and before operation (b) disposing a leveled layer of pre-transformed material on the first layer of hardened material. The pre-transformed material may be a powder material. The gap may comprise the powder material. The powder material may be at least partially sintered. The gap may comprise portions of hardened material and portions that include powder material or sintered powder material. The portions may be distributed across the gap. The portions may be concentrated within the gap. The method may further comprise transforming the material within the gap to form a transformed material that subsequently hardens into a hardened material as a portion of the 3D object. The curvature of the first layer of hardened material and of the second layer of hardened material may be at most about 0.02 millimeter$^{(-1)}$ (i.e., 1/millimeter).

In another aspect, a system for forming a 3D object comprises: (a) a material dispenser that dispenses pre-transformed material to form a material bed comprising a first layer of hardened material and pre-transformed material, which material bed is disposed adjacent to a platform; (b) an energy source generating an energy beam that transforms at least a portion of the material bed into a transformed material; and (c) a controller operatively connected to the material dispenser and to the energy beam and is programmed to: (i) direct the material dispenser to dispose an upper layer of pre-transformed material above the first layer of hardened material; (ii) direct the energy beam to generate a layer of hardened material from at least a portion of the upper layer of pre-transformed material, wherein the first layer of hardened material is separated from the second layer of hardened material by a gap, wherein the gap comprises a material that is less dense than either the first layer of hardened material and the second layer of hardened material, wherein above is relative to a direction away from the platform.

In another aspect, an apparatus for forming a 3D object comprises: a controller that is programmed to (i) direct a material dispenser to dispose an upper layer of pre-transformed material above a first layer of hardened material in a material bed comprising pre-transformed material, which material bed is disposed adjacent to a platform; and (ii) direct an energy beam to generate a layer of hardened material from at least a portion of the upper layer of pre-transformed material, wherein the first layer of hardened material is separated from the second layer of hardened material by a gap, wherein the gap comprises a material that is less dense than either the first layer of hardened material and the second layer of hardened material, and wherein the controller is operatively coupled to the material dispenser and to the energy beam, wherein above is relative to a direction away from the platform.

The controller may be operatively coupled to a leveling member and is programmed to direct the leveling member to level the exposed surface of the material bed. The controller may be operatively coupled to a material removal member and is programmed to direct the material removal member to remove material from the material bed. The removal of the material from the material bed can result in a substantially planar exposed surface of the material bed. The removal may exclude contacting the exposed surface of the material bed.

In another aspect, an apparatus for forming a 3D object comprises: (a) a material bed comprising an upper layer of pre-transformed material above a first layer of hardened material that is embedded in pre-transformed material within the material bed, which material bed is disposed adjacent to a platform; and (b) an energy source generating an energy beam to generate a layer of hardened material from at least a portion of the upper layer of pre-transformed material, wherein the first layer of hardened material is separated from the second layer of hardened material by a gap, wherein the gap comprises a material that is less dense than either the first layer of hardened material and the second layer of hardened material, and wherein the energy source is disposed adjacent to the material bed, wherein above is relative to a direction away from the platform.

In another aspect, a method for forming a 3D object comprises: (a) forming a hardened material in a material bed comprising pre-transformed material, wherein the material of the hardened material and material bed substantially excludes a resin and a polymer that comprises repeating molecular units, which polymer and resin are organic; (b) disposing a layer of pre-transformed material on the hardened material; (c) melting a portion of the layer to form a molten portion; (d) hardening the exposed surface of the molten portion while the interior of the molten portion remains molten; and (e) hardening the molten portion to form at least a portion of the 3D object.

The material of the hardened material and of the material bed can be selected from the group consisting of elemental metal, metal alloy, ceramics, and an allotrope of elemental carbon. The material of the hardened material and material bed can be selected from the group consisting of elemental metal and metal alloy. The pre-transformed material can be a powder material. The method can further comprise in operation (e), cooling the molten portion for the hardening. The hardened material may be a solidified material. Hardens may be solidifies. The method may reduce a curvature of at least one surface of the 3D object. The method may reduce the curvature such that the at least one surface of the 3D object comprises a positive curvature, negative curvature, or substantially zero curvature.

In another aspect, a system for forming a 3D object comprises: (a) a material dispenser that dispenses pre-transformed material to form a material bed that comprises a hardened material and pre-transformed material, wherein the material of the pre-transformed material and hardened material substantially excludes a resin and a polymer that comprises repeating molecular units, which polymer and resin are organic; (b) an energy source generating an energy beam that transforms at least a portion of the material bed into a transformed material; (c) a cooling member; and (d) a controller operatively connected to the material dispenser, energy beam, and cooling member and is programmed to: (i) direct the material dispenser to dispose a layer of pre-transformed material on the hardened material; (ii) direct the energy beam to melt a portion of the layer to form a molten portion; (iii) direct the cooling member to harden the exposed surface of the molten portion while keeping the interior of the molten portion molten; and (iv) direct the cooling member to harden the molten portion to form at least a portion of the 3D object.
The material may comprise an elemental metal, metal alloy, ceramics, or an allotrope of elemental carbon.

In another aspect, an apparatus for forming a 3D object comprises: a controller that is programmed to (a) direct a material dispenser to dispose a layer of pre-transformed material on a hardened material disposed in a material bed, wherein the material of the pre-transformed material and hardened material substantially excludes a resin and a polymer that comprises repeating molecular units, which polymer and resin are organic, which controller is operatively coupled to the material dispenser; (b) direct an energy beam to melt a portion of the layer of pre-transformed material to form a molten portion, which controller is operatively coupled to the energy beam; (c) direct a cooling member to harden the exposed surface of the molten portion while keeping the interior of the molten portion molten, which cooling member is operatively coupled to the controller; and (d) direct the cooling member to harden the molten portion to form at least a portion of the 3D object. The material may comprise an elemental metal, metal alloy, ceramics, or an allotrope of elemental carbon.

In another aspect, an apparatus for forming a 3D object comprises: (a) a material bed comprising a layer of pre-transformed material on a hardened material, wherein the material of the pre-transformed material and hardened material substantially excludes a resin and a polymer that comprises repeating molecular units, which polymer and resin are organic; (b) an energy source generating an energy beam to melt a portion of the layer of pre-transformed material to form a molten portion, which energy source is disposed adjacent to the material bed; (c) a cooling member that (i) hardens the exposed surface of the molten portion while keeping the interior of the molten portion molten, and (ii) hardens the molten portion to form at least a portion of the 3D object, which cooling member is disposed adjacent to the material bed. The material bed can be disposed adjacent to a platform and wherein the cooling member is disposed above the material bed. Above can be in the direction away from the platform.

In another aspect, a method for forming a 3D object comprises: (a) forming a first hardened material in a material bed comprising pre-transformed material, wherein the material of the first hardened material and the pre-transformed material substantially excludes a resin and a polymer that comprises repeating molecular units, which polymer and resin are organic; (b) disposing a layer of pre-transformed material on the first hardened material; (c) melting a portion of the layer and a portion of the first hardened material to form a molten portion and a remainder of the first hardened material; and (d) hardening the molten portion to form a second hardened material and plastically deforming a region comprising (i) a portion of the second hardened material, and (ii) a portion of the remainder of the first hardened material that is bordering the second hardened material, wherein the region comprises an exposed surface and an interior, which exposed surface ceases to plastically deform before the interior ceases to plastically deform, wherein the hardening forms at least a portion of the 3D object.

The material of the first hardened material and the pre-transformed material can be selected from the group consisting of elemental metal, metal alloy, ceramics, and an allotrope of elemental carbon. The material of the first hardened material and the pre-transformed material can be selected from the group consisting of elemental metal and metal alloy. Melting can be melting together a portion of the layer and a portion of the first hardened material to form a molten portion, and wherein the hardening is solidifying. The method may control (e.g., regulate) the curvature of at least one surface of the 3D object. During formation, the 3D object may be suspended (e.g., float) anchorless in the material bed. The method may reduce the curvature of at least one surface of the 3D object. The method may result in the formation a positive curvature, negative curvature, or substantially zero curvature in the at least one surface of the 3D object. The method may form a positive curvature, negative curvature, or substantially zero curvature in the at least one surface of the 3D object. The hardening operation may occur before the deforming operation. The method may further comprise after the hardening operation and before a completion of the plastically deforming operation, heating the second hardened material. The method may further comprise after the hardening operation and before a completion of the plastically deforming operation, cooling the second hardened material. The method may further comprise after the hardening operation and before a completion of the plastically deforming operation, heating the second hardened material followed by cooling the second hardened material. The cooling operation may comprise cooling from above the exposed surface, wherein above is the direction opposing the platform.

In another aspect, a system for forming 3D object comprises: (a) a material dispenser that dispenses pre-transformed material to form a material bed, which material bed comprises a first hardened material and an pre-transformed material, wherein the material of the first hardened material and the pre-transformed material substantially excludes a resin and a polymer that comprises repeating molecular units, which polymer and resin are organic; (b) an energy source generating an energy beam that melts at least a portion of the pre-transformed material; (c) a cooling member; and (d) a controller operatively coupled to the material dispenser, the energy beam, and the cooling member, and is programmed to: (i) direct the material dispenser to dispose a layer of pre-transformed material on the first hardened material; (ii) direct the energy beam to melt a portion of the layer of pre-transformed material and a portion of the first hardened material to form a molten portion and a remainder of the first hardened material; and (iii) direct the cooling member to harden the molten portion to form a second hardened material and plastically deform a region comprising (1) a portion of the second hardened material, and (2) a portion of the remainder of the first hardened material that is bordering the second hardened material, wherein the region comprises an exposed surface and an interior, which exposed surface ceases to plastically deform before the interior ceases to plastically deform, wherein the hardening forms at least a portion of the 3D object. The cooling member may be a heat-sink.

In another aspect, an apparatus for forming 3D object comprising a controller that is programmed to: (a) direct a material dispenser to dispose a layer of pre-transformed material on a first hardened material that is disposed in the material bed, wherein the material of the first hardened material and the pre-transformed material substantially excludes a resin and a polymer that comprises repeating molecular units, which polymer and resin are organic, wherein the controller is operatively coupled to the material dispenser; (b) direct an energy beam to melt a portion of the layer of pre-transformed material and a portion of the first hardened material to form a molten portion and a remainder of the first hardened material, wherein the controller is operatively coupled to the energy beam; and (c) direct a cooling member to harden the molten portion to form a second hardened material and plastically deform a region comprising (i) a portion of the second hardened material, and (ii) a portion of the remainder of the first hardened material that is bordering the second hardened material, wherein the region comprises an exposed surface and an interior, which exposed surface ceases to plastically deform before the interior ceases to plastically deform, wherein the hardening forms at least a portion of the 3D object, wherein the controller is operatively coupled to the cooling member.

The controller can be operatively coupled to a leveling member and can be programmed to direct the leveling member to level the exposed surface of the material bed. The controller can be operatively coupled to a material removal member and can be programmed to direct the material removal member to remove material from the material bed. The removal of the material from the material bed may result in a substantially planar exposed surface of the material bed. The removal may exclude contacting the exposed surface of the material bed.

In another aspect, an apparatus for forming 3D object comprises: (a) a material bed comprising a layer of pre-transformed material on a first hardened material, wherein the material of the first hardened material and the pre-transformed material substantially excludes a resin and a polymer that comprises repeating molecular units, which polymer and resin are organic; (b) an energy source generating an energy beam to melt a portion of the layer of pre-transformed material and a portion of the first hardened material to form a molten portion and a remainder of the first hardened material, wherein the energy beam is disposed adjacent to the material bed; and (c) a cooling member that hardens the molten portion to form a second hardened material and plastically deform a region comprising (i) a portion of the second hardened material, and (ii) a portion of the remainder of the first hardened material that is bordering the second hardened material, wherein the region comprises an exposed surface and an interior, which exposed surface ceases to plastically deform before the interior ceases to plastically deform, wherein the hardening forms at least a portion of the 3D object, wherein the cooling member is disposed adjacent to the material bed. The material bed can be disposed adjacent to a platform. The cooling member can be disposed above the material bed. Above can be in the direction away from the platform in a direction opposite to the gravitational field.

In another aspect, a 3D object formed by a 3D printing process comprises: one or more layer portions comprising successive solidified melt pools of a material, wherein the 3D object comprises a surface, an interior, and a grain structure, wherein the grain structure at a position closer to or at the surface is indicative of a greater solidification rate than the grain structure in the interior, wherein the material substantially excludes a resin and a polymer that comprises repeating molecular units, which polymer and resin are organic.

The material can be selected from the group consisting of elemental metal, metal alloy, ceramics, and an allotrope of elemental carbon. The material can be selected from the group consisting of elemental metal and metal alloy. The grain structure can be smaller at closer to the surface, as compared to the size of the grain structure in the interior. Solidification may comprise crystallization. The material can comprise an elemental metal or metal alloy. The grain structure can be a metallurgical structure.

In another aspect, a system for forming a 3D object comprises: (a) a material bed comprising pre-transformed material, wherein the material bed is formed of a material that substantially excludes a resin and a polymer that comprises repeating molecular units, which polymer and resin are organic; (b) an energy source generating an energy beam that transforms at least a portion of the material bed; and (c) a controller that is operatively coupled to the material bed and to the energy beam, and is programmed to: direct the energy beam to transform at least a portion of a material bed and form the 3D object comprising one or more layer portions having successive solidified melt pools of a material, wherein the 3D object comprises a surface, an interior, and a grain structure, wherein the grain structure at a position closer to or at the surface is indicative of a greater solidification rate than the grain structure in the interior.

In another aspect, an apparatus for forming a 3D object comprises: a controller that is programmed to: direct an energy beam to transform at least a portion of a material bed and form a 3D object comprising one or more layer portions having successive solidified melt pools of a material, wherein the 3D object comprises a surface, an interior, and a grain structure, wherein the grain structure at a position closer to or at the surface is indicative of a greater solidification rate than the grain structure in the interior, wherein the controller is operatively coupled to the material bed and to the energy beam, wherein the material bed is formed of a material that substantially excludes a resin and a polymer that comprises repeating molecular units, which polymer and resin are organic.

In another aspect, an apparatus for forming a 3D object comprises: (a) a material bed comprising pre-transformed material; and (b) an energy source generating an energy beam to transform at least a portion of the material bed and forms a 3D object comprising one or more layer portions having successive solidified melt pools of a material, wherein the 3D object comprises a surface, an interior, and a grain structure, wherein the grain structure at a position closer to or at the surface is indicative of a greater solidification rate than the grain structure in the interior, wherein the controller is operatively coupled to the material bed and to the energy beam, and wherein the energy beam is disposed adjacent to the material bed, wherein the pre-transformed material substantially excludes a resin and a polymer that comprises repeating molecular units, which polymer and resin are organic.

In another aspect, a 3D object formed by a 3D printing process comprises: one or more layer portions comprising successive solidified melt pools of a material, wherein the 3D object comprises a surface, an interior, and dendrites, wherein the dendrites at a position closer to or at the surface are indicative of a greater solidification rate than the dendrites in the interior, wherein the material substantially excludes a resin and a polymer that comprises repeating molecular units, which polymer and resin are organic.

The material can be selected from the group consisting of elemental metal, metal alloy, ceramics, and an allotrope of elemental carbon. The material can be selected from the group consisting of elemental metal and metal alloy. The spacing between the dendrites can be smaller at a position closer to or at the surface, as compared to the spacing of the dendrites in the interior. The overall size of the dendrites can be smaller at a position closer to or at the surface, as compared to the overall size of the dendrites in the interior. The material can comprise an elemental metal, metal alloy, ceramic, or an allotrope of elemental carbon. The material can comprise an elemental metal, metal alloy, ceramic, or an allotrope of elemental carbon. The 3D object can be devoid of an auxiliary support feature or auxiliary support feature mark that is indicative of a presence or removal of the auxiliary support feature.

In another aspect, a system for forming a 3D object comprises: (a) a material bed comprising pre-transformed material, wherein the material bed is formed of a material that substantially excludes a resin and a polymer that comprises repeating molecular units, which polymer and resin are organic; (b) an energy source generating an energy beam that transforms at least a portion of the material bed; and (c) a controller that is operatively coupled to the material bed and to the energy beam, and is programmed to: direct the energy beam to transform at least a portion of a material bed and form the 3D object comprising one or more layer portions having successive solidified melt pools of a material, wherein the 3D object comprises a surface, an interior, and dendrites, wherein the dendrites at a position closer to or at the surface are indicative of a greater solidification rate than the dendrites in the interior.

In another aspect, an apparatus for forming a 3D object comprises: a controller that is programmed to: direct an energy beam to transform at least a portion of a material bed and form a 3D object comprising one or more layer portions having successive solidified melt pools of a material, wherein the 3D object comprises a surface, an interior, and dendrites, wherein the dendrites at a position closer to or at the surface are indicative of a greater solidification rate than the dendrites in the interior, wherein the controller is operatively coupled to the material bed and to the energy beam, wherein the material bed is formed of a material that substantially excludes a resin and a polymer that comprises repeating molecular units, which polymer and resin are organic.

In another aspect, an apparatus for forming a 3D object comprises: (a) a material bed; and (b) an energy beam to transform at least a portion of the material bed and form a 3D object comprising one or more layer portions having successive solidified melt pools of a material, wherein the 3D object comprises a surface, an interior, and dendrites, wherein the dendrites at a position closer to or at the surface are indicative of a greater solidification rate than the dendrites in the interior, wherein the controller is operatively coupled to the material bed and to the energy beam, and wherein the energy beam is disposed adjacent to the material bed, wherein the pre-transformed material substantially excludes a resin and a polymer that comprises repeating molecular units, which polymer and resin are organic.

In another aspect, a method for forming a 3D object comprises: (a) generating a material bed comprising a first hardened material, which material bed is disposed adjacent to a platform in an enclosure, which first hardened material comprises a bottom surface facing towards the platform; (b) heating a portion of the first hardened material to form a heated portion; (c) melting a portion of the top of the heated portion to form a molten portion; and (d) hardening the molten portion to form a second hardened material that comprises a bottom surface facing towards the platform, wherein the bottom surface of the first hardened material has a first curvature that is of a higher a second curvature of the bottom surface of the second hardened material, wherein the bottom surface has a negative curvature when a volume bound from the bottom surface to the platform is a convex object, which bottom surface is disposed above the platform, wherein the first hardened material substantially excludes a resin and a polymer that comprises repeating molecular units, which polymer and resin are organic.

An exposed surface of the molten portion can be contained within and an exposed surface of the heated portion. An exposed surface of the molten portion can be smaller than an exposed surface of the heated portion. The heated portion may not comprise the rim of the layer of hardened material. The method may further comprise removing a portion of the molten portion. The removal of a portion of the molten portion may comprises ablating. The method may further comprise removing a portion of the heated portion. The ablating operation may comprise using an energy beam. The energy beam may comprise electromagnetic or charged particle radiation. The energy beam may comprise a laser beam. The pre-transformed material may be a powder material. The material bed may be a powder bed. The layer of hardened material may not be anchored to the platform. The layer of hardened material may not be anchored to the enclosure. The layer of hardened material may float anchorless in the material bed.

In another aspect, a system for forming a 3D object comprises: (a) a material bed disposed adjacent to a platform, which material bed comprising a first hardened material that comprises a bottom surface facing towards the platform; (b) a first energy source generating a first heat energy that heats at least a portion of the first hardened material; (c) a second energy source that generates a second energy beam that melts a portion of the heated portion to form a molten portion; (d) a cooling member; and (e) a controller operatively coupled to the material bed, the first heating energy, the second energy beam, and the cooling member, and is programmed to: (i) direct the first heat energy to heat at least a portion of the first hardened material to form a heated portion; (ii) direct the second energy beam to melt at least a portion of the heated portion to form a molten portion; and (iii) direct the cooling member to cool the molten portion to form a second hardened material that comprises a bottom surface facing towards the platform, wherein the bottom surface of the first hardened material has a first curvature that is higher than a second curvature of the bottom surface of the second hardened material, wherein the bottom surface has a negative curvature when a volume bound from the bottom surface to the platform is a convex object, which bottom surface is disposed above the platform, wherein the first hardened material substantially excludes a resin and a polymer that comprises repeating molecular units, which polymer and resin are organic.

The first energy source and the second energy source may be the same energy source. The first energy source and the second energy source may be different energy sources. The first heat energy may not transform the hardened material. The first heat energy can be a first energy beam. The first energy beam and the second energy beam can be the same energy beam. The first energy beam and the second energy beam can be different energy beams. The first heat energy can comprise a radiative heat source.

In another aspect, an apparatus for forming a 3D object comprises: a controller that is programmed to: (a) direct a material dispenser to dispense pre-transformed material to form a material bed disposed adjacent to a platform, which material bed comprises a first hardened material that comprises a bottom surface facing towards the platform; (b) directing a first heat energy to heat at least a portion of the first hardened material; (c) direct a second energy beam to melt a portion of the heated portion to form a molten portion; (d) direct the cooling member to cool the molten portion to form a second hardened material that comprises a bottom surface facing towards the platform, wherein the bottom surface of the first hardened material has a first curvature that is higher than a second curvature of the bottom surface of the second hardened material, wherein the bottom surface has a negative curvature when a volume bound from the bottom surface to the platform is a convex object, which bottom surface is disposed above the platform, wherein the first hardened material substantially excludes a resin and a polymer that comprises repeating molecular units, which polymer and resin are organic, wherein the controller is operatively coupled to the material dispenser, the first heat energy, the second energy beam, and the cooling member.

In another aspect, an apparatus for forming a 3D object comprises: (a) a material bed disposed adjacent to a platform, which material bed comprises a first hardened material that comprises a first bottom surface facing towards the platform; (b) a first energy source generating a first heat energy that heats at least a portion of the first hardened material, which first energy source is disposed adjacent to the material bed; (c) a second energy source generating a second energy beam that melts a portion of the heated portion to form a molten portion, which second energy source is disposed adjacent to the material bed; and (d) a cooling member that cools the molten portion to form a second hardened material that comprises a second bottom surface facing towards the platform, which cooling member is disposed adjacent to the material bed, wherein the first bottom surface has a first curvature that is higher than a second curvature of the second bottom surface, wherein the first bottom surface or second bottom surface has a negative curvature when a volume bound from the bottom surface to the platform is a convex object, which first bottom surface or second bottom surface is disposed above the platform, wherein the first hardened material substantially excludes a resin and a polymer that comprises repeating molecular units, which polymer and resin are organic.

The cooling member may be disposed above the exposed surface of the material bed. The cooling member may be movable to and away from a position above the molten portion.

In another aspect, a method for forming a 3D object comprises: (a) generating at least a portion of a 3D object from a material bed disposed on a platform within an enclosure; (b) cooling the material bed using a first cooling member disposed within the enclosure and above an exposed surface of the material bed; (c) moving the first cooling member; and (d) cooling the first cooling member using a second cooling member that is disposed outside of the enclosure, wherein above refers to a direction away from the platform.

The first cooling member can be disposed along the path of an energy beam that is used in the generating. The first cooling member can be disposed in an isolated atmosphere. The first cooling member and the material bed can be disposed in an isolated atmosphere. The second cooling member can be disposed in an ambient atmosphere. The cooling in operation (c) comprises contacting the first cooling member with the second cooling member. The contacting can be indirect contacting through a surface of the enclosure. The contacting can be direct contacting between the first cooling member and the second cooling member. The first cooling member can be passive. The second cooling member can be actively cooled. The second cooling member can comprise a heat exchanger. The material bed can be a powder bed. The powder can comprise elemental metal, metal alloy, ceramics, or an allotrope of elemental carbon. The first cooling member can be translatable. The second cooling member can be stationary. The method may further comprise translating the first cooling member to a position adjacent to the second cooling member.

The generating can comprise transforming the material within the material bed. The transforming can comprise melting or sintering. The method may further comprise attracting the first cooling member to the second cooling member. The attracting can comprise generating a force that attracts the first cooling member to the second cooling member. The force can comprise magnetic, hydraulic, or electric force. The first cooling member can be disposed adjacent to an exposed surface of the material bed. Adjacent can be above. Cooling of the material bed using the first cooling member can comprise removing at least about 30 percent of the heat in the material bed from an exposed surface of the material bed.

In another aspect, a system for forming a 3D object comprises: (a) an energy source generating an energy beam that transforms at least a portion of a material bed into a transformed material, which material bed comprises pre-transformed material and is disposed in an enclosure; (b) a first cooling member that (i) cools the material bed (ii) is translatable, and (iii) is disposed within the enclosure; (c) a second cooling member that cools the first cooling member, which second cooling member is not disposed in the enclosure; and (d) a controller that is operatively coupled to the energy source, the first cooling member, and the second cooling member, and is programmed to: (i) direct the energy beam to transform at least a portion of the material bed into a transformed material; (ii) direct the first cooling member to cool the material bed; and (iii) direct the second cooling member to cool the first cooling member.

The second cooling member can be disposed outside of the enclosure. The second cooling member can be part of a coating of the enclosure. The coating can be a wall or a rim. The first cooling member can be disposed adjacent to the material bed, wherein adjacent is above, wherein above is in the direction opposite to the platform.

In another aspect, an apparatus for forming a 3D object comprises: a controller that is programmed to: (a) direct an energy beam to transform at least a portion of a material bed into a transformed material; (b) direct a first cooling member that is translatable to cool the material bed; and (c) direct a second cooling member to cool the first cooling member, wherein the controller is operatively coupled to the energy beam, the first cooling member, and the second cooling member.

In another aspect, an apparatus for forming a 3D object comprises: (a) a material bed disposed in an enclosure; (b) an energy source generating an energy beam to transform at least a portion of a material bed into a transformed material; (c) a first cooling member that (i) cools the material bed, (ii) is movable, and (iii) is disposed in the enclosure; and (d) a second cooling member that cools the first cooling member and is not disposed in the enclosure.

In another aspect, a method for forming a 3D object comprises: using an energy beam to transform at least a portion of a material bed to form at least a portion of the 3D object; measuring one or more temperatures of one or more points on the at least a portion of the 3D object; and controlling the energy beam with at least one processor based on the measured temperatures, wherein the at least one processor comprises at least 3 Tera floating point operations per second, according to a benchmark.

Controlling the energy beam with a processor can be based (e.g., further based) on a geometry of the at least a portion of the 3D object. The benchmark can be a mathematical, graphical, or encryption benchmark. The processor can comprise parallel processing. The processor can comprise at least 8 billion transistors. The area of the at least one processor may be at most about 600 mm². The processor can comprise at least 1000 cores. The processor may have a memory bandwidth of at least 100 Giga bytes per second. The processor may have a memory clock speed of at least 5 Giga bits per second. Controlling can be based on (e.g., depend on) a control mechanism that excludes feedback from the structure of at least a portion of the generated 3D object. Controlling can be based on a control mechanism comprising taking into account a generic geometric section that is similar to a portion of the 3D object.

In another aspect, a system for forming a 3D object comprises: (a) an energy beam that transforms at least a portion of a material bed; (b) one or more sensors measuring temperatures of one or more points on the at least a portion of the 3D object; and (c) a controller comprising at least one processor, which controller is operative coupled to the energy beam and to the one or more sensors and is programmed to: (i) direct the energy beam to transform the at least a portion of the material bed to form the 3D object; (ii) direct the one or more sensors measure one or more temperatures of one or more points on at least a portion of the 3D object; and (iii) control the energy beam with the at least one processor based on the measured one or more temperatures, wherein the at least one processor comprises at least 3 Tera floating point operations per second, according to a benchmark.

In another aspect, an apparatus for forming a 3D object comprises: a controller that is programmed to (a) direct an energy beam to transform the at least a portion of the material bed to form the 3D object; (b) direct one or more sensors to measure one or more temperatures of one or more points on the at least a portion of the 3D object; and (c) control the energy beam with at least one processor based on the measured one or more temperatures, wherein the at least one processor comprises at least 3 Tera floating point operations per second, according to a benchmark.

In another aspect, an apparatus for forming a 3D object comprises: (a) an energy beam that transforms at least a portion of a material bed to form at least a portion of the 3D object; (b) one or more sensors that measure temperatures of one or more points on the at least a portion of the 3D object, which one or more sensors are disposed adjacent to the material bed; and (c) a controller comprising at least one processor that controls the energy beam based on the measured one or more temperatures, wherein the at least one processor comprises at least 3 Tera floating point operations per second, according to a benchmark, which controller is operatively coupled to the energy beam and to the one or more sensors. The control (e.g., regulate and/or direct) of the energy beam can be further based on (e.g., depend on) a geometry of the at least a portion of the 3D object. The control of the energy beam may be based on (e.g., further based on) a geometry of the at least a portion of the 3D object. A controller that is programmed to direct an energy beam along the path can comprise the at least one processor. The formation of the 3D object may comprise hardening the transformed material to form the 3D object.

Another aspect of the present disclosure provides a non-transitory computer-readable medium comprising machine-executable code that, upon execution by one or more computer processors, implements any of the methods above or elsewhere herein.

Another aspect of the present disclosure provides a computer system comprising one or more computer processors and a non-transitory computer-readable medium coupled thereto. The non-transitory computer-readable medium comprises machine-executable code that, upon execution by the one or more computer processors, implements any of the methods above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings or figures (also "FIG." and "FIGS." herein), of which:

FIG. 2 illustrates a schematic vertical cross section of layers of 3D objects;

FIGS. 4A-4F illustrate schematic vertical cross sections of 3D objects;

FIGS. 5A-5B illustrate schematic side views of systems and apparatuses for forming one or more 3D objects;

Figure 1A:
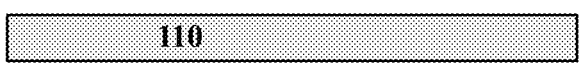
FIGS. 1A-1C illustrate schematic vertical cross sections of three-dimensional (3D) objects.

The figures and components therein may not be drawn to scale. Various components of the figures described herein may not be drawn to scale.

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein might be employed.

Terms such as "a," "an" and "the" are not intended to refer to only a singular entity, but include the general class of which a specific example may be used for illustration. The terminology herein is used to describe specific embodiments of the invention, but their usage does not delimit the invention. When ranges are mentioned, the ranges are meant to be inclusive, unless otherwise specified. For example, a range between value1 and value2 is meant to be inclusive and include value1 and value2. The inclusive range will span any value from about value1 to about value2.

The term "adjacent" or "adjacent to," as used herein, includes 'next to', 'adjoining', 'in contact with,' and 'in proximity to.' In some instances, adjacent to may be 'above' or 'below.'

The term "between" as used herein is meant to be inclusive unless otherwise specified. For example, between X and Y is understood herein to mean from X to Y.

The term "operatively coupled" or "operatively connected" refers to a first mechanism that is coupled (or connected) to a second mechanism to allow the intended operation of the second and/or first mechanism.

Three-dimensional printing (also "3D printing") generally refers to a process for generating a 3D object. For example, 3D printing may refer to sequential addition of material layer or joining of material layers (or parts of material layers) to form a 3D structure, in a controlled manner. The controlled manner may include automated and/or manual control. In the 3D printing process, the deposited material can be transformed (e.g., fused, sintered, melted, bound or otherwise connected) to subsequently harden and form at least a part of the 3D object. Fusing (e.g., sintering or melting) binding, or otherwise connecting the material is collectively referred to herein as transforming the material (e.g., powder material). Fusing the material may include melting or sintering the material. Binding can comprise chemical bonding. Chemical bonding can comprise covalent bonding. Examples of 3D printing include additive printing (e.g., layer by layer printing, or additive manufacturing). 3D printing may include layered manufacturing. 3D printing may include rapid prototyping. 3D printing may include solid freeform fabrication. 3D printing may include direct material deposition. The 3D printing may further comprise subtractive printing.

3D printing methodologies can comprise extrusion, wire, granular, laminated, light polymerization, or powder bed and inkjet head 3D printing. Extrusion 3D printing can comprise robo-casting, fused deposition modeling (FDM) or fused filament fabrication (FFF). Wire 3D printing can comprise electron beam freeform fabrication (EBF3). Granular 3D printing can comprise direct metal laser sintering (DMLS), electron beam melting (EBM), selective laser melting (SLM), selective heat sintering (SHS), or selective laser sintering (SLS). Powder bed and inkjet head 3D printing can comprise plaster-based 3D printing (PP). Laminated 3D printing can comprise laminated object manufacturing (LOM). Light polymerized 3D printing can comprise stereolithography (SLA), digital light processing (DLP), or laminated object manufacturing (LOM).

3D printing methodologies may differ from methods traditionally used in semiconductor device fabrication (e.g., vapor deposition, etching, annealing, masking, or molecular beam epitaxy). In some instances, 3D printing may further comprise one or more printing methodologies that are traditionally used in semiconductor device fabrication. 3D printing methodologies can differ from vapor deposition methods such as chemical vapor deposition, physical vapor deposition, or electrochemical deposition. In some instances, 3D printing may further include vapor deposition methods.

The methods, apparatuses, software, and systems of the present disclosure can be used to form 3D objects for various uses and applications. Such uses and applications include, without limitation, electronics, components of electronics (e.g., casings), machines, parts of machines, tools, implants, prosthetics, fashion items, clothing, shoes, or jewelry. The implants may be directed (e.g., integrated) to a hard, a soft tissue, or to a combination of hard and soft tissues. The implants may form adhesion with hard and/or soft tissue. The machines may include a motor or motor part. The machines may include a vehicle. The machines may comprise aerospace related machines. The machines may comprise airborne machines. The vehicle may include an airplane, drone, car, train, bicycle, boat, or shuttle (e.g., space shuttle). The machine may include a satellite or a missile. The uses and applications may include 3D objects relating to the industries and/or products listed herein.

The present disclosure provides systems, apparatuses, software and/or methods for 3D printing of a desired 3D object from a pre-transformed material (e.g., powder material). The 3D object can be pre-ordered, pre-designed, pre-modeled, or designed in real time (e.g., during the process of 3D printing).

Pre-transformed material as understood herein is a material before it has been transformed by an energy beam during the 3D printing process. The pre-transformed material may be a material that was, or was not, transformed prior to its use in the 3D printing process. The pre-transformed material may be a solid, semi-solid, or liquid (e.g., as disclosed herein). The pre-transformed material may be a particulate material (e.g., powder). The 3D printing method can be an additive method in which a first layer is printed, and thereafter a volume of a pre-transformed material is added to the first layer as separate sequential layer (or parts thereof). Each additional sequential layer (or part thereof) can be added to the previous layer by transforming (e.g., fusing) a fraction of the pre-transformed material to form a transformed material as part of the 3D object. The transformed material may subsequently harden to form at least a portion of the 3D object. The hardening can be actively induced (e.g., by cooling) or can occur without intervention (e.g., naturally).

The fundamental length scale (herein abbreviated as "FLS") of the printed 3D object can be at least about 50 micrometers (μm), 80 μm, 100 μm, 120 μm, 150 μm, 170 μm, 200 μm, 230 μm, 250 μm, 270 μm, 300 μm, 400 μm, 500 μm, 600 μm, 700 μm, 800 μm, 1 millimeter (mm), 1.5 mm, 2 mm, 5 mm, 1 centimeter (cm), 1.5 cm, 2 cm, 10 cm, 20 cm, 30 cm, 40 cm, 50 cm, 60 cm, 70 cm, 80 cm, 90 cm, 1 m, 2 m, 3 m, 4 m, 5 m, 10 m, 50 m, 80 m, or 100 m. The FLS of the printed 3D object can be at most about 1000 m, 500 m, 100 m, 80 m, 50 m, 10 m, 5 m, 4 m, 3 m, 2 m, 1 m, 90 cm, 80 cm, 60 cm, 50 cm, 40 cm, 30 cm, 20 cm, 10 cm, or 5 cm. In some cases, the FLS of the printed 3D object may be in between any of the afore-mentioned FLSs (e.g., from about 50 μm to about 1000 m, from about 120 μm to about 1000 m, from about 120 μm to about 10 m, from about 200 μm to about 1 m, or from about 150 μm to about 10 m). The fundamental length scale is the diameter, spherical equivalent diameter, diameter of a bounding circle, and/or the largest of: height, width and length.

In some embodiments, the transformed material subsequently hardens to forms a hardened 3D object (herein "3D object"). Harden may comprise solidify. Transform may comprise melt, sinter, adhere, attach, associate, join, affix, couple, unite, coalesce, consolidate, merge, unify, amalgamate, bind, merge, conjoin, consolidate, melt, unify, tack, or connect. Transform may comprise transform the physical state of at least a portion of the pre-transformed material (e.g., from solid to liquid). The apparatuses, systems, software and/or methods described herein may be utilized for the formation of a 3D object that is devoid of one or more auxiliary features. The apparatuses, systems, software, and/or methods described herein may be utilized for the formation of a 3D object that is suspended (e.g., floats anchorlessly) in the material bed, for example, during its formation. The apparatuses, systems, software, and/or methods described herein may be utilized for the formation of a 3D object that is suspended anchorlessly in the material bed during its entire generation process. The apparatuses, systems, software and/or methods described herein may reduce the deformation of one or more layers or parts thereof within the 3D object (e.g., upon its formation and/or after its formation). The deformation may comprise bending, warping, arching, curving, twisting, balling, cracking, dislocating, or any combination thereof.

The FLS (e.g., width, depth, and/or height) of the material bed can be at least about 50 millimeters (mm), 60 mm, 70 mm, 80 mm, 90 mm, 100 mm, 200 mm, 250 mm, 280 mm, 400 mm, 500 mm, 800 mm, 900 mm, 1 meter (m), 2 m or 5 m. The FLS (e.g., width, depth, and/or height) of the material bed can be at most about 50 millimeters (mm), 60 mm, 70 mm, 80 mm, 90 mm, 100 mm, 200 mm, 250 mm, 280 mm, 400 mm, 500 mm, 800 mm, 900 mm, 1 meter (m), 2 m or 5 m. The FLS of the material bed can be between any of the aforementioned values (e.g., from about 50 mm to about 5 m, from about 250 mm to about 500 mm, from about 280 mm to about 1 m).

In an aspect described herein are methods, systems, and/or apparatuses for generating a 3D object with a reduced degree of deformation (e.g., substantially non-deformed). The 3D object can be devoid of one or more auxiliary supports. The 3D object can be devoid of a mark indicating the prior presence of one or more auxiliary supports. The 3D object can be an extensive 3D object. The 3D object can be a large 3D object. The 3D object may comprise a large hanging structure (e.g., wire, ledge, or shelf). Large may be a 3D object having a fundamental length scale of at least about 1 centimeter (cm), 1.5 cm, 2 cm, 10 cm, 20 cm, 30 cm, 40 cm, 50 cm, 60 cm, 70 cm, 80 cm, 90 cm, 1 m, 2 m, 3 m, 4 m, 5 m, 10 m, 50 m, 80 m, or 100 m.

In some aspects, the methods may comprise depositing a pre-transformed material (e.g., adjacent to a platform), and transforming it to a transformed material. The deposited pre-transformed material may form a material bed. The material bed may be temperature controlled (e.g., heated and/or cooled). In some instances, the material bed may be heated to a temperature close to the transformation temperature of the pre-transformed material (e.g., powder) within the material bed. In some embodiments, at least a portion of the 3D object is heated. For example, the at least a portion of the 3D object may be heated prior to depositing a newly pre-transformed material on the at least a portion of the 3D object. The heating temperature may be to a temperature close to the melting temperature of the material. The heating temperature (e.g., of the material bed and/or of the at least a portion of the 3D object) may be to a temperature of at least about 100° C., 50° C., 10° C., or 5° C. lower (e.g., colder) than the melting point of the material. The transformed material may subsequently harden to form at least a portion of the generated 3D object. In some embodiments, the transformed material is the hardened material. The transformed material may form at least a portion of the generated 3D object. The 3D object may be formed from a pre-transformed material that underwent a transformation and subsequent hardening to form a hardened material that is at least a portion of the 3D object. The 3D object may be formed by successive addition of material that may form successive layers of hardened material.

Figure 1B:
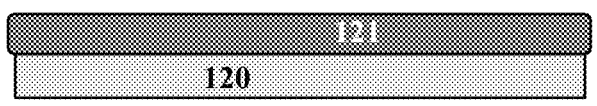
Figure 1C:
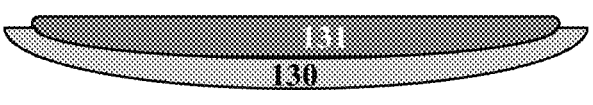

At times, the successive additions of a layer of hardened material connects to a previously formed one or more layers of hardened material (e.g., through transformation). At times, the successive additions of a layer of hardened material may comprise connecting it to an object (e.g., 3D object). The object may or may not be formed using a 3D printing methodology (e.g., as disclosed herein). The object may comprise a sheet of material (e.g., metal sheet). The connection to previously formed layers of hardened material (e.g., 3D plane) may cause the formed joined structure to deform. The deformation may arise when the formed structure lacks auxiliary support structure(s) during its formation. The deformation may arise, when the formed structure floats anchorlessly in the material bed during its formation. In some instances, deposition of a second layer of hardened material on a planar object (e.g., a bottom skin layer) reduces a radius of curvature of the joint structure that is being formed (e.g., cause the joint structure to warp). FIG. 2 shows various radius of curvature examples. Without wishing to be bound to theory, FIGS. 1A-1C show examples of various stages in the formation of a second layer on a 3D plane. An example of a 3D plane (e.g., a bottom skin layer) is shown in FIG. 1A, a second layer is then deposited on the 3D plane as shown in the example of FIG. 1B. As the second layer hardens (e.g., cooled down) the second layer may shrink, resulting in deformation of the formed joint structure (e.g., bilayer) as shown in the example of FIG. 1C. The first layer (e.g., shown in FIG. 1A) can be a 3D printed layer, a 3D plane, a layer generated by other methodologies, or any combination thereof. The first layer can be a naturally formed layer.

The 3D object may comprise a hanging structure. The hanging structure may be a plane like structure (referred to herein as "three-dimensional plane," or "3D plane"). A three-dimensional (3D) plane may have a relatively small width as opposed to a relatively large surface area. For example, the 3D plane may have a small height relative to a large horizontal plane. The 3D plane may be planar, curved, or assume an amorphous 3D shape. The 3D plane may be a strip, a blade, or a ledge. The 3D plane may comprise a curvature. The 3D plane may be curved. The 3D plane may be planar (e.g., flat). The 3D plane may have a shape of a curving scarf. The 3D object may comprise a wire.

In some embodiments, methods, systems, software and/or apparatuses described herein reduce the degree of deformation (e.g., as compared to conventionally used 3D printing methodologies). The degree of deformation may be reduced by using a first layer that comprises a negative radius of curvature (e.g., negative warping). Additionally, or separately, the degree of deformation may be reduced by using a first cooling member (such as a heat-sink or a cooling plate). In some embodiments, the cooling member (e.g., heat-sink) is situated adjacent (e.g., above) to the exposed layer of the material bed. FIG. 5A shows an example of a cooling member 513 situated above an exposed surface of the material bed 504. The cooling member can be introduced and/or pulled away from a position adjacent (e.g., above) the exposed surface of the material bed (e.g., during the 3D printing). The introduction and/or retrieval of the cooling member may be done in relatively short amount of time relative to the time-scale of the 3D printing. For example, relative to the time-scale of hardened layer formation and/or pre-transformed layer deposition. A second layer of trans-formed material can be formed on a first layer of hardened material. The first layer of hardened material may be suspended in the material bed (e.g., during the 3D printing). The first layer of hardened material may be devoid of one or more auxiliary supports. The cooling member may be introduced and retrieved adjacent to the material bed (e.g., during the formation of the second layer). In some embodiments, the amount of time at which the second layer is exposed to the cooling member correlates (e.g., equate) to a formation of (i) a cooled top surface of the second layer, and (ii) hot internal surface of the second layer.

Figure 6A:
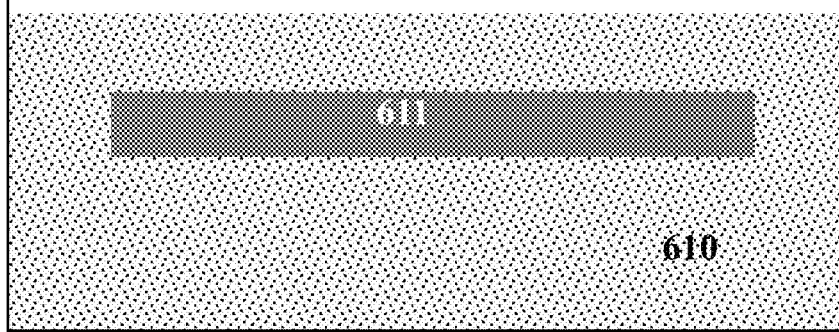
FIGS. 6A-6C illustrate schematic vertical cross sections of 3D objects.
Figure 6B:
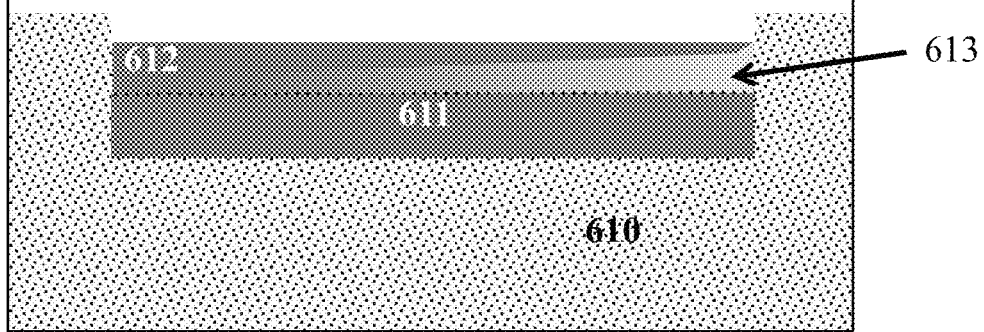
Figure 6C:
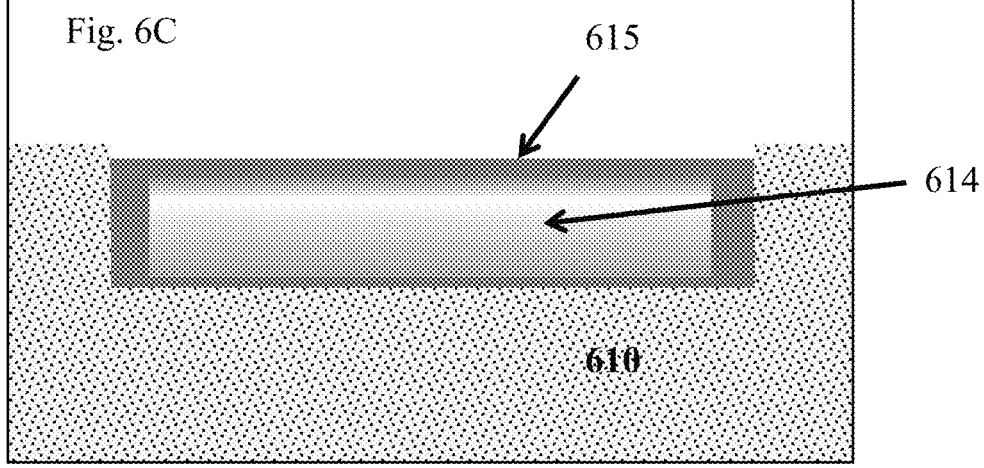

FIG. 6A shows an example of a first layer of hardened material 611 in a material bed 610. The layer of hardened material may be formed by a 3D printing methodology, and/or by other approaches. The layer of hardened material can be a sheet of material. FIG. 6B shows an example of a first layer of hardened material 611, and a second layer of transformed material that in the process of hardening (e.g., becoming a hardened material) 612, and section 613 designates a transformed material that is hardening (e.g., cooling) as represented by grayscale gradient of 613, wherein cold is represented by a darker gray shade, and hot by a lighter gray shade. In some examples, the amount of time at which the second layer is exposed to the cooling member correlates (e.g., equates) to a formation of a hardened top surface of the second layer, and at least some transformed material that did not harden at the internal surface of the second layer. The amount of time at which the second layer is exposed to the cooling member may correlate to a formation of trapped heat between the top (e.g., exposed) surface of the second layer and the bottom surface of the first layer. The amount of time at which the second layer is exposed to the cooling member may correlate to a formation of a trapped heat between the top (e.g., exposed) surface of the second layer and the top surface of the first layer. FIG. 6B shows an example of a region of trapped heat in 613. In some instances, a portion of the heat from the transformed material that forms the second layer is evacuated from above (e.g., using the cooling member), and another portion of the heat remains within the 3D object. The usage of the cooling member may form a relatively colder outer surface of the second layer, and a relatively hotter inner surface of the second layer. FIG. 6C shows an example of a region comprising a heat gradient 614 that is trapped within the 3D object that has cooled layer portions (e.g., 615). In the example shown in FIG. 6C, colder material is represented by a darker gray shade, and hotter material is represented by a lighter gray shade. The trapped heat region may extend to the bottom of the 3D object, or to a position above the bottom of the 3D object. The trapped heat region may comprise the bottom surface of the 3D object. The trapped heat region may comprise an internal region within the 3D object and substantially not extend to the bottom surface of the 3D object. In some embodiments, the bottom surface of the 3D object may be heated by at most about 50%, 40%, 30%, 20%, 10%, 5%, or 1% relative to the hottest region within the 3D object. The bottom surface of the 3D object may be heated by at least about 50%, 40%, 30%, 20%, 10%, 5%, 1% or 0.5% relative to the hottest region within the 3D object. The bottom surface of the 3D object may be heated by any value between the aforementioned values (e.g., from about 1% to about 50%, or from about 1% to about 20% relative to the hottest region within the 3D object). The formation of the 3D object comprising the heat gradient may prevent warping of the formed 3D object (e.g., bilayer).

In some embodiments, the first cooling member may be a passive cooling member (e.g., a slab comprising, for example, elemental metal or metal alloy). The passive first cooling member may be cooled by a second cooling member. The second cooling member may be an active cooling member. The active cooling member may include thermal conduction (e.g., using a liquid). The first cooling member may be disposed within the enclosure. The second cooling member may be disposed outside of the enclosure. FIGS. 5A and 5B show examples of a first cooling member and a second cooling member. FIG. 5A shows an example of a system and apparatuses (shown as a side view 500) where the first cooling member 513 resides above the material bed 504 in which a 3D object 506 is being formed with an energy beam 515. The first cooling member 513 is disposed within the enclosure 507, and the second cooling member 512 is not disposed within the enclosure 507. The second cooling member 512 is an active cooling member, for example, comprising one or more channels 517 (shown as a vertical cross section thereof). The channels 517 can be filled with at least one coolant that flows within the second cooling member 512 (e.g., and in the incoming hose 514 and outgoing hose 516). FIG. 5B shows an example of a system and apparatus (shown as a side view 520) where the first cooling member 533 contacts the second cooling member 532.

In some instances, the first layer (e.g., bottom skin) comprises a negative warping with respect to the platform (e.g., building platform) and/or the exposed surface of the material bed. Negative warping, as understood herein, comprises a convex structure relative to an exposed surface of a material bed and/or platform. FIG. 2 shows an example of layers that are positively warped (i.e., has a positive curvature), negatively warped (i.e., has a negative curvature), or non-warped (i.e., has substantially zero curvature), depicted as a vertical cross section. For example, layer number 6 of object 212 is negatively warped (i.e., has a negative curvature) with respect to the platform 218. In the layered structure 212, layer number 6 has a curvature that is negative, as the volume (e.g., area in a vertical cross section of the volume) bound from the bottom of it to the platform 218 is a convex object 219. Layer number 5 of 212 has a curvature that is negative. Layer number 6 of 212 has a curvature that is more negative (e.g., has a curvature of greater negative value) than layer number 5 of 212. Layer number 4 of 212 has a curvature that is (e.g., substantially) zero. For example, layer number 6 of object 214 is positively warped (i.e., has a positive curvature) with respect to the platform 218. Layer number 6 of 214 has a curvature that is positive. Layer number 6 of 212 has a curvature that is more negative than layer number 5 of 212, layer number 4 of 212, and layer number 6 of 214.

As understood herein, the radius of curvature, "r," of a curve at a point is a measure of the radius of the circular arc (e.g., FIG. 2, 216) which best approximates the curve at that point. The radius of curvature is the inverse of the curvature. In the case of a 3D curve (also herein a "space curve"), the radius of curvature is the length of the curvature vector. The curvature vector can comprise of a curvature (e.g., the inverse of the radius of curvature) having a particular direction. For example, the particular direction can be the direction towards the platform (e.g., designated herein as negative curvature), or away from the platform (e.g., designated herein as positive curvature). For example, the particular direction can be the direction towards the direction of the gravitational field (e.g., designated herein as negative curvature), or opposite to the direction of the gravitational field (e.g., designated herein as positive curvature). A curve (also herein a "curved line") can be an object similar to a line that is not required to be straight. A (straight) line can be a special case of curve wherein the curvature is substantially zero. A curve can be in two dimensions (e.g., vertical cross section of a plane), or in three dimension (e.g., curvature of a plane).

Figure 3A:
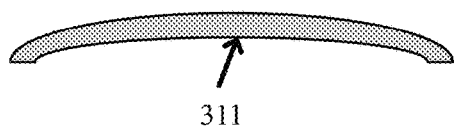
FIGS. 3A-3F illustrate schematic vertical cross sections of 3D objects.
Figure 3D:
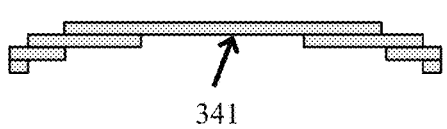
Figure 3B:
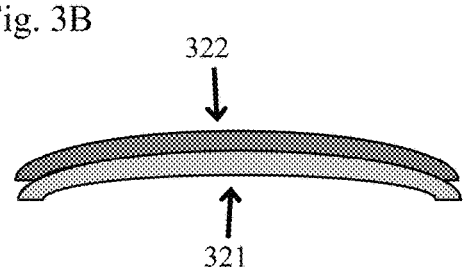
Figure 3E:
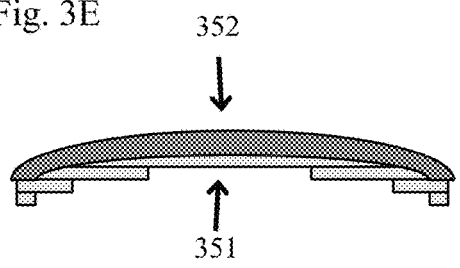
Figure 3C:
Figure 3F:
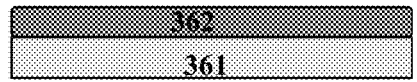

When a subsequent layer is deposited on the convex surface of the first layer, and is subsequently hardened, the convex surface may straighten. Without wishing to be bound to theory, the straightening may occur due to contraction of the second layer upon hardening (e.g., solidifying). The second layer may adhere to the first layer. The adhered second layer may shrink upon hardening (e.g., cooling and/or solidifying). The first layer comprising the negative warpage (i.e., negative curvature) may be generated as a single layer. The first layer may be a 3D plane that is negatively curved. The 3D plane may be formed by 3D printing. The 3D plane may be formed using other approaches. For example, the 3D plane may be a sheet of material. The 3D plane can be naturally found. Negatively warped layers and/or objects can be formed by various methods. Example for methods, software, systems and/or apparatuses for forming negatively warped layers and/or objects can be found in patent application number PCT/US16/34857 titled "THREE-DIMENSIONAL PRINTING AND THREE-DIMENSIONAL OBJECTS FORMED USING THE SAME" filed on May 27, 2016 that is entirely incorporated herein by reference. Without wishing to be bound to theory: FIG. 3A shows an example of a first negatively warped layer 311. FIG. 3B shows an example of a layer of transformed material 322 deposited on a negatively warped layer 321 before completely cooling layer 322. FIG. 3C shows an example of a hardened (e.g., cooled) layer of transformed material 332 deposited on a negatively warped layer that has been straightened 331 during the hardening (e.g., cooling) of the transformed material 322 into 332. The first layer comprising the negative warpage (e.g., negative curvature) may be generated from a plurality of sub-layers in a particular geometry, such that together they may form a hardened structure comprising an average negative radius of curvature of the hardened structure. FIG. 3D shows an example of a hardened structure 341 that is made of a plurality of sub layers and collectively comprises an average negatively curved layer (e.g., a structure having an average negative curvature). FIG. 3E shows an example of a layer of transformed material 352 that is deposited on a hardened structure formed of a multiplicity of sub layers 351 that collectively has an average negative curvature, wherein the layer 352 is not completely cooled. FIG. 3F shows an example of a hardened (e.g., cooled) layer of transformed material 362 deposited on a negatively warped layer that has been straightened 361 during the hardening (e.g., cooling) of the transformed material, which straightened layer comprises the plurality of layers from which it is composed (not shown).

Additionally, or separately, the degree of deformation may be reduced by using a semi adhered layer. In some examples, a 3D object comprises two layers (i.e., a first and second layer) of hardened material that are separated by a gap-layer. The first and second layer may be (e.g., substantially) planar (e.g., flat). At times, at least one of the two layers may have a large radius of curvature (e.g., a radius of curvature of at least about 20 cm, 30 cm, 40 cm, 50 cm, 80 cm, or 100 cm). The radius of curvature may be any radius of curvature disclosed herein. The first and second layers may be devoid of one or more auxiliary supports (e.g., anchors) during the 3D printing. In some embodiments, the gap-layer has a smaller height relative to the first and/or second layer. In some embodiments, the gap-layer has a larger height relative to the first and/or second layer. The gap-layer may be less dense (e.g., sparser) than the first layer of hardened material and the second layer of hardened material. The gap-layer may comprise non-transformed material. For example, the gap-layer may comprise particulate material (e.g., powder). FIG. 4A shows an example of a layer of hardened material 411 on which a layer of pre-transformed (e.g., powder) material 413 is disposed. FIG. 4B shows an example of a first layer 421, a second layer 422, and a gap-layer 423 that comprises pre-transformed material. The gap-layer may comprise a multiplicity of gap-layers. The gap-layers within the multiplicity of gap layers may be of the same kind of gap-layer, or of different kinds of gap-layer (e.g., as disclosed herein). The gap-layer may be subsequently transformed. In some embodiments, the gap layer can be lightly sintered. FIG. 4C shows an example of a gap-layer that is (e.g., lightly) sintered in 433, where the layers 431 and 432 represent layers of hardened material. The transformation can include transforming (e.g., melting) the particular material within the gap-layer at one or more positions to form respective one or more connections between the two layers of hardened material. The one or more connections can comprise pillars or clumps. The one or more connections can be generated prior to, during, or subsequent to, forming a lightly sintered structure. The one or more connections can be generated without forming a lightly sintered structure. The one or more positions (e.g., where the connections are formed) can be distributed along the gap-layer to entrap the particulate material. The one or more positions can be sequentially situated and gradually connect the first and second layer, for example, similar to closing of a zipper. FIG. 4D shows and example of two layers of hardened material 441 and 442 that are separated by a gap that comprises pre-transformed and/or sintered material (e.g., porous hardened material) and sections transformed material (e.g., 443) that are distributed within the gap and connect the first hardened layer 441 to the second hardened layer 442. FIG. 4D shows an example of a gap-layer having connections 443. The gap-layer can be annealed (e.g., during and/or after the 3D printing). The gap-layer can form a continuous or a discontinuous layer of transformed material to connect the first and second layer of hardened material (e.g., 441 and 442). FIG. 4E shows and example of two layers of hardened material 451 and 452 that are separated by a gap that comprises pre-transformed material (e.g., powder) 453 that is being transformed and optionally hardened (e.g., 454) within the gap. The various gradients of gray in 454 represent different temperatures, wherein a darker shade represents a material of a cooler temperature, and a lighter shade represents material of a hotter temperature. FIG. 4F shows an example of a gap-layer with a transformed and optionally hardened layer of material 463. FIG. 4F shows and example of two layers of hardened material 461 and 462 that are separated by a gap that comprises transformed and optionally hardened material (e.g., 463).

Figure 7:
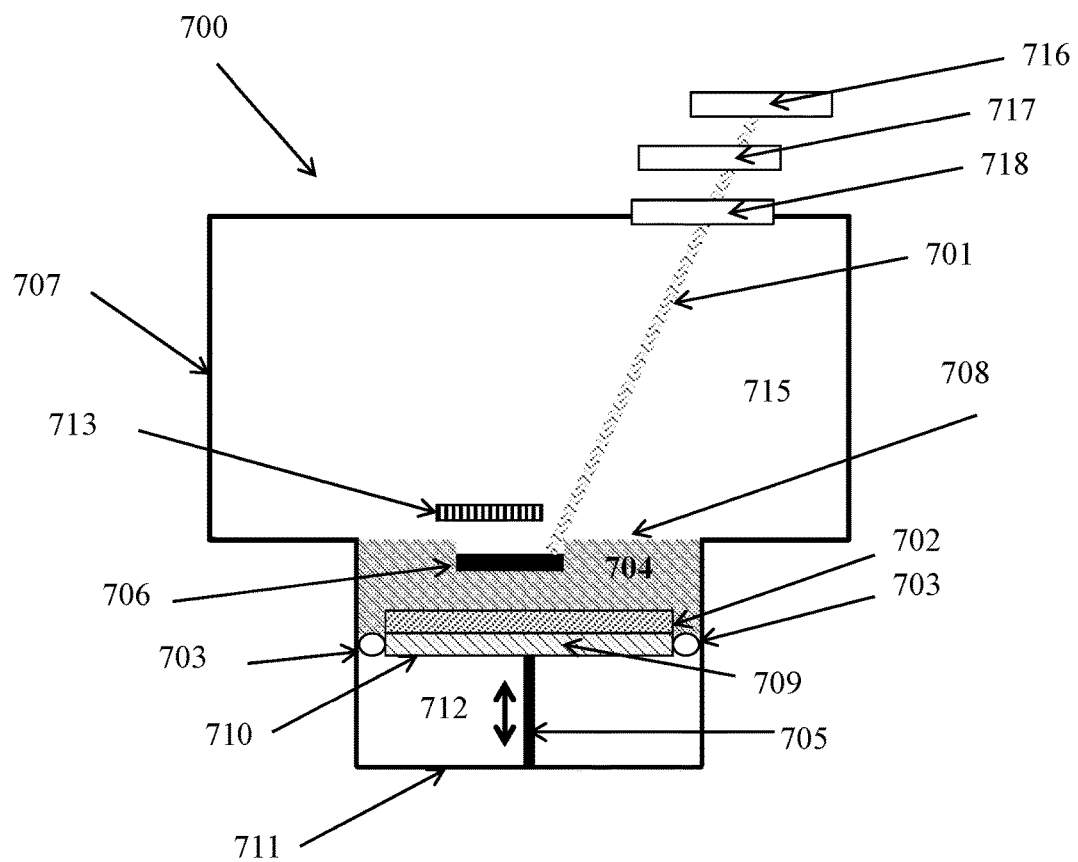
FIG. 7 illustrates a schematic side view of a system and apparatuses for forming one or more 3D objects.

In some instances, the pre-transformed material (e.g., in the material bed) may be transformed via heat. The heat can be generated by at least one energy beam, an overlapping array or energy beams (e.g., LED array or laser array), a lamp, a radiator, any radiative heat source, or any combination thereof. FIG. 7 shows an example of a system and apparatus(es) 700 (shown as a side view) comprising an energy beam 701 that transforms a portion of the material bed 704 into a 3D object 706. In this example, the 3D object is floating anchorlessly (i.e., is suspended) within the material bed 704. FIG. 7 shows an example of a heat sink 713 disposed above the material bed, which material bed is disposed on a building platform comprising a base 702 and a substrate 709 that is connected to a vertical actuator 712 (e.g., elevator). FIG. 7 shows an example of sealants 703 that prevent the pre-transformed material from spilling from the material bed 704 to the bottom 711 of the enclosure 707, wherein an interior 715 of the enclosure has an atmosphere comprising a gas. In some embodiments, the enclosure incorporates a cooling member (e.g., 713) that can be translatable (e.g., during the 3D printing). The sealants (e.g., seals) can comprise O-rings, rubber seals, metal seals, load-locks, or bellows on a piston.

Figure 11:
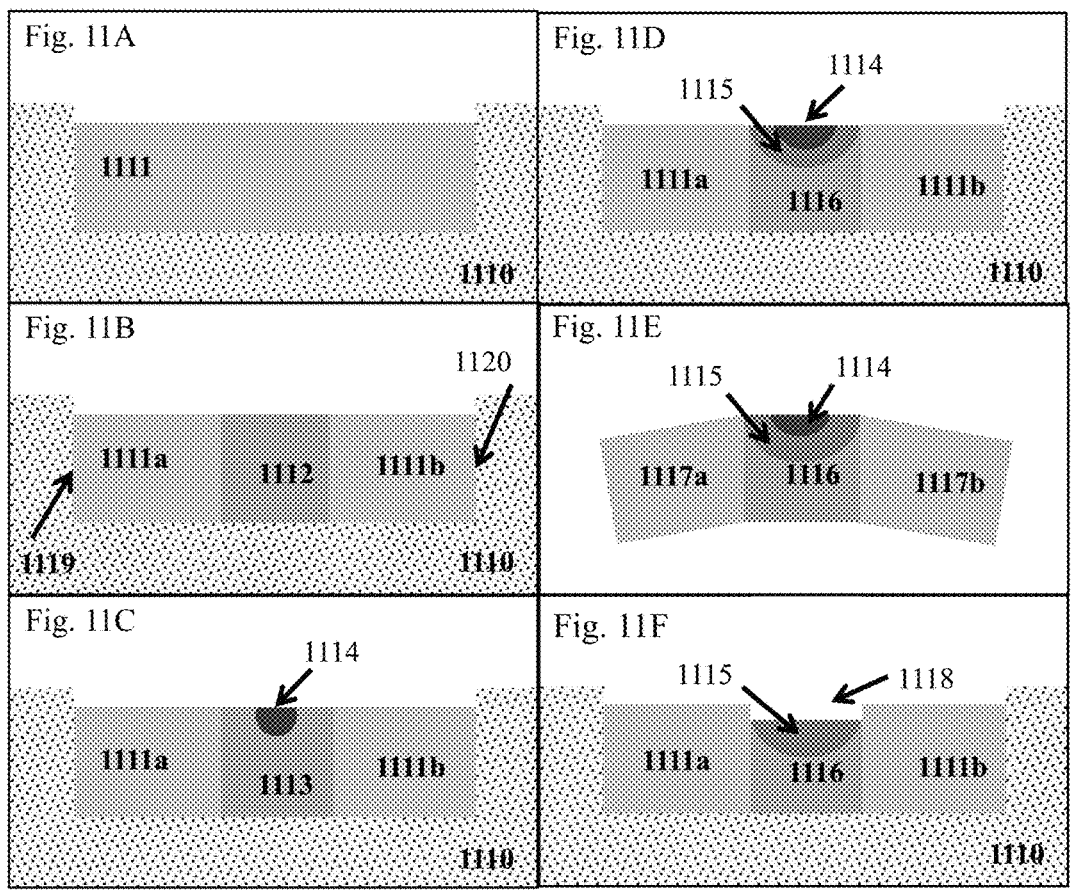
FIGS. 11A-11F illustrate schematic vertical cross sections of 3D objects.

In some embodiments, negative warping is formed by deep area heating (e.g., FIG. 11F) of a 3D object without melting. FIGS. 11A-11E show examples of various stages in forming a negatively warped object (e.g., object with negative curvature) using a deep area heating methodology depicted as a vertical cross section. In this methodology, a portion of a layer of hardened material (e.g., FIG. 11A, 1111) may be heated to form a heated portion (e.g., FIG. 11B, 1112) and one or more non-heated portions (e.g., FIG. 11B, 1111a and 1111b). In the examples shown in FIGS. 11A-F, a darker shade presents a hotter area, and a brighter shade represents a cooler area. The heated portion may not border the rim of the layer of hardened material. For example, the heated portion may be in the center of the to-be-bent layer of hardened material. The heated portion may expand (e.g., during the heating). Consequently, the expanded heated portion may compress the colder portions (e.g., 1111a and 1111b). Without wishing to be bound to theory, the heated portion may be subject to tensile stress. The top (e.g., closer to the exposed surface) of the heated portion may be transformed (e.g., molten) (e.g., FIG. 11C, 1114). The height of the molten portion may be at least about 1%, 5%, 10%, 15%, 20%, 25%, or 30% of the total height of the layer of hardened material. The height of the molten portion may be at most about 1%, 5%, 10%, 15%, 20%, 25%, or 30% of the total height of the layer of hardened material. The height of the molten portion may be any value between the above-mentioned values with respect to the total height of the layer of hardened material (e.g., from about 1% to about 30%, from about 10% to about 20%, or from about 5% to about 25%). The transformed (e.g., molten) portion may further expand (e.g., more than the expansion of the heated portion). Without wishing to be bound to theory, the further expansion may exert contractile stress on the previously heated portion of the layer. The heated portion (e.g., FIG. 11C, 1113) may comprise a sub-portion that is subject to contractile stress (e.g., FIG. 11D, 1115). This method may form a portion of the 3D object in which the stress profile (e.g., gradient) comprises relatively more contractile stress at its top (towards the exposed surface) than at its bottom (away from the exposed surface). The bottom of the portion may be therefore subject to a tensile stress. Consequently, the heated area (e.g., FIG. 11D, 1114-1116) may force the two sides of the heated area (e.g., FIG. 11D, 1111a and 1111b) to bend towards the platform and form bent areas (e.g., FIG. 11E, 1117a and 1117b). Thus, the layer of hardened material may form a negatively warped structure upon cooling (e.g., depicted in FIG. 11E). FIG. 11E 1114-1116 correlate to FIG. 11D 1114-1116 respectively. The layer of hardened material may form a 3D object that is susceptible to the desired negatively warped deformation (e.g., FIG. 11E). In some embodiments, the transformed top layer 1114 may be removed (e.g., ablated) at least in part (e.g., entirely). When the transformed top layer is removed, the tensile-contractive stress gradient is enhanced. FIG. 11F shows an example where the transformed layer is removed (e.g., 1118). FIG. 11F 1115-1116 correlate to FIG. 11D 1115-1116 respectively.

The bottom of the portion of the layer of hardened material may be directed away from the exposed surface of the hardened material, and/or towards the platform. The bottom of the portion of the layer of hardened material may be the surface of the hardened material directed away from the exposed surface of the hardened material, and/or towards the platform. The top of the portion of the layer of hardened material maybe be directed towards, or be, the exposed surface of the hardened material.

The heated portion (e.g., 1112) and/or the transformed (e.g., molten) portion (e.g., 1114) may be formed by an energy beam. The energy beam may travel along a path. The path may be a predetermined path. The path may be predetermined by the controller. In some embodiments, the controller regulates and/or directs the energy beam (e.g., the path of the energy beam) directly and/or through one or more apparatuses. For example, the controller may direct a scanner that directs the energy beam along at least one path.

Control may comprise regulate, manipulate, restrict, direct, monitor, adjust, or manage.

Figure 15:
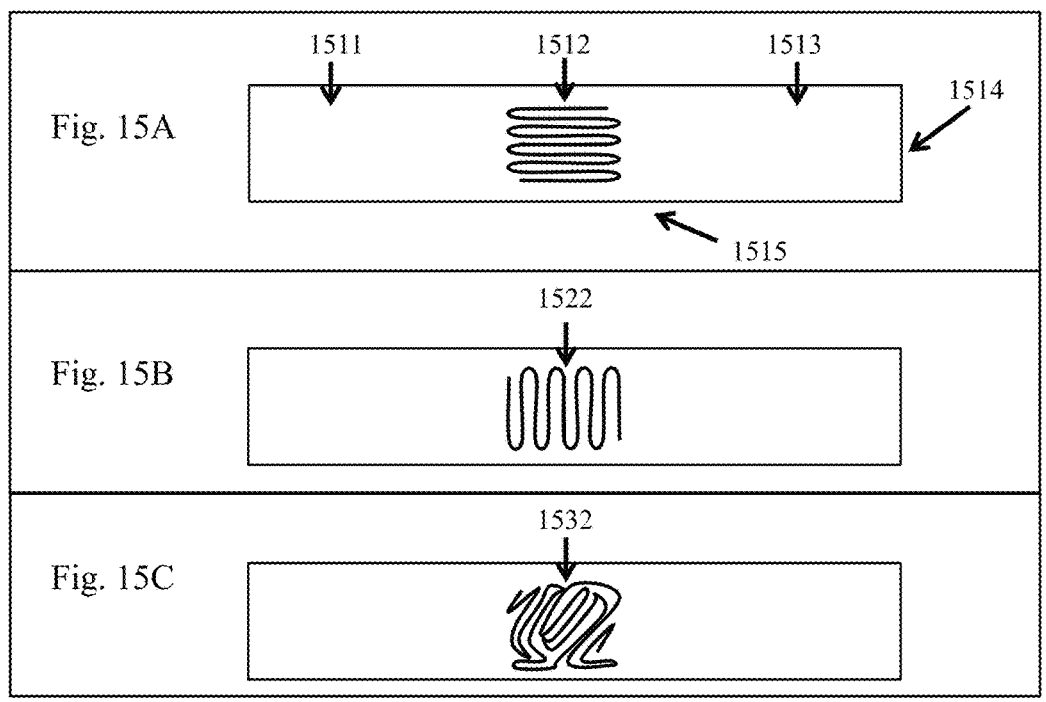
FIGS. 15A-15C schematically illustrate a horizontal view of 3D objects.

The 3D object to be melted may have a rectangular cross section (e.g., vertical and/or horizontal). The rectangle can be square or non-square (e.g., oblong). The rectangle can have an aspect ratio of width to length (W:L) of at least about 1:1, 1:2, 1:3, 1:4, 1:5, 1:8, 1:10, 1:50, or 1:100. The rectangle can have an aspect ratio of width to length (W:L) of at most about 1:2, 1:3, 1:4, 1:5, 1:8, 1:10, 1:50, or 1:100. The rectangle can have an aspect ratio of width to length (W:L) between any of the afore mentioned values (e.g., from about 1:1 to about 1:100, from about 1:1 to about 1:10, or from about 1:2 to about 1:50). The rectangular cross section may have a long side (e.g., FIG. 15A, 1515) and a short side (e.g., FIG. 15A, 1514). The path may substantially travel along, perpendicular, or at an angle relative to the long side of the rectangular cross section. FIG. 15A shows an example of a rectangular cross section of a 3D object, a portion of which is heated by an energy beam that travels along a path 1512 which may be substantially aligned parallel to the long side (e.g., the hatching area is in the direction parallel to the long side). FIG. 15B shows an example of a rectangular cross section of a 3D object, a portion of which is heated by an energy beam that travels along a path 1522 which is substantially aligned parallel to the short side (e.g., the hatching area is in the direction parallel to the short side). The path (e.g., hatching) may be a connected path or a disconnected path (e.g., comprises disconnected path sections). The path may comprise parallel section, non-parallel sections, angular sections, curved sections, or irregular sections. FIG. 15C shows an example of a path 1532 that comprises irregular sections. In some embodiments, as the energy beam travels along the path in a position distant from one of the edges of a layer, the edge may deform (e.g., wrap upwards or wrap downwards). The position distant from one of the edges (e.g., 1511 or 1512) may be the center of the layer (e.g., where the energy beam travels along the path 1512). In some embodiments, depending on the path direction, the position distant from one of the edges of a layer may deform at a certain position (e.g., wrap upwards or wrap downwards).

Figure 16:
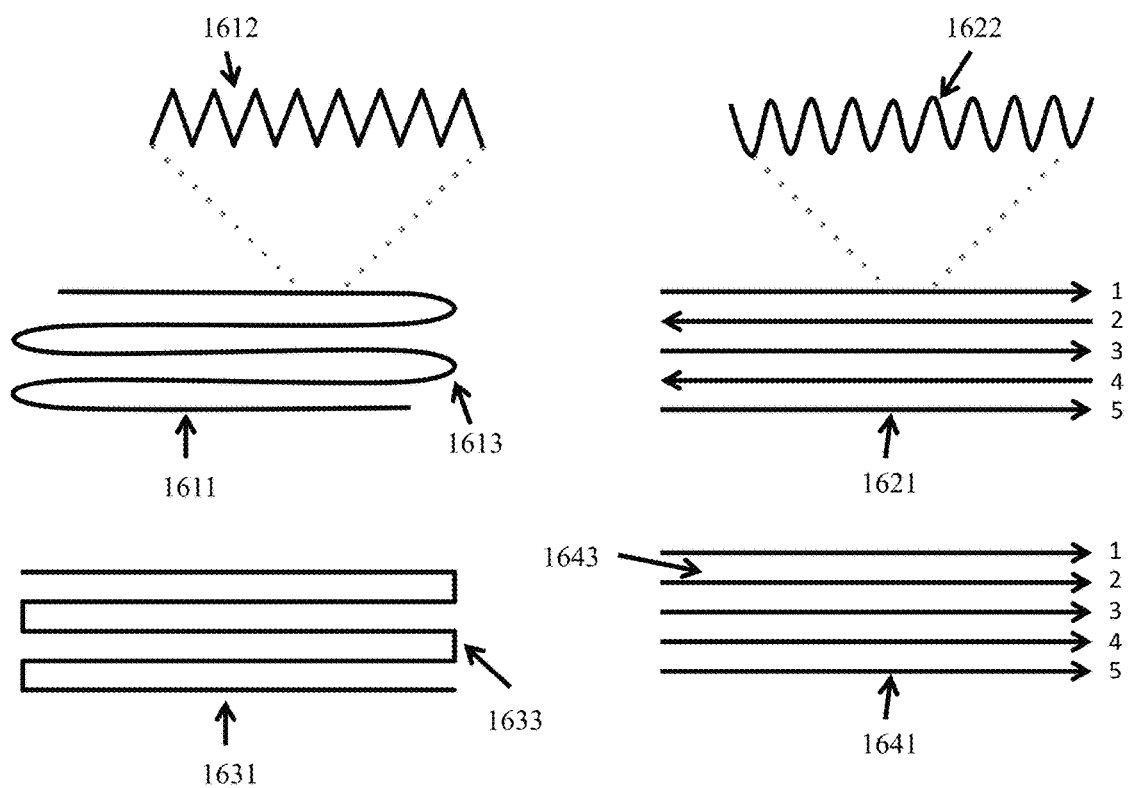
FIG. 16 schematically illustrates various paths.

The path of the energy beam may comprise a raster, a vector, or any combination thereof. For example, the path of the energy beam (e.g., the first path) may be a vector. The path of the energy beam may be oscillating. For example, the path of the energy beam may comprise a zigzag, wave (e.g., curved, triangular, or square), or curved pattern. The curved wave may be a sine or cosine wave. The path of the energy beam may comprise a sub-pattern. The sub-pattern may have any of the energy beam patterns disclosed herein. FIG. 16 shows an example of a path 1611 of an energy beam comprising a zigzag sub-pattern (e.g., 1612 shown as an enlargement of a portion of the path 1611). FIG. 16 shows an example of a path 1621 of an energy beam comprising a curved sub-pattern 1622. The sub-path may form the path of the energy beam. The sub-path may be a small path that forms the large path. The amplitude of the sub-path may be smaller than the amplitude and/or scale of the energy beam path. The sub-path may be a component of the energy beam path. The path that the energy beam follows may be a predetermined path. The path that the energy beam follows may be connected or disconnected. For example, FIG. 1611 shows a connected path. For example, FIG. 16, 1621 shows a disconnected path. The connected path can be connected with curved connectors or non-curved connectors. In some examples, the entire path may be substantially non-curved. In some instances, the entire path may be substantially curved. FIG. 16 shows an example of a connected path 1611 with curved connectors (e.g., 1613). Each of the vectorial path sections may be formed of a sub path (e.g., zigzag or curved). The non-curved connectors can form a right angle, or another angle. The non-curved connected paths may form a rectangular connected path. FIG. 16 shows an example of a connected path 1631 with non-curved (e.g., right angled) connectors (e.g., 1633). The non-connected path may comprise of vectorial path sections. At least two of the vector path sections may be pointed in the same direction. FIG. 16 shows an example of non-connected path 1641 that comprises vector path sections numbered 1 to 5, all of which point to the same direction. FIG. 16 shows an example of non-connected path 1621 that comprises vector path sections numbered 1 to 5, of which at least vector sections 1 and 2 point to different directions. A 3D model and/or algorithm may predetermine the path. The 3D model may be predetermined (e.g., by a processor, by an individual, by a computer, by a computer program, by a drawing, by a statute, or by any combination thereof).

The path can comprise successive lines (e.g., vector path sections). The successive lines may touch each other. The successive lines may overlap each other in at least one point. The successive path lines may substantially overlap each other. The successive lines may be spaced by a first distance (e.g., hatch spacing). FIG. 16 shows an example of a hatch spacing 1643. The first distance may vary depending on the position of the generated hardened material within the 3D object. The hatch spacing (i.e., distance between disconnected sections of the path) may be at least 500 micrometers (μm), 400 μm, 300 μm, 200 μm, 100 μm, 90 μm, 80 μm, 70 μm, 60 μm, 50 μm, 40 μm, 30 μm, 20 μm, 10 μm, 5 μm, or 1 μm. The hatch spacing may be at most 500 micrometers (μm), 400 μm, 300 μm, 200 μm, 100 μm, 90 μm, 80 μm, 70 μm, 60 μm, 50 μm, 40 μm, 30 μm, 20 μm, 10 μm, 5 μm, or 1 μm. The hatch spacing may be any value between the afore-mentioned first distance values (e.g., from 500 μm to 1 μm, from 100 μm to 20 μm, from 60 μm to 5 μm). In some examples, an angle between successive path lines is varied.

Figure 8:
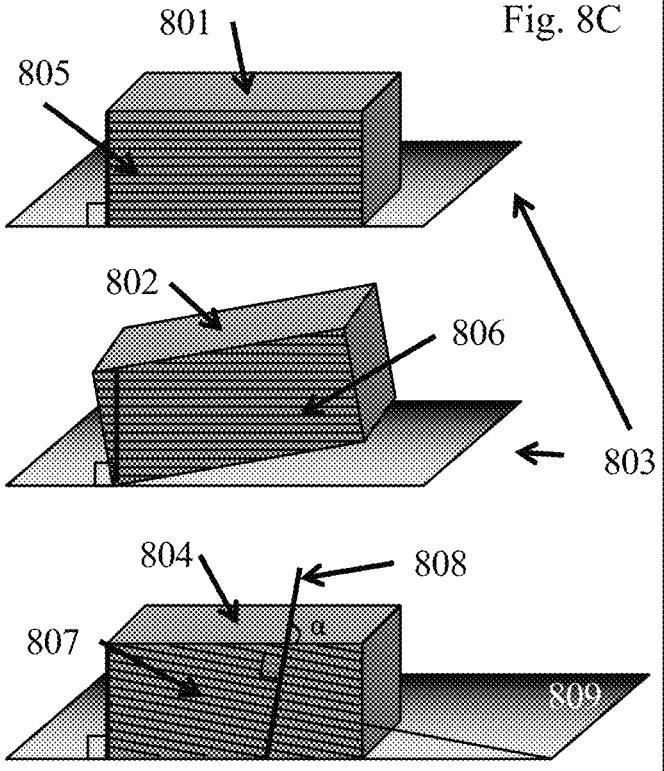
FIGS. 8A-8C illustrates various 3D objects and schemes thereof.

In some instances, the direction of the energy beam path (e.g., direction of the hatching) determines the curvature of the 3D object, the bottom surface of the 3D object, and/or the top surface of the 3D object. In some instances, the direction of the energy beam path determines the curvature of the 3D object. The curvature of the 3D object may comprise the bottom surface of the 3D object, and/or the top surface of the 3D object. The direction of the energy beam path may be the direction of the hatchings. The degree and/or direction of curvature of the 3D object may be influenced by one or more characteristics of the material forming the 3D object. The one or more characteristics of the material may comprise the transformation (e.g., melting) temperature or the elastic (e.g., Young's) modulus. The degree and/or direction of curvature of the 3D object may be influenced by the size of the melt pools formed by the energy beam. FIG. 8A shows an example of successive melt pools in a 3D object. The degree and/or direction of curvature (e.g., positive, substantially zero, or negative) of the 3D object may be influenced by the depth of heat penetration (e.g., of the energy beam) into the 3D object (e.g., depth of 1114 in FIG. 11C). The degree and/or direction of curvature of the 3D object may be influenced by the direction of the path portions with respect to the direction of the greater path.

In another aspect a method for forming a 3D object comprises: providing a negatively warped layer of hardened material disposed in a material bed and transforming at least a portion of the material bed into a transformed material that is coupled (e.g., attaches) to the negatively warped layer. The transformed material may form a hardened material as part of the 3D object. For example, the transformed material may subsequently harden into a hardened material as part of the 3D object.

In another aspect a method for forming a 3D object comprises: providing a first structure having a bottom surface with a first curvature that is negative, which structure comprises a hardened (e.g., solid) material and is disposed in a material bed adjacent to a platform; and transforming at least a portion of the material bed (e.g., powder bed) into a transformed material that is coupled to the top of the first structure to form a second structure (that includes both the transformed material and the first structure), which transformed material hardens (e.g., solidifies) into a hardened (e.g., solid) material as part of the 3D object, wherein a bottom surface of the second structure has a second curvature that is greater than the first curvature, wherein the first curvature is negative when a volume bound from the bottom surface to the platform is a convex object, which bottom surface is disposed above the platform, wherein bottom faces the platform, wherein top faces away from the platform.

In some embodiments, the curvature of all the layers within the 3D object is from at most about 0.02 millimeters$^{-1}$ (i.e., 1/millimeters). In some embodiments, the layers within the 3D object are (e.g., substantially) planar (e.g., flat). The curvature can be at most about $-0.05$ mm$^{-1}$, $-0.04$ mm$^{-1}$, $-0.02$ mm$^{-1}$, $-0.01$ mm$^{-1}$, $-0.005$ mm$^{-1}$, $-0.001$ mm$^{-1}$, substantially zero mm$^{-1}$, $0.001$ mm$^{-1}$, $0.005$ mm$^{-1}$, $0.01$ mm$^{-1}$, $0.02$ mm$^{-1}$, $0.04$ mm$^{-1}$, or $0.05$ mm$^{-1}$. The curvature can be any value between the aforementioned curvature values (e.g., from about $-0.05$ mm$^{-1}$ to about $0.05$ mm$^{-1}$, from about $-0.02$ mm$^{-1}$ to about $0.005$ mm$^{-1}$, from about $-0.05$ mm$^{-1}$ to substantially zero, or from about substantially zero to about $0.05$ mm$^{-1}$). The curvature may refer to the (e.g., average or mean) curvature of a surface. The surface can be of the layer of hardened material (e.g., first layer). The surface may be of the 3D object (or any layer thereof).

In another aspect, a method for forming a 3D object comprises: forming a first layer of hardened material in a material bed comprising pre-transformed material; disposing an upper layer of pre-transformed material on the first layer of hardened material; and generating a second layer of hardened material from at least a portion of the upper layer of pre-transformed material, wherein the first layer of hardened material is separated from the second layer of hardened material by a gap, wherein the gap comprises a material that is less dense than the first layer of hardened material and the second layer of hardened material. The less dense material can comprise pre-transformed material (e.g., powder). For example, the less dense material can comprise a powder or a sintered powder (e.g., lightly sintered powder). (e.g., see FIGS. 4A-4F)

The platform may comprise a base, substrate, or a bottom of the enclosure. The platform may be a building platform. The platform may be adjacent to (e.g., above) where the 3D object is generated. Above may be in a direction opposing the direction of the field of gravity. Above may be in a direction opposite to the building platform. In some embodiments, the method may further comprise after the operation of disposing an upper layer of pre-transformed material and before the operation of generating a second layer of hardened material from at least a portion of the upper layer, disposing a leveled (e.g., planar) layer of pre-transformed material on the first layer of hardened material. The gap may comprise portions of hardened material and portions that include pre-transformed material and/or sintered powder material. At least some of the portions (e.g., all of the portions) may be distributed (e.g., evenly) across the gap. At least some of the portions (e.g., all of the portions) may be concentration (e.g., evenly) within the gap (e.g., to the first and/or second layer of hardened material). The method disclosed herein may further comprise transforming the material within the gap to form a transformed material as part of the 3D object. The transformed material may subsequently harden into a hardened material as part of the 3D object. (e.g., see FIG. 4F)

In another aspect, a method for forming a 3D object comprises: forming a first layer of material in a material bed comprising pre-transformed material, which first layer of material comprises a hardened material; disposing an upper layer of pre-transformed material on the first layer of material; generating a second layer of material comprising transformed material from at least a portion of the upper layer of pre-transformed material; and cooling the second layer of material such that the top surface of the second layer of material is colder than its bottom surface. The top surface of the second layer can be an exposed surface. The bottom surface of the second layer may contact the first layer of material. In some embodiments, the transformed material subsequently hardens. In some embodiments, the transformed material comprises hardened material.

In another aspect, a method for forming a 3D object comprises: forming a hardened material in a material bed comprising pre-transformed material; disposing a layer of pre-transformed material on the hardened material; transforming (e.g., melting) a portion of the layer to form a transformed (e.g., molten) portion; hardening the exposed surface of the transformed portion while the interior of the transformed portion remains transformed (e.g., non-hardened. E.g., molten); and hardening (e.g., solidifying) the transformed portion to form at least a portion of the 3D object.

In the operation of hardening the transformed portion, the method may further comprise cooling the molten portion for the hardening. The method may reduce or preserve a curvature (e.g., value of the curvature) of at least one surface (e.g., all surfaces) of the 3D object. The method may reduce or preserve a curvature of at least one layer (e.g., all layers) of the 3D object. The method may reduce the curvature of at least one layer of the 3D object such that it may comprise a positive curvature, negative curvature, or substantially zero curvature. The method may reduce the curvature of at least one surface of the 3D object such that it may comprise a positive curvature, negative curvature, or substantially zero curvature.

In another aspect, a method for forming a 3D object comprises: forming a first (layer of) hardened material in a material bed comprising pre-transformed material; disposing a layer of pre-transformed material on the first hardened material; transforming (e.g., melting) a portion of the layer of pre-transformed material and a portion of the first (layer of) hardened material to form a transformed portion and a remainder (e.g., of the first hardened material); and hardening the transformed portion to form a second hardened material; and plastically deforming a region comprising (i) a portion of the second hardened material, and (ii) a portion of the remainder of the first (layer of) hardened material that is bordering the second hardened material, wherein the region comprises an exposed surface and an interior, which exposed surface ceases to plastically deform before the interior ceases to plastically deform, wherein the hardening forms at least a portion of the 3D object. (See FIGS. 11A-11F)

The transforming (e.g., melting) may be transforming together a portion of the layer of pre-transformed material and a portion of the first (layer of) hardened material to form a transformed (e.g., molten) portion. The hardening may be solidifying. The method disclosed herein may control the curvature of at least one surface of the 3D object. The method disclosed herein may control the curvature of at least one surface of a layer of the 3D object. The method disclosed herein may control the curvature of at least one layer of the 3D object. During formation, the 3D object may be suspended anchorlessly in the material bed (e.g., during its formation). The 3D object may comprise auxiliary supports or be devoid of auxiliary supports (e.g., during its formation). The auxiliary supports may be suspended (e.g., anchorless) in the material bed (e.g., during formation of the 3D object). The method disclosed herein may reduce (or preserve) the curvature of at least one layer and/or surface of the 3D object. The method disclosed herein may reduce (or preserve) the curvature of at least one layer surface of the 3D object. The methods disclosed herein may result in the at least one surface of the 3D object having a positive curvature, negative curvature, or substantially zero curvature. In some embodiments, the hardening operation occurs before the deforming operation. The method disclosed herein may further comprise after the hardening operation and before a completion of the plastic deformation, heating and/or cooling the second hardened material. The cooling may be cooling from above the exposed surface (e.g., using a cooling member).

FIG. 11A shows an example of a 3D hardened material structure 1111 in a material bed 1110 comprising pre-transformed material (e.g., powder bed). FIG. 11B shows an example of a heated portion 1112 within a 3D hardened material structure, which comprises two sections that have not been heated (e.g., 1111a and 1111b). The heating can be performed by any one or more energy source disclosed herein (e.g., conductive heat source and/or energy beam). The heated portion can be centered or not centered with respect to a cross section of the 3D object (e.g., horizontal, vertical, or angular). The heated portion can be in the middle of the 3D object, or a layer thereof. The heated portion can be on the side of the 3D object. In some embodiments, the heated portion is not at the side of the 3D object. At times, the heated portion does not border a side portion of the 3D object (e.g., with respect to the building platform). At times, the heated portion is situated at a distance from the opposing sides of the 3D object. At times, the heated portion is situated (e.g., substantially) symmetrically at a distance from the opposing sides of the 3D object with respect to at least one cross section (e.g., horizontal, vertical, or angular). Substantially is relative to the intended purpose of the 3D object. FIG. 11B shows an example where the heated portion 1112 is situated (e.g., substantially) symmetrically at the center of the 3D object with respect to a vertical cross section of the 3D object (e.g., layer thereof), at an equal distance from each of the opposing sides of the 3D object (e.g., 1119, 1120). At times, the heated portion is situated unsymmetrically at unequal distances from either opposing side of the 3D object, with respect to at least one cross section (e.g., horizontal, vertical, or angular). FIG. 11C shows an example of a transformed (e.g., molten) portion 1114 within the heated portion, depicting the remainder of the heated portion that did not transform in 1113. FIG. 11D schematically shows a region of higher temperature 1115 between the transformed portion 1114 and the non-transformed heated portion 1113, which 1115 comprises non-transformed material that is at a temperature that is higher than the temperature in 1116. FIG. 11E schematically shows the result of the shown in FIG. 11C and FIG. 11D, as the 3D object plastically deforms. The exposed surface of the transformed (e.g., molten) portion (e.g., 1114) may be smaller, or (e.g., substantially) similar to the exposed surface of the heated portion (e.g., 1112). The exposed surface of the transformed portion may be contained within the exposed surface of the heated portion. The transformation and/or heating of the hardened material may induce mechanical deformation of the 3D object. The transformation and/or heating of the hardened material may induce elastic and/or plastic deformation of the 3D object. The transformation and/or heating of the hardened material may induce fatigue (e.g., material fatigue such as metal fatigue) in the 3D object. The transformation and/or heating of the hardened material may induce compressive and/or tensile stress in the 3D object. The transformation and/or heating of the hardened material may induce reversible and/or irreversible deformation of the 3D object.

The plastically deformed object can optionally be cooled from the top. The plastically deformed object can be cooled using the cooling member disclosed herein. The cooling may be a quick cooling by the cooling member, or can be continuous and/or prolonged cooling. The quick cooling may comprise introducing and quickly removing the cooling member from a position adjacent (e.g., above) the transformed (e.g., molten) area (e.g., 1114). Quickly may be measured relative to the hardening of the interior of the transformed area. Quickly may allow the interior of the transformed area to remain transformed, whereas the exposed surface of the transformed area may harden. Quickly may allow the interior of the molten area to remain molten, whereas the exposed surface of the molten area may solidify.

The methods disclosed herein may comprise a material (e.g., of the pre-transformed material, of the material bed, of the hardened material, or any combination thereof) that conducts heat. The material may be such that the heat conduction and/or absorption of the hardened (e.g., solid) material is more efficient than that of the pre-transformed material (e.g., powder material). In some examples, the transformed portion (e.g., before or after its at least partial hardening) may be removed. The removal may comprise erosion, vaporization, chipping, or ablation. The removal may comprise a mechanical, optical, or chemical removal. The ablation may comprise directing an energy beam to the transformed portion (e.g., before or after its at least partial hardening). The energy beam may be any energy beam disclosed herein. The energy beam may be the same, or a different energy beam that formed the molten portion (e.g., 1114). The energy beam may be the same, or a different energy beam that formed the heated portion (e.g., 1112). The heated portion may be formed by an energy beam or by a radiative energy source. The energy beam forming the heated portion may be the same or different than the one forming the molten portion. FIG. 11F shows an example of a removed portion (1118) of the heated layer (e.g., 1112), resulting in heated portions 1116 and 1115 forming a portion of the 3D object.

The material may be such that the heat may dissipate and/or transfer through the hardened material in greater amount than thorough the pre-transformed form (e.g., powder) of that material. The material may be such that the heat may thermally equilibrate in preference through the hardened material as compared to the pre-transformed form of that material. The material may have a characteristic wherein the heat may dissipate and/or transfer through the hardened (e.g., solid) material in greater amount than thorough a powder of that material. The material may be such that the heat may thermally equilibrate in preference through the hardened material as compared to the powder of that material. More efficient may refer to more efficient in time (e.g., quicker).

In some aspects disclosed herein is a 3D object (e.g., formed by a 3D printing process) that comprises one or more layer portions comprising successive solidified melt pools of a material, wherein the 3D object comprises a surface, and interior, and a grain structure. In that 3D object, the grain structure closer to the surface may be indicative of a higher solidification rate than the grain structure in the interior. The grain structure may comprise a melt pool. For example, the grain structure may be smaller (e.g., of a smaller volume or smaller FLS) at a position closer to or at to the surface, as compared to the size of the grain structure in the interior. The solidification may comprise crystallization. The grain structure may be a microstructure. The grain structure may be a metallurgical structure (e.g., planar structure, cellular structure, columnar dendritic structure, or equiaxed dendritic structure).

In some aspects disclosed herein is a 3D object (e.g., formed by a 3D printing process) comprises one or more layer portions comprising successive solidified melt pools of a material, wherein the 3D object comprises a surface, an interior, and metallurgical microstructure (e.g., dendrites and/or cells), wherein the metallurgical microstructure at a position closer to or at the surface are indicative of a higher (e.g., quicker) solidification rate than the metallurgical microstructure in the interior. The spacing between the metallurgical microstructures may be smaller at a position closer to or at the surface, as compared to the spacing of the (e.g., respective) metallurgical microstructure in the interior. The overall size of the metallurgical microstructure may be smaller at a position closer to or at the surface, as compared to the overall size of the (e.g., respective) metallurgical microstructure in the interior (e.g., indicating quick solidification). The 3D object disclosed herein may be devoid of an auxiliary support feature or auxiliary support feature mark that is indicative of a presence or removal of the auxiliary support feature.

In another aspect, a method for forming a 3D object comprises: generating a first hardened material in an pre-transformed material bed disposed adjacent to a platform in an enclosure, which first hardened material comprises a bottom surface facing towards the platform; heating a portion of the first hardened material to form a heated portion; transforming (e.g., melting) a portion of the top of the heated portion to form a transformed portion; and hardening the transformed portion to form a second hardened material that comprises a bottom surface facing towards the platform. In some examples, the bottom surface of the first hardened material has a first curvature that is of a higher value than a second curvature of the bottom surface of the second hardened material. The bottom surface may have a negative curvature when a volume bound from the bottom surface to the platform is a convex object, which bottom surface is disposed above the platform. The exposed surface of portion of the transformed portion may be contained within the exposed surface of the heated portion. The exposed surface of the molten portion may be smaller than an exposed surface of the heated portion. The heated portion may not comprise the rim of the layer of hardened material. The method may further comprise removing a portion of the molten portion. The removed portion may comprise the exposed surface of the molten portion. The method may further comprise removing a portion of the heated portion. The removal may comprise using an energy beam. The layer of hardened material may or may not be anchored to the enclosure in which the 3D object is formed (e.g., to the platform) during its formation. The layer of hardened material may or may not comprise auxiliary supports during the formation of the 3D object.

In another aspect, a method for forming a 3D object comprises: generating at least a portion of a 3D object from a material bed; cooling the material bed using a first cooling member disposed within the enclosure; moving the first cooling member; and cooling the first cooling member using a second cooling member that is disposed outside of the enclosure. The material bed may be disposed on a platform within an enclosure. Above may refer to a direction away from the platform and/or opposite to the direction of the gravitational force. The cooling member may be disposed adjacent to the material bed. In some examples, the cooling member may be disposed above, to the side, or below the material bed. For example, the cooling member may be disposed above an exposed surface of the material bed. (See FIG. 5A).

The first cooling member may be disposed along the path of an energy beam that is used in generating the 3D object. The first cooling member may be disposed in an isolated atmosphere. The material bed may comprise a material that is susceptible to oxygen and/or humidity. The material bed may comprise an explosive material. The isolated atmosphere may comprise a gas (e.g., as disclosed herein). For example, the isolated atmosphere may comprise an inert gas. The first cooling member and the material bed may be disposed in the isolated atmosphere. The first cooling member may be disposed in a first atmosphere, and the second cooling member may be disposed in a second atmosphere. The first atmosphere may be (e.g., substantially) similar to the second atmosphere. The first atmosphere may be different than the second atmosphere. The second cooling member may be disposed in an ambient atmosphere. The cooling of the first cooling member may comprise contacting the first cooling member with the second cooling member (e.g., FIG. 5B). The contact between the first and second cooling members may be indirect (e.g., through a surface such as the surface of the enclosure). The indirect contact may comprise one or more intervening surfaces between at least one surface of the first cooling member and at least one surface of the second cooling member. The one or more intervening surfaces may include the coating of the enclosure, and/or the walls of the enclosure. The contact between the first and the second cooling member may be direct. The direct contact may comprise contacting at least one surface of the first cooling member with at least one surface of the second cooling member. The first cooling member may be passive. The passive cooling member may be a part (e.g., slab) of material. The passive cooling member may exclude active removal of heat (e.g., using a motor). The second cooling member may be actively cooled. The second cooling member may comprise a heat exchanger. The cooling member (e.g., first or second) may comprise a thermostat. The cooling member (e.g., first and/or second) may comprise heat control. Each of the cooling members may have its own heat control and/or sensor (e.g., temperature sensor). At times, both cooling members may have a joint controller and/or sensor (e.g., temperature sensor). In some embodiments, both the first and the second cooling member are actively cooled. In some embodiments, both the first and the second cooling member are passive. (See FIGS. 5A-5B and 18A-18B).

The first cooling member may be translatable. In some embodiments, the second cooling member may be translatable. The second cooling member may be stationary. The stationary cooling member may have one or more parts that are translatable and/or exchangeable. The first cooling member or any parts thereof may be exchangeable. The second cooling member may comprise translatable coolant. The second cooling member may comprise one or more coolants that travel from a position adjacent to the first cooling member and away from the position adjacent to the first cooling member. When the coolants move away from the position adjacent to the first cooling member, the coolants may remove at least a portion of the energy of the first cooling member away from the first cooling member. The method disclosed herein may further comprise translating the first cooling member to a position adjacent to the second cooling member. he method may further comprise attracting the first cooling member to the second cooling member. The attraction may comprise mechanically bringing the first cooling member to a position adjacent to the second cooling member. The attraction may comprise generating a force that attracts the first cooling member to the second cooling member. The force may comprise magnetic, hydraulic, or electric force. In some embodiments, cooling the material bed using the first cooling member comprises removing a percentage of heat from an exposed surface of the material bed. The percentage may be at least about 10%, 20%, 30%, 40%, 50%, 60%, 70%, 80%, or 90%. The percentage may be any percentage between the abovementioned percentages (e.g., from about 10% to about 90%, from about 30% to about 90%, from about 30% to about 50%, or from about 50% to about 90%).

Figure 14:
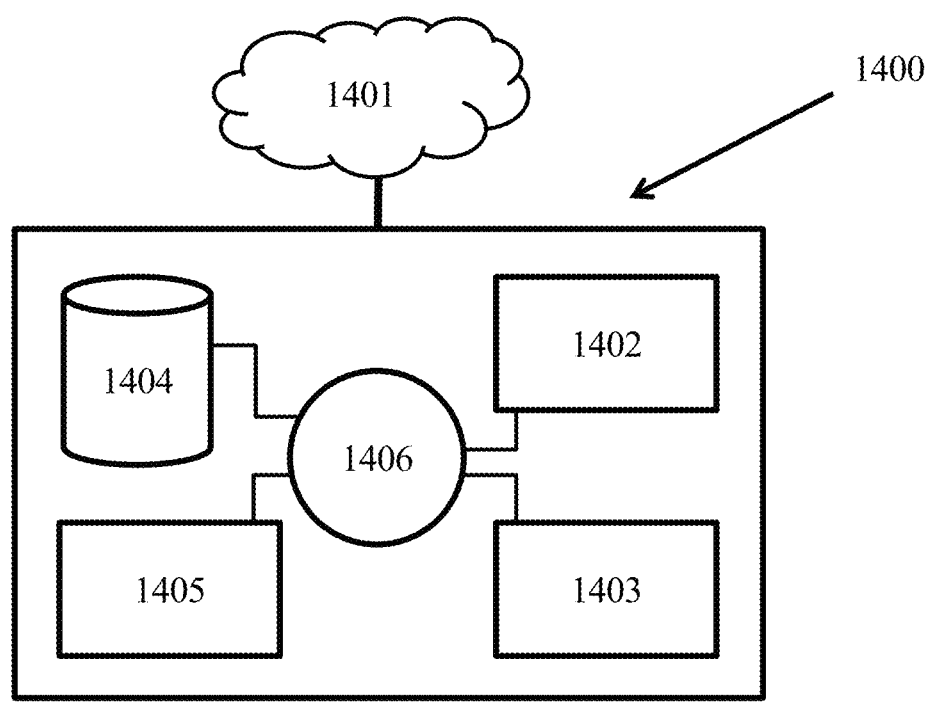
FIG. 14 schematically illustrates a computer control system that is programmed or otherwise configured to facilitate the formation of one or more 3D objects.

In another aspect, a method for forming a 3D object comprises: using an energy beam to transform at least a portion of a material bed to form at least a portion of the 3D object; measuring one or more temperatures at one or more points adjacent to (or on) the at least a portion of the 3D object in real time during the 3D printing; and controlling the energy beam with at least one processing unit based on the measured temperatures. The processing unit may comprise at least 3 Tera floating point operations per second according to a benchmark. The control of the energy beam with the processing unit may be (e.g., further) based on a geometry of the at least a portion of the 3D object. The benchmark may comprise a mathematical, graphical, or encryption benchmark. The processing unit may comprise parallel processing. The processing unit may comprise at least 8 billion transistors. The area of the processing unit may be at most about 600 mm$^2$. The processing unit may comprise at least 1000 cores. The processing unit may comprise a memory bandwidth of at least 100 Giga bytes per second. The processing unit may comprise a memory clock speed of at least 5 Giga bits per second. The controlling may be based on at least one control mechanism. At times, the control mechanism may exclude feedback from the structure of at least a portion of the generated 3D object. Sometimes, the control mechanism may include feedback from the structure of at least a portion of the generated 3D object. The controlling may be based on a control mechanism comprising taking into account a generic geometric section (e.g., a primitive) that is similar to a portion of the 3D object. The controller may comprise a processing unit. The controller may comprise a computer system. FIG. 14 schematically shows an example of a computer system 1400 that is programmed or otherwise configured to facilitate the formation of a 3D object according to the methods provided herein.

In some embodiments, the material (e.g., pre-transformed, transformed and/or hardened) comprises elemental metal, metal alloy, ceramics, or an allotrope of elemental carbon. The allotrope of elemental carbon may comprise amorphous carbon, graphite, graphene, diamond, or fullerene. The fullerene may be selected from the group consisting of a spherical, elliptical, linear, and tubular fullerene. The fullerene may comprise a buckyball or a carbon nanotube. The ceramic material may comprise cement. The ceramic material may comprise alumina. The material may comprise sand, glass, or stone. In some embodiments, the material may comprise an organic material, for example, a polymer or a resin. The organic material may comprise a hydrocarbon. The polymer may comprise styrene. The organic material may comprise carbon and hydrogen atoms. The organic material may comprise carbon and oxygen atoms. The organic material may comprise carbon and nitrogen atoms. The organic material may comprise carbon and sulfur atoms. In some embodiments, the material may exclude an organic material. The material may comprise a solid or a liquid. In some embodiments, the material may comprise a silicon-based material, for example, silicon based polymer or a resin. The material may comprise an organosilicon-based material. The material may comprise silicon and hydrogen atoms. The material may comprise silicon and carbon atoms. In some embodiments, the material may exclude a silicon-based material. The solid material may comprise powder material. The powder material may be coated by a coating (e.g., organic coating such as the organic material (e.g., plastic coating)). The material may be devoid of organic material. The liquid material may be compartmentalized into reactors, vesicles, or droplets. The compartmentalized material may be compartmentalized in one or more layers. The material may be a composite material comprising a secondary material. The secondary material can be a reinforcing material (e.g., a material that forms a fiber). The reinforcing material may comprise a carbon fiber, Kevlar®, Twaron®, ultra-high-molecular-weight polyethylene, or glass fiber. The material can comprise powder (e.g., granular material) or wires. The solid particulate material may be powder. The material may exclude a polymer and/or a resin. The polymer may be a molecule having a repeating molecular unit. The polymer and/or resin may be an organic (e.g., comprising of hydrogen and carbon). The polymer and/or resin may be any polymer and/or resin disclosed herein. In some embodiments, the material may include a polymer.

In some embodiments, the material comprises a particulate material. The particulate material may comprise solid, or semi-solid (e.g., gel) particles. The solid particulate material comprises a powder. In some embodiments, the material comprises a powder material. The material may comprise a solid material. The material may comprise one or more particles or clusters. The term "powder," as used herein, generally refers to a solid having fine particles. Powders may be granular materials. The powder particles may comprise micro particles. The powder particles may comprise nanoparticles. In some examples, a powder comprising particles having an average FLS of at least about 5 nanometers (nm), 10 nm, 20 nm, 30 nm, 40 nm, 50 nm, 100 nm, 200 nm, 300 nm, 400 nm, 500 nm, 1 µm, 5 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, or 100 µm. The particles comprising the powder may have an average FLS of at most about 100 µm, 80 µm, 75 µm, 70 µm, 65 µm, 60 µm, 55 µm, 50 µm, 45 µm, 40 µm, 35 µm, 30 µm, 25 µm, 20 µm, 15 µm, 10 µm, 5 µm, 1 µm, 500 nm, 400 nm, 300 nm, 200 nm, 100 nm, 50 nm, 40 nm, 30 nm, 20 nm, 10 nm, or 5 nm. In some cases, the powder may have an average FLS between any of the values of the average particle FLS listed above (e.g., from about 5 nm to about 100 µm, from about 1 µm to about 100 µm, from about 15 µm to about 45 µm, from about 5 µm to about 80 µm, from about 20 µm to about 80 µm, or from about 500 nm to about 50 µm).

The powder can be composed of individual particles. The individual particles can be spherical, oval, prismatic, cubic, or irregularly shaped. The particles can have a FLS. The powder can be composed of a homogenously shaped particle mixture such that all of the particles have substantially the same shape and FLS magnitude within at most 1%, 5%, 8%, 10%, 15%, 20%, 25%, 30%, 35%, 40%, 50%, 60%, or 70%, distribution of FLS. In some cases, the powder can be a heterogeneous mixture such that the particles have variable shape and/or FLS magnitude.

In some embodiments, at least parts of the layer of pre-transformed material can be transformed to a transformed material as at least a portion of the 3D object. The transformed material may subsequently form at least a fraction (also used herein "a portion," or "a part") of a hardened (e.g., solidified) 3D object. At times a layer of transformed or hardened material may comprise a cross section of a 3D object (e.g., a horizontal cross section). At times, a layer of transformed and/or hardened material may comprise a deviation from a cross section of a 3D model of a desired 3D object (e.g., an originally intended design to be produced as a printed 3D object). The deviation may include vertical or horizontal deviation with respect to the 3D model of the intended 3D object.

A pre-transformed material layer (or a portion thereof) can have a thickness of at least about 1.0 µm, 10 µm, 50 µm, 100 µm, 150 µm, 200 µm, 300 µm, 400 µm, 500 µm, 600 µm, 700 µm, 800 µm, 900 µm, or 1000 µm. An un-transformed material layer (or a portion thereof) can have a thickness of at most about 1000 µm, 900 µm, 800 µm, 700 µm, 60 nm, 500 µm, 450 µm, 400 µm, 350 µm, 300 µm, 250 µm, 200 nm, 150 nm, 100 nm, 75 nm, 50 nm, 40 nm, 30 nm, 20 nm, or 10 µm. A pre-transformed material layer (or a portion thereof) may have any value in between the aforementioned values (e.g., from about 1000 µm to about 1 µm, 800 µm to about 10 µm, 600 µm to about 20 µm, 300 µm to about 30 µm, or 1000 µm to about 10 µm).

The material composition of at least one layer within the material bed may differ from the material composition within at least one other layer in the material bed. The difference (e.g., variation) may comprise difference in crystal and/or grain structure. The variation may comprise variation in grain orientation, variation in material density, variation in the degree of compound segregation to grain boundaries, variation in the degree of element segregation to grain boundaries, variation in material phase, variation in metallurgical phase, variation in material porosity, variation in crystal phase, and variation in crystal structure. The microstructure of the printed object may comprise planar structure, cellular structure, columnar dendritic structure, or equiaxed dendritic structure.

The pre-transformed materials of at least one layer in the material bed may differ in the FLS of its particles (e.g., powder particles) from the FLS of the pre-transformed material within at least one other layer in the material bed. A layer may comprise two or more material types at any combination. For example, two or more elemental metals, two or more metal alloys, two or more ceramics, two or more allotropes of elemental carbon. For example, an elemental metal and a metal alloy, an elemental metal and a ceramic, an elemental metal and an allotrope of elemental carbon, a metal alloy and a ceramic, a metal alloy and an allotrope of elemental carbon, a ceramic and an allotrope of elemental carbon. All the layers of pre-transformed material deposited during the 3D printing process may be of the same material composition. In some instances, a metal alloy is formed in situ during the process of transforming at least a portion of the material bed. In some instances, a metal alloy is not formed in situ during the process of transforming at least a portion of the material bed. In some instances, a metal alloy is formed prior to the process of transforming at least a portion of the material bed. In a multiplicity (e.g., mixture) of pre-transformed materials, one pre-transformed material may be used as support (i.e., supportive powder), as an insulator, as a cooling member (e.g., heat-sink), or as any combination thereof.

In some instances, adjacent components in the material bed (e.g., layers of hardened material) are separated from one another by one or more intervening layers of pre-transformed material. In an example, a first layer is adjacent to a second layer when the first layer is in direct contact with the second layer. In another example, a first layer is adjacent to a second layer when the first layer is separated from the second layer by at least one layer (e.g., a third layer). The intervening layer may be of any layer size disclosed herein.

The pre-transformed material (e.g., powder material) can be chosen such that the material type is the desired and/or otherwise predetermined material type for the 3D object. In some cases, a layer of the 3D object comprises a single type of material. In some examples, a layer of the 3D object may comprise a single elemental metal type, or a single metal alloy type. In some examples, a layer within the 3D object may comprise several types of material (e.g., an elemental metal and an alloy, an alloy and a ceramic, an alloy and an allotrope of elemental carbon). In certain embodiments each type of material comprises only a single member of that type. For example: a single member of elemental metal (e.g., iron), a single member of metal alloy (e.g., stainless steel), a single member of ceramic material (e.g., silicon carbide or tungsten carbide), or a single member (e.g., an allotrope) of elemental carbon (e.g., graphite). In some cases, a layer of the 3D object comprises more than one type of material. In some cases, a layer of the 3D object comprises more than one member of a material type.

The layer structure may comprise any material(s) used for 3D printing described herein. Sometimes one part of the layer may comprise one material, and another part may comprise a second material different than the first material. A layer of the 3D object may be composed of a composite material. The 3D object may be composed of a composite material. The 3D object may comprise a functionally graded material.

The elemental metal can be an alkali metal, an alkaline earth metal, a transition metal, a rare earth element metal, or another metal. The alkali metal can be Lithium, Sodium, Potassium, Rubidium, Cesium, or Francium. The alkali earth metal can be Beryllium, Magnesium, Calcium, Strontium, Barium, or Radium. The transition metal can be Scandium, Titanium, Vanadium, Chromium, Manganese, Iron, Cobalt, Nickel, Copper, Zinc, Yttrium, Zirconium, Platinum, Gold, Rutherfordium, Dubnium, Seaborgium, Bohrium, Hassium, Meitnerium, Ununbium, Niobium, Iridium, Molybdenum, Technetium, Ruthenium, Rhodium, Palladium, Silver, Cadmium, Hafnium, Tantalum, Tungsten, Rhenium, or Osmium. The transition metal can be mercury. The rare earth metal can be a lanthanide, or an actinide. The lanthanide metal can be Lanthanum, Cerium, Praseodymium, Neodymium, Promethium, Samarium, Europium, Gadolinium, Terbium, Dysprosium, Holmium, Erbium, Thulium, Ytterbium, or Lutetium. The actinide metal can be Actinium, Thorium, Protactinium, Uranium, Neptunium, Plutonium, Americium, Curium, Berkelium, Californium, Einsteinium, Fermium, Mendelevium, Nobelium, or Lawrencium. The other metal can be Aluminum, Gallium, Indium, Tin, Thallium, Lead, or Bismuth.

The metal alloy can be an iron based alloy, nickel based alloy, cobalt based allow, chrome based alloy, cobalt chrome based alloy, titanium based alloy, magnesium based alloy, copper based alloy, scandium alloy, or any combination thereof. The alloy may comprise an oxidation or corrosion resistant alloy. The alloy may comprise a super alloy (e.g., Inconel). The super alloy may comprise Inconel 600, 617, 625, 690, 718, or X-750. The metal (e.g., alloy or elemental) may comprise an alloy used for applications in industries comprising aerospace (e.g., aerospace super alloys), jet engine, missile, automotive, marine, locomotive, satellite, defense, oil & gas, energy generation, semiconductor, fashion, construction, agriculture, printing, or medical. The metal (e.g., alloy or elemental) may comprise an alloy used for products comprising, devices, medical devices (human & veterinary), machinery, cell phones, semiconductor equipment, generators, engines, pistons, electronics (e.g., circuits), electronic equipment, agriculture equipment, motor, gear, transmission, communication equipment, computing equipment (e.g., laptop, cell phone, tablet, i-pad), air conditioning, generators, furniture, musical equipment, art, jewelry, cooking equipment, or sport gear. The metal (e.g., alloy or elemental) may comprise an alloy used for products for human or veterinary applications comprising implants, or prosthetics. The metal alloy may comprise an alloy used for applications in the fields comprising human or veterinary surgery, implants (e.g., dental), or prosthetics.

The alloy may include a superalloy. The alloy may include a high-performance alloy. The alloy may include an alloy exhibiting at least one of excellent mechanical strength, resistance to thermal creep deformation, good surface stability, resistance to corrosion, and resistance to oxidation. The alloy may include a face-centered cubic austenitic crystal structure. The alloy may comprise Hastelloy, Inconel, Waspaloy, Rene alloy (e.g., Rene-80, Rene-77, Rene-220, or Rene-41), Haynes alloy, Incoloy, MP98T, TMS alloy, MTEK (e.g., MTEK grade MAR-M-247, MAR-M-509, MAR-M-R41, or MAR-M-X-45), or CMSX (e.g., CMSX-3, or CMSX-4). The alloy can be a single crystal alloy.

In some instances, the iron alloy comprises Elinvar, Fernico, Ferroalloys, Invar, Iron hydride, Kovar, Spiegeleisen, Staballoy (stainless steel), or Steel. In some instances, the metal alloy is steel. The Ferroalloy may comprise Ferroboron, Ferrocerium, Ferrochrome, Ferromagnesium, Ferromanganese, Ferromolybdenum, Ferronickel, Ferrophosphorus, Ferrosilicon, Ferrotitanium, Ferrouranium, or Ferrovanadium. The iron alloy may include cast iron, or pig iron. The steel may include Bulat steel, Chromoly, Crucible steel, Damascus steel, Hadfield steel, High speed steel, HSLA steel, Maraging steel (M300), Reynolds 531, Silicon steel, Spring steel, Stainless steel, Tool steel, Weathering steel, or Wootz steel. The high-speed steel may include Mushet steel. The stainless steel may include AL-6XN, Alloy 20, celestrium, marine grade stainless, Martensitic stainless steel, surgical stainless steel, or Zeron 100. The tool steel may include Silver steel. The steel may comprise stainless steel, Nickel steel, Nickel-chromium steel, Molybdenum steel, Chromium steel, Chromium-vanadium steel, Tungsten steel, Nickel-chromium-molybdenum steel, or Silicon-manganese steel. The steel may be comprised of any Society of Automotive Engineers (SAE) grade such as 440F, 410, 312, 430, 440A, 440B, 440C, 304, 305, 304L, 304L, 301, 304LN, 301LN, 2304, 316, 316L, 316LN, 317L, 2205, 409, 904L, 321, 254SMO, 316Ti, 321H, 17-4, 15-5, 420, or 304H. The steel may comprise stainless steel of at least one crystalline structure selected from the group consisting of austenitic, superaustenitic, ferritic, martensitic, duplex, and precipitation-hardening martensitic. Duplex stainless steel may be lean duplex, standard duplex, super duplex, or hyper duplex. The stainless steel may comprise surgical grade stainless steel (e.g., austenitic 316, martensitic 420, or martensitic 440). The austenitic 316 stainless steel may include 316L, or 316LVM. The steel may include 17-4 Precipitation Hardening steel (also known as type 630, a chromium-copper precipitation hardening stainless steel, 17-4PH steel).

The titanium-based alloys may include alpha alloys, near alpha alloys, alpha and beta alloys, or beta alloys. The titanium alloy may comprise grade 1, 2, 2H, 3, 4, 5, 6, 7, 7H, 8, 9, 10, 11, 12, 13, 14, 15, 16, 16H, 17, 18, 19, 20, 21, 2, 23, 24, 25, 26, 26H, 27, 28, 29, 30, 31, 32, 33, 34, 35, 36, 37, 38, or higher. In some instances, the titanium base alloy includes Ti-6Al-4V or Ti-6Al-7Nb.

The Nickel alloy may include Alnico, Alumel, Chromel, Cupronickel, Ferronickel, German silver, Hastelloy, Inconel, Monel metal, Nichrome, Nickel-carbon, Nicrosil, Nisil, Nitinol, Hastelloy X, Cobalt-Chromium, or Magnetically "soft" alloys. The magnetically "soft" alloys may comprise Mu-metal, Permalloy, Supermalloy, or Brass. The brass may include Nickel hydride, Stainless or Coin silver. The cobalt alloy may include Megallium, Stellite (e.g. Talonite), Ultimet, or Vitallium. The chromium alloy may include chromium hydroxide, or Nichrome.

The aluminum alloy may include AA-8000, Al—Li (aluminum-lithium), Alnico, Duralumin, Hiduminium, Kryron Magnalium, Nambe, Scandium-aluminum, or Y alloy. The magnesium alloy may be Elektron, Magnox, or T—Mg—Al—Zn (Bergman phase) alloy.

The copper alloy may comprise Arsenical copper, Beryllium copper, Billon, Brass, Bronze, Constantan, Copper hydride, Copper-tungsten, Corinthian bronze, Cunife, Cupronickel, Cymbal alloys, Devarda's alloy, Electrum, Hepatizon, Heusler alloy, Manganin, Molybdochalkos, Nickel silver, Nordic gold, Shakudo, or Tumbaga. The Brass may include Calamine brass, Chinese silver, Dutch metal, Gilding metal, Muntz metal, Pinchbeck, Prince's metal, or Tombac. The Bronze may include Aluminum bronze, Arsenical bronze, Bell metal, Florentine bronze, Guanin, Gunmetal, Glucydur, Phosphor bronze, Ormolu, or Speculum metal.

In some examples the material (e.g., powder material) comprises a material wherein its constituents (e.g., atoms or molecules) readily lose their outer shell electrons, resulting in a free flowing cloud of electrons within their otherwise solid arrangement. In some examples the material is characterized in having high electrical conductivity, low electrical resistivity, high thermal conductivity, or high density (e.g., as measured at ambient temperature (e.g., R.T., or 20° C.)). The high electrical conductivity can be at least about $1*10^5$ Siemens per meter (S/m), $5*10^5$ S/m, $1*10^6$ S/m, $5*10^6$ S/m, $1*10^7$ S/m, $5*10^7$ S/m, or $1*10^8$ S/m. The symbol "*" designates the mathematical operation "times," or "multiplied by." The high electrical conductivity can be any value between the aforementioned electrical conductivity values (e.g., from about $1*10^5$ S/m to about $1*10^8$ S/m). The low electrical resistivity may be at most about $1*10^{-5}$ ohm times meter ($\Omega*m$), $5*10^{-6}$ $\Omega*m$, $1*10^{-6}$ $\Omega*m$, $5*10^{-7}$ $\Omega*m$, $1*10^{-7}$ $\Omega*m$, $5*10^{-8}$, or $1*10^{-8}$ $\Omega*m$. The low electrical resistivity can be any value between the aforementioned electrical resistivity values (e.g., from about $1\times10^{-5}$ $\Omega*m$ to about $1\times10^{-8}$ $\Omega*m$). The high thermal conductivity may be at least about 20 Watts per meters times Kelvin (W/mK), 50 W/mK, 100 W/mK, 150 W/mK, 200 W/mK, 205 W/mK, 300 W/mK, 350 W/mK, 400 W/mK, 450 W/mK, 500 W/mK, 550 W/mK, 600 W/mK, 700 W/mK, 800 W/mK, 900 W/mK, or 1000 W/mK. The high thermal conductivity can be any value between the aforementioned thermal conductivity values (e.g., from about 20 W/mK to about 1000 W/mK). The high density may be at least about 1.5 grams per cubic centimeter (g/cm$^3$), 2 g/cm$^3$, 3 g/cm$^3$, 4 g/cm$^3$, 5 g/cm$^3$, 6 g/cm$^3$, 7 g/cm$^3$, 8 g/cm$^3$, 9 g/cm$^3$, 10 g/cm$^3$, 11 g/cm$^3$, 12 g/cm$^3$, 13 g/cm$^3$, 14 g/cm$^3$, 15 g/cm$^3$, 16 g/cm$^3$, 17 g/cm$^3$, 18 g/cm$^3$, 19 g/cm$^3$, 20 g/cm$^3$, or 25 g/cm$^3$. The high density can be any value between the aforementioned density values (e.g., from about 1 g/cm$^3$ to about 25 g/cm$^3$).

A metallic material (e.g., elemental metal or metal alloy) can comprise small amounts of non-metallic materials, such as, for example, oxygen, sulfur, or nitrogen. In some cases, the metallic material can comprise the non-metallic material in a trace amount. A trace amount can be at most about 100000 parts per million (ppm), 10000 ppm, 1000 ppm, 500 ppm, 400 ppm, 200 ppm, 100 ppm, 50 ppm, 10 ppm, 5 ppm, or 1 ppm (on the basis of weight, w/w) of non-metallic material. A trace amount can comprise at least about 10 ppt, 100 ppt, 1 ppb, 5 ppb, 10 ppb, 50 ppb, 100 ppb, 200 ppb, 400 ppb, 500 ppb, 1000 ppb, 1 ppm, 10 ppm, 100 ppm, 500 ppm, 1000 ppm, or 10000 ppm (on the basis of weight, w/w) of non-metallic material. A trace amount can be any value between the afore-mentioned trace amounts (e.g., from about 10 parts per trillion (ppt) to about 100000 ppm, from about 1 ppb to about 100000 ppm, from about 1 ppm to about 10000 ppm, or from about 1 ppb to about 1000 ppm).

The one or more layers within the 3D object may be (e.g., substantially) planar (e.g., flat). The planarity of the layer may be (e.g., substantially) uniform. The height of the layer at a particular position may be compared to an average plane. The average plane may be defined by a least squares planar fit of the top-most part of the surface of the layer of hardened material. The average plane may be a plane calculated by averaging the material height at each point on the top surface of the layer of hardened material. The deviation from any point at the surface of the planar layer of hardened material may be at most 20% 15%, 10%, 5%, 3%, 1%, or 0.5% of the height (e.g., thickness) of the layer of hardened material. The substantially planar one or more layers may have a large radius of curvature. FIG. 2 shows an example of a vertical cross section of a 3D object 212 comprising planar layers (layer numbers 1-4) and non-planar layers (layer numbers 5-6) that have a radius of curvature. FIGS. 2, 216 and 217 are super-positions of curved layer on a circle 215 having a radius of curvature "r." The one or more layers may have a radius of curvature equal to the radius of curvature of the layer surface. The radius of curvature of the layer surface (e.g., all the layers of the 3D object) may have a value of at least about 0.1 centimeter (cm), 0.2 cm, 0.3 cm, 0.4 cm, 0.5 cm, 0.6 cm, 0.7 cm, 0.8 cm, 0.9 cm, 1 cm, 5 cm, 10 cm, 20 cm, 30 cm, 40 cm, 50 cm, 60 cm, 70 cm, 80 cm, 90 cm, 1 meter (m), 1.5 m, 2 m, 2.5 m, 3 m, 3.5 m, 4 m, 4.5 m, 5 m, 10 m, 15 m, 20 m, 25 m, 30 m, 50 m, or 100 m. The radius of curvature of the layer surface (e.g., all the layers of the 3D object) may have any value between any of the afore-mentioned values of the radius of curvature (e.g., from about 10 cm to about 90 m, from about 50 cm to about 10 m, from about 5 cm to about 1 m, from about 50 cm to about 5 m, from about 5 cm to infinity, or from about 40 cm to about 50 m). A layer with an infinite radius of curvature is a layer that is planar. In some examples, the one or more layers may be included in a planar section of the 3D object, or may be a planar 3D object (e.g., a flat plane). In some instances, part of at least one layer within the 3D object has the radius of curvature mentioned herein.

Figure 10:
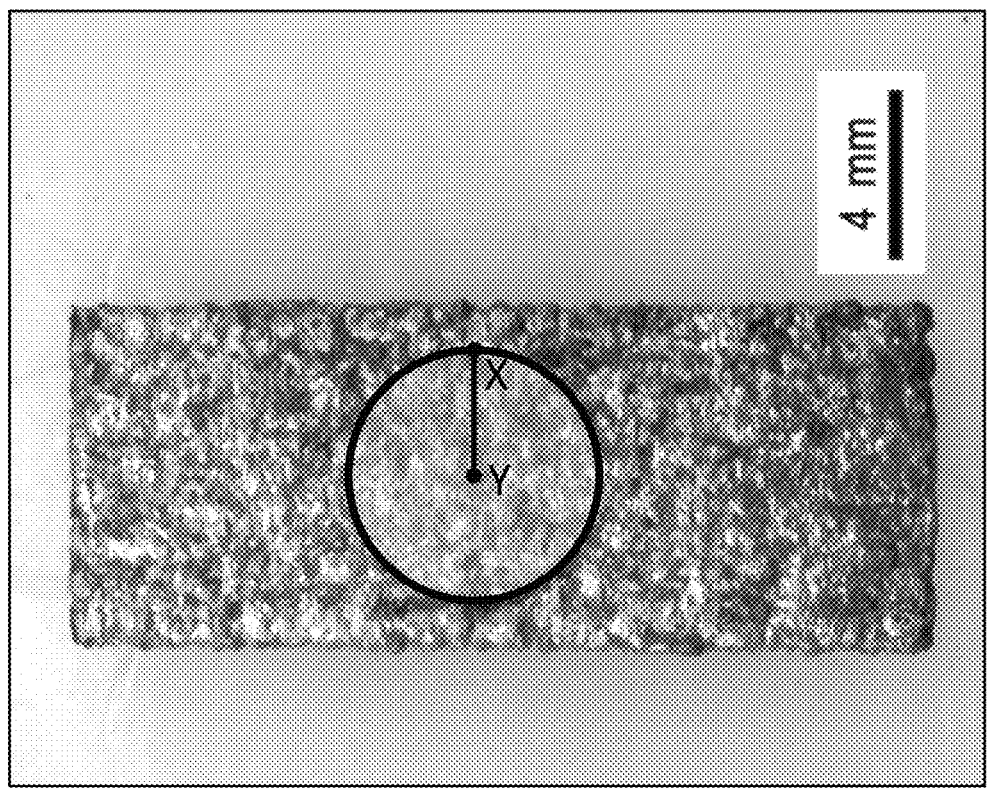
FIG. 10 shows a horizontal view of a 3D object.

The 3D object may comprise a layering plane N of the layered structure (e.g., FIG. 8C, 805). The 3D object may comprise points X and Y, which reside on the surface of the 3D object, wherein X is spaced apart from Y by the auxiliary feature spacing distance (e.g., as disclosed herein). FIG. 10 shows an example of points X and Y on the surface of a 3D object. In an example, a sphere of radius XY that is centered at X lacks one or more auxiliary supports or one or more auxiliary support marks that are indicative of a presence or removal of the one or more auxiliary support features. In some examples an acute angle forms between the straight line XY and the direction normal to N. The acute angle between the straight line XY and the direction normal to the layering plane may be of the value of the acute angle alpha (e.g., as disclosed herein). When the angle between the straight line XY and the direction of normal to N is greater than 90 degrees, one can consider the complementary acute angle.

In some embodiments, the generated 3D object may be generated with the accuracy of at least about 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 150 μm, 200 μm, 250 μm, 300 μm, 400 μm, 500 μm, 600 μm, 700 μm, 800 μm, 900 μm, 1000 μm, 1100 μm, or 1500 μm as compared to a 3D model of the 3D object (e.g., the desired 3D object). As compared to a 3D model of the 3D object, the generated 3D object may be generated with the accuracy of any accuracy value between the afore-mentioned values (e.g., from about 5 μm to about 100 μm, from about 15 μm to about 35 μm, from about 100 μm to about 1500 μm, from about 5 μm to about 1500 μm, or from about 400 μm to about 600 μm).

In some embodiments, the hardened layer of transformed material deforms. The deformation may cause a height deviation from a uniformly planar layer of hardened material. The height uniformity of the planar surface of the layer of hardened material may be at most about 100 µm, 90 µm, 80, 70 µm, 60 µm, 50 µm, 40 µm, 30 µm, 20 µm, 10 µm, or 5 µm. The height uniformity of the planar surface of the layer of hardened material may be any value between the afore-mentioned height deviation values (e.g., from about 100 µm to about 5 µm, from about 50 µm to about 5 µm, from about 30 µm to about 5 µm, or from about 20 µm to about 5 µm). The height uniformity may comprise high precision uniformity. The height uniformity may be a deviation from a prescribed layer height, from a mean layer height, or from an average layer height. The resolution of the 3D object may have any value of the height uniformity value mentioned herein. The resolution of the 3D object may be at least about 100 dots per inch (dpi), 300 dpi, 600 dpi, 1200 dpi, 2400 dpi, 3600 dpi, or 4800 dpi. The resolution of the 3D object may be at most about 100 dpi, 300 dpi, 600 dpi, 1200 dpi, 2400 dpi, 3600 dpi, or 4800 dip. The resolution of the 3D object may be any value between the aforementioned values (e.g., from 100 dpi to 4800 dpi, from 300 dpi to 2400 dpi, or from 600 dpi to 4800 dpi). The height uniformity of a layer of hardened material may persist across a portion of the layer surface that has a width or a length of at least about 1 mm, 2 mm, 3 mm, 4 mm, 5 mm, or 10 mm, have a height deviation of at least about 10 mm, 9 mm, 8 mm, 7 mm, 6 mm, 5 mm, 4 mm, 3 mm, 2 mm, 1 mm, 500 µm, 400 µm, 300 µm, 200 µm, 100 µm, 90 µm, 80 µm, 70 µm, 60 µm, 50 µm, 40 µm, 30 µm, 20 µm, or 10 µm. The height uniformity of a layer of hardened material may persist across a portion of the target surface that has a width or a length of or of any value between the afore-mentioned width or length values (e.g., from about 10 mm to about 10 µm, from about 10 mm to about 100 µm, or from about 5 mm to about 500 µm).

At least one layer of the printed 3D objects may deviate from a planar uniformity of the layer of pre-transformed material (e.g., powder) in at least one plane (e.g., horizontal plane) of at most about 20%, 10%, 5%, 2%, 1% or 0.5%, as compared to the average or mean plane (e.g., horizontal plane) created at the exposed surface of the material bed (e.g., top of a powder bed). The height deviation can be measured by using one or more sensors (e.g., optical sensors).

Characteristics of the hardened material and/or any of its parts (e.g., layer of hardened material) can be measured by any of the following measurement methodologies. For example, the FLS values (e.g., width), height uniformity, auxiliary support space, an/d or radius of curvature of the layer of the 3D object and any of its components (e.g., layer of hardened material) may be measured by any of the following measuring methodologies. The FLS of opening ports may be measured by one or more of following measurement methodologies. The measurement methodologies may comprise a microscopy method (e.g., any microscopy method described herein). The measurement methodologies may comprise a coordinate measuring machine (CMM), measuring projector, vision measuring system, and/or a gauge. The gauge can be a gauge distometer (e.g., caliliper). The gauge can be a go-no-go gauge. The measurement methodologies may comprise a caliper (e.g., Vernier caliper), positive lens, interferometer, or laser (e.g., tracker). The measurement methodologies may comprise a contact or by a non-contact method. The measurement methodologies may comprise one or more sensors (e.g., optical sensors and/or metrological sensors). The measurement methodologies may comprise a metrological measurement device (e.g., using metrological sensor(s)). The measurements may comprise a motor encoder (e.g., rotary and/or linear). The measurement methodologies may comprise using an electromagnetic beam (e.g., visible or infra-red (IR)). The microscopy method may comprise ultrasound or nuclear magnetic resonance. The microscopy method may comprise optical microscopy. The microscopy method may comprise electromagnetic, electron, or proximal probe microscopy. The electron microscopy may comprise scanning, tunneling, X-ray photo-, or Auger electron microscopy. The electromagnetic microscopy may comprise confocal, stereoscope, or compound microscopy. The microscopy method may comprise an inverted and/or non-inverted microscope. The proximal probe microscopy may comprise atomic force, or scanning tunneling microscopy, or any other microscopy described herein. The microscopy measurements may comprise using an image analysis system. The measurements may be conducted at ambient temperatures (e.g., R.T.).

The microstructures (e.g., of melt pools) of the 3D object may be measured by a microscopy method (e.g., any microscopy method described herein). The microstructures may be measured by a contact or by a non-contact method. The microstructures may be measured by using an electromagnetic beam (e.g., visible or IR). The microstructure measurements may comprise evaluating the dendritic arm spacing and/or the secondary dendritic arm spacing (e.g., using microscopy). The microscopy measurements may comprise using an image analysis system. The measurements may be conducted at ambient temperatures (e.g., R.T.).

Various distances relating to the chamber can be measured using any of the following measurement techniques. Various distances within the chamber can be measured using any of the following measurement techniques. For example, the gap distance (e.g., from the cooling member to the exposed surface of the material bed) may be measured using any of the following measurement techniques. The measurements techniques may comprise interferometry and/or confocal chromatic measurements. The measurements techniques may comprise at least one motor encoder (rotary, linear). The measurement techniques may comprise one or more sensors (e.g., optical sensors and/or metrological sensors). The measurement techniques may comprise at least one inductive sensor. The measurement techniques may include an electromagnetic beam (e.g., visible or IR). The measurements may be conducted at ambient temperature (e.g., R.T.).

The 3D object can have various surface roughness profiles, which may be suitable for various applications. The surface roughness may be the deviations in the direction of the normal vector of a real surface, from its ideal form. The surface roughness may be measured as the arithmetic average of the roughness profile (hereinafter "Ra"). The formed object can have a Ra value of at most about 200 µm, 100 µm, 75 µm, 50 µm, 45 µm, 40 µm, 35 µm, 30 µm, 25 µm, 20 µm, 15 µm, 10 µm, 7 µm, 5 µm, 3 µm, 1 µm, 500 nm, 400 nm, 300 nm, 200 nm, 100 nm, 50 nm, 40 nm, or 30 nm. The 3D object can have a Ra value between any of the aforementioned Ra values (e.g., from about 50 µm to about 1 µm, from about 100 µm to about 4 µm, from about 30 µm to about 3 µm, from about 60 nm to about 1 µm, or from about 80 nm to about 0.5 µm). The Ra values may be measured by a contact or by a non-contact method. The Ra values may be measured by a roughness tester and/or by a microscopy method (e.g., any microscopy method described herein). The measurements may be conducted at ambient temperatures (e.g., R.T.). The roughness (e.g., as Ra values) may be measured by a contact or by a non-contact method. The roughness measurement may comprise one or more sensors (e.g., optical sensors). The roughness measurement may comprise a metrological measurement device (e.g., using metrological sensor(s)). The roughness may be measured using an electromagnetic beam (e.g., visible or IR).

The 3D object may be composed of successive layers (e.g., successive cross sections) of solid material that originated from a transformed material (e.g., fused, sintered, melted, bound or otherwise connected powder material), and optionally subsequently hardened (e.g., FIGS. 8A-8C). The transformed material may be connected to a hardened (e.g., solidified) material. The hardened material may reside within the same layer, or in another layer (e.g., a previous layer). In some examples, the hardened material comprises disconnected parts of the 3D object, that are subsequently connected by newly transformed material (e.g., by fusing, sintering, melting, binding or otherwise connecting a powder material).

A cross section (e.g., vertical cross section) of the generated (i.e., formed) 3D object may reveal a microstructure or a grain structure indicative of a layered deposition (e.g., FIGS. 8A-8B). Without wishing to be bound to theory, the microstructure or grain structure may arise due to the solidification of transformed powder material that is typical to and/or indicative of the 3D printing method. For example, a cross section may reveal a microstructure resembling ripples or waves that are indicative of solidified melt pools that may be formed during the 3D printing process (e.g., FIGS. 8A-8B). The repetitive layered structure of the solidified melt pools may reveal the orientation at which the part was printed (e.g., FIGS. 8B-8C). The cross section may reveal a substantially repetitive microstructure or grain structure. The microstructure or grain structure may comprise (e.g., substantially repetitive) variations in material composition, grain orientation, material density, degree of compound segregation or of element segregation to grain boundaries, material phase, metallurgical phase, crystal phase, crystal structure, material porosity, or any combination thereof. The microstructure or grain structure may comprise substantially repetitive solidification of layered melt pools. The (e.g., substantially repetitive) microstructure may have an average layer width of at least about 0.5 µm, 1 µm, 5 µm, 10 µm, 20 µm, 30 µm, 40 µm, 50 µm, 60 µm, 70 µm, 80 µm, 90 µm, 100 µm, 150 µm, 200 µm, 250 µm, 300 µm, 350 µm, 400 µm, 450 µm, or 500 µm. The (e.g., substantially repetitive) microstructure may have an average layer width of at most about 500 µm, 450 µm, 400 µm, 350 µm, 300 µm, 250 µm, 200 µm, 150 µm, 100 µm, 90 µm, 80 µm, 70 µm, 60 µm, 50 µm, 40 µm, 30 µm, 20 µm, or 10 µm. The (e.g., substantially repetitive) microstructure may have an average layer size of any value between the aforementioned values of layer widths (e.g., from about 0.5 µm to about 500 µm, from about 15 µm to about 50 µm, from about 5 µm to about 150 µm, from about 20 µm to about 100 µm, or from about 10 µm to about 80 µm).

In some examples, the pre-transformed material within the material bed (e.g., powder bed) can provide support to the 3D object (e.g., during its formation). For example, the supportive pre-transformed material may be of the same type of pre-transformed material from which the 3D object is generated, of a different type, or any combination thereof. In some instances, a low flowability pre-transformed material (e.g., powder) can be capable of supporting a 3D object better than a high flowability pre-transformed material. A low flowability pre-transformed material can be achieved inter alia with a particulate material composed of relatively small particles, with particles of non-uniform size, and/or with particles that attract each other. The pre-transformed material may be of low, medium, or high flowability. In some examples, the pre-transformed material in the material bed may be flowable during the 3D printing. The particulate material may have compressibility of at least about 1%, 2%, 3%, 4%, 5%, 6%, 7%, 8%, 9%, or 10% in response to an applied force of 15 kilo Pascals (kPa). The particulate material may have a compressibility of at most about 9%, 8%, 7%, 6%, 5%, 4.5%, 4.0%, 3.5%, 3.0%, 2.5%, 2.0%, 1.5%, 1.0%, or 0.5% in response to an applied force of 15 kilo Pascals (kPa). The particulate material may have basic flow energy of at least about 100 milli-Joule (mJ), 200 mJ, 300 mJ, 400 mJ, 450 mJ, 500 mJ, 550 mJ, 600 mJ, 650 mJ, 700 mJ, 750 mJ, 800 mJ, or 900 mJ. The particulate material may have basic flow energy of at most about 200 mJ, 300 mJ, 400 mJ, 450 mJ, 500 mJ, 550 mJ, 600 mJ, 650 mJ, 700 mJ, 750 mJ, 800 mJ, 900 mJ, or 1000 mJ. The particulate material may have basic flow energy in between the above listed values of basic flow energy (e.g., from about 100 mj to about 1000 mJ, from about 100 mj to about 600 mJ, or from about 500 mj to about 1000 mJ). The particulate material may have a specific energy of at least about 1.0 milli-Joule per gram (mJ/g), 1.5 mJ/g, 2.0 mJ/g, 2.5 mJ/g, 3.0 mJ/g, 3.5 mJ/g, 4.0 mJ/g, 4.5 mJ/g, or 5.0 mJ/g. The powder may have a specific energy of at most 5.0 mJ/g, 4.5 mJ/g, 4.0 mJ/g, 3.5 mJ/g, 3.0 mJ/g, 2.5 mJ/g, 2.0 mJ/g, 1.5 mJ/g, or 1.0 mJ/g. The particulate material may have a specific energy in between any of the above values of specific energy (e.g., from about 1.0 mJ/g to about 5.0 mJ/g, from about 3.0 mJ/g to about 5 mJ/g, or from about 1.0 mJ/g to about 3.5 mJ/g).

The 3D object can have one or more auxiliary features. The auxiliary feature(s) can be supported by the material (e.g., powder) bed at least during the 3D printing. The term "auxiliary features," as used herein, generally refers to features that are part of a printed 3D object, but are not part of the desired, intended, designed, ordered, modeled, or final 3D object. Auxiliary features (e.g., auxiliary supports) may provide structural support during and/or subsequent to the formation of the 3D object. Auxiliary features may enable the removal or energy from the 3D object that is being formed. Auxiliary features may enable reduction of deformations of at least a portion of a generated 3D object, which deformations would otherwise manifest themselves in the printed 3D object. Examples of auxiliary features comprise heat fins, wires, anchors, handles, supports, pillars, columns, frame, footing, scaffold, flange, projection, protrusion, mold (a.k.a. mould), build platform, or other stabilization features. In some instances, the auxiliary support is a scaffold that encloses the 3D object or part thereof. The scaffold may comprise lightly sintered or lightly fused powder material. The 3D object can have auxiliary features that can be supported by the material bed (e.g., powder bed) and not touch the building platform (e.g., the base, substrate, container accommodating the material bed, or the bottom of the enclosure). The 3D part (3D object) in a complete or partially formed state can be completely supported by the material bed (e.g., without touching at least one of the platform, container accommodating the material bed, and enclosure). The 3D object in a complete or partially formed state can be completely supported by the material bed (e.g., without touching anything except the material bed). The material bed may comprise a flowable (e.g., not fixed) material during the 3D printing process. The 3D object in a complete or partially formed state can be suspended in the material bed without resting on any additional support structures. In some cases, the 3D object in a complete or partially formed state can freely float (e.g., anchorless) in the material bed.

Figure 9:
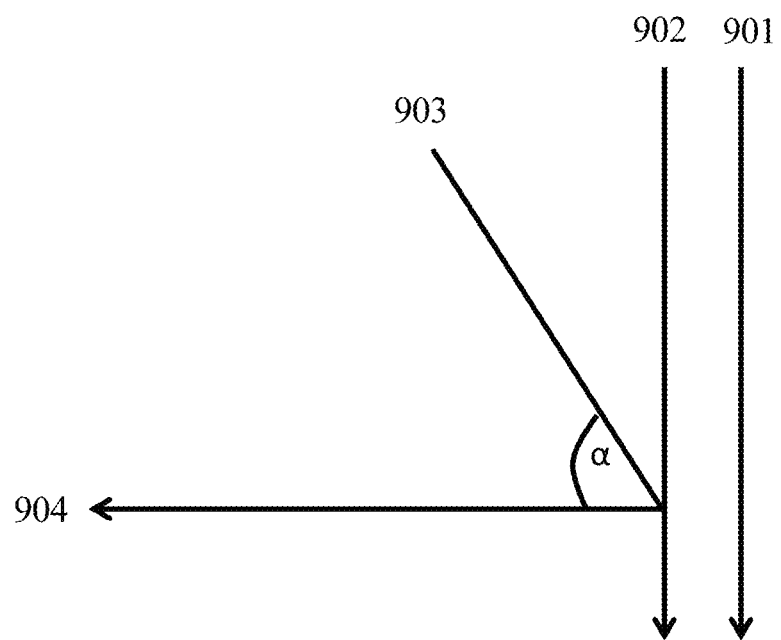
FIG. 9 schematically illustrates a coordinate system.
Figure 17:
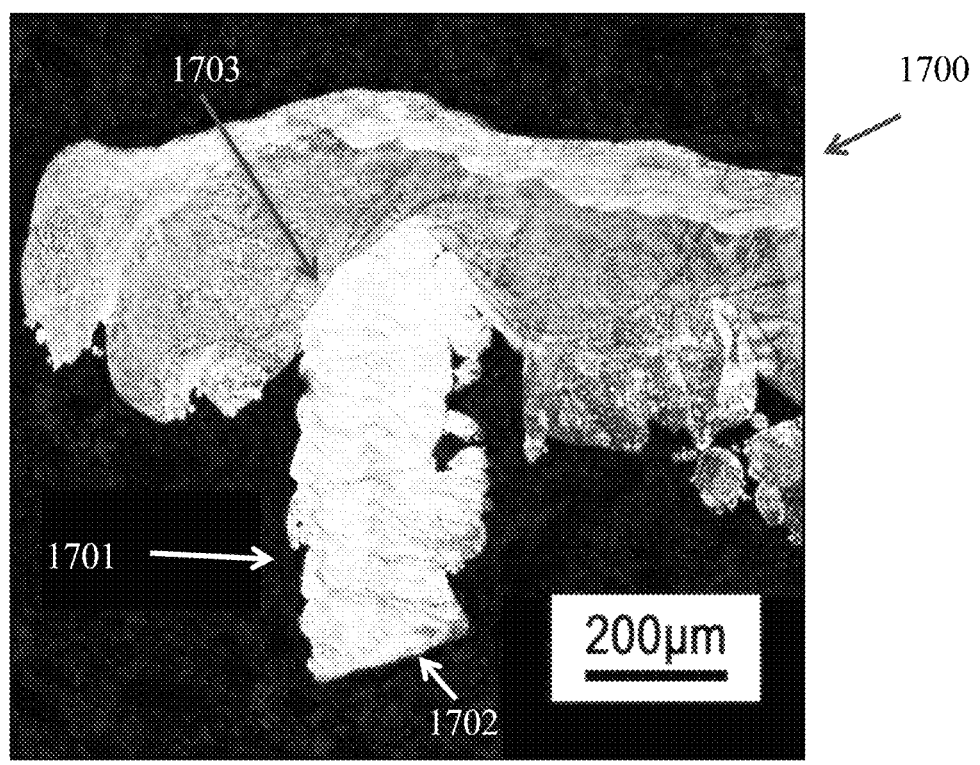
FIG. 17 shows a vertical cross section of a 3D object.

The printed 3D object may be 3D printed without the use of auxiliary features, may be printed using a reduced number of auxiliary features, or printed using spaced apart auxiliary features. In some embodiments, the printed 3D object may be devoid of one or more auxiliary support features (e.g., during the 3D printing) or auxiliary support feature marks that are indicative of a presence or removal of the auxiliary support features. The 3D object may be devoid of one or more auxiliary support features (e.g., during the 3D printing) and of one or more marks of an auxiliary feature (including a base structure) that was removed (e.g., subsequent to, or contemporaneous with, the generation of the 3D object). The printed 3D object may comprise a single auxiliary support mark. The single auxiliary feature (e.g., auxiliary support or auxiliary structure) may be a platform or a mold. The auxiliary support may be adhered to the platform and/or mold. The 3D object may comprise marks belonging to one or more auxiliary structures. FIG. 17 shows an example of a segment 1700 of a 3D object comprising an auxiliary support feature 1701 that has a point of discontinuity (e.g., trimming) 1702, which auxiliary support feature 1701 imparts a geometric deformation in the 3D object (e.g., 1703). In some embodiments, the 3D object comprises two or more marks belonging to auxiliary features. The 3D object may be devoid of marks pertaining to an auxiliary support(s). The mark may comprise variation in grain orientation, variation in layering orientation, layering thickness, material density, the degree of compound segregation to grain boundaries, material porosity, the degree of element segregation to grain boundaries, material phase, metallurgical phase, crystal phase, or crystal structure; wherein the variation may not have been created by the geometry of the 3D object alone, and may thus be indicative of a prior existing auxiliary support that was removed. The variation may be forced upon the generated 3D object by the geometry of the support (e.g., FIG. 17, 1703). In some instances, the 3D structure of the printed object may be forced by the auxiliary support (e.g., by a mold). For example, a mark may be a point of discontinuity (e.g., a trim or cut. E.g., FIG. 17, 1702) that is not explained by the geometry of the 3D object that is formed without any auxiliary supports. A mark may be a surface feature that cannot be explained by the geometry of a 3D object that is formed without any auxiliary supports (e.g., a mold). The two or more auxiliary features (or auxiliary support feature marks) may be spaced apart by a spacing distance of at least about 1.5 millimeters (mm), 2 mm, 2.5 mm, 3 mm, 3.5 mm, 4 mm, 4.5 mm, 5 mm, 5.5 mm, 6 mm, 6.5 mm, 7 mm, 7.5 mm, 8 mm, 8.5 mm, 9 mm, 9.5 mm, 10 mm, 10.5 mm, 11 mm, 11.5 mm, 12 mm, 12.5 mm, 13 mm, 13.5 mm, 14 mm, 14.5 mm, 15 mm, 15.5 mm, 16 mm, 20 mm, 20.5 mm, 21 mm, 25 mm, 30 mm, 30.5 mm, 31 mm, 35 mm, 40 mm, 40.5 mm, 41 mm, 45 mm, 50 mm, 80 mm, 100 mm, 200 mm 300 mm, or 500 mm. The two or more auxiliary support features or auxiliary support feature marks may be spaced apart by a spacing distance of any value between the aforementioned auxiliary support space values (e.g., from 1.5 mm to 500 mm, from 2 mm to 100 mm, from 15 mm to 50 mm, or from 45 mm to 200 mm). Collectively referred to herein as the "auxiliary feature spacing distance."

he 3D object may comprise a layered structure that is indicative of 3D printing process, which includes one, two, or more auxiliary support marks. The supports or support marks can be on the surface of the 3D object. The auxiliary supports or support marks can be on an external, on an internal surface (e.g., a cavity within the 3D object), or both. The layered structure can have a layering plane (e.g., FIG. 8C, 805). In one example, two auxiliary support features or auxiliary support feature marks present in the 3D object may be spaced apart by the auxiliary feature spacing distance. The acute (i.e., sharp) angle alpha between the straight line connecting the two auxiliary supports or auxiliary support marks and the direction of normal to the layering plane may be at least about 45 degrees(°), 50°, 55°, 60°, 65°, 70°, 75°, 80°, or 85°. The acute angle alpha between the straight line connecting the two auxiliary supports or auxiliary support marks and the direction of normal to the layering plane may be at most about 90°, 85°, 80°, 75°, 70°, 65°, 60°, 55°, 50°, or 45°. The acute angle alpha between the straight line connecting the two auxiliary supports or auxiliary support marks and the direction of normal to the layering plane may be any angle range between the aforementioned angles (e.g., from about 45 degrees(°), to about 90°, from about 60° to about 90°, from about 75° to about 90°, from about 80° to about 90°, from about 85° to about 90°). The acute angle alpha between the straight line connecting the two auxiliary supports or auxiliary support marks and the direction normal to the layering plane may from about 87° to about 90°. An example of layering planes can be seen in FIG. 2 showing a vertical cross section of a 3D object 211 that comprises layer numbers 1 to 6, each of which are (e.g., substantially) planar. In the schematic example in FIG. 2, the layering plane of the layers can be the layer of hardened material. For example, layer 1 could correspond to both the layer of hardened material and the layering plane of layer 1. When the layer is not planar (e.g., FIG. 2, layer 5 of 3D object 212), the layering plane may be the average (or mean) plane of the layer of hardened material. The two auxiliary supports or auxiliary support feature marks can be on the same surface. The same surface can be an external surface or an internal surface of the 3D object (e.g., a surface of a cavity within the 3D object). When the angle between the shortest straight line connecting the two auxiliary supports or auxiliary support marks and the direction of normal to the layering plane is greater than 90° (degrees), one can consider the complementary acute angle. In some embodiments, any two auxiliary supports or auxiliary support marks are spaced apart by the auxiliary feature spacing distance. FIG. 8C shows an example of a 3D object comprising an exposed surface 801 that was comprises layers of hardened material (e.g., having layering plane 805) that are (e.g., substantially) parallel to the platform 803. FIG. 8C shows an example of a 3D object comprising an exposed surface 802 that comprises layers of hardened material (e.g., having layering plane 806) that are substantially parallel to the platform 803 resulting in a tilted 3D object (e.g., box). The 3D object that was formed as a tilted 3D object (comprising 802 and 806), is shown after it printing as lying flat on a surface 809 having an exposed surface 804 and layers of hardened material (e.g., having layering plane 807) having a normal 808 to the layering plane (e.g., 807) that forms acute angle alpha with the exposed surface 804 of the 3D object (or with the platform 809). FIGS. 8A and 8B show 3D objects comprising layers of solidified melt pools that are arranged in layers having layering planes (e.g., 820). FIG. 9 shows a vertical cross section in a coordinate system. Line 904 represents a vertical cross section of the top surface of a material bed and/or a platform. Line 903 represents a normal to the average layering plane. Line 902 represent the normal to the top surface of the material bed and/or platform. Line 901 represents the direction of the gravitational field.

The one or more auxiliary features (which may include a base support) can be used to hold or restrain the 3D object during its formation. In some cases, auxiliary features are used to anchor or hold a 3D object or a portion of a 3D object in a material bed. The one or more auxiliary features can be specific to a 3D part and can increase the time needed to form it. The one or more auxiliary features can be removed subsequent to the 3D printing, and prior to use or distribution of the 3D object. The FLS (e.g., longest dimension) of a cross-section of an auxiliary feature can be at most about 50 nm, 100 nm, 200 nm, 300 nm, 400 nm, 500 nm, 600 nm, 700 nm, 800 nm, 900 nm, or 1000 nm, 1 μm, 3 μm, 10 μm, 20 μm, 30 μm, 100 μm, 200 μm, 300 μm, 400 μm, 500 μm, 700 μm, 1 mm, 3 mm, 5 mm, 10 mm, 20 mm, 30 mm, 50 mm, 100 mm, or 300 mm. The FLS (e.g., longest dimension) of a cross-section of an auxiliary feature can be at least about 50 nm, 100 nm, 200 nm, 300 nm, 400 nm, 500 nm, 600 nm, 700 nm, 800 nm, 900 nm, or 1000 nm, 1 μm, 3 μm, 10 μm, 20 μm, 30 μm, 100 μm, 200 μm, 300 μm, 400 μm, 500 μm, 700 μm, 1 mm, 3 mm, 5 mm, 10 mm, 20 mm, 30 mm, 50 mm, 100 mm, or 300 mm. The longest dimension of a cross-section of an auxiliary feature can be any value between the above-mentioned values (e.g., from about 50 nm to about 300 mm, from about 5 μm to about 10 mm, from about 50 nm to about 10 mm, or from about 5 mm to about 300 mm).

Eliminating the need for auxiliary features can decrease the time and/or cost associated with generating the 3D part. In some examples, the 3D object is formed with auxiliary support features. In some examples, the 3D object is formed with contact to the container accommodating the material bed (e.g., side(s) and/or bottom of the container). In some examples, the diminished number of auxiliary supports or lack of one or more auxiliary support, provides a 3D printing process that requires a smaller amount of material, produces a smaller amount of material waste, and/or requires smaller energy as compared to commercially available 3D printing processes. The smaller amount can be smaller by at least about 1.1, 1.3, 1.5, 2, 3, 4, 5, 6, 7, 8, 9, or 10. The smaller amount may be smaller by any value between the aforesaid values (e.g., from about 1.1 to about 10, or from about 1.5 to about 5).

At least a portion of the 3D object can sink in the material bed. At least a portion of the 3D object can be surrounded by pre-transformed material within the material bed (e.g., submerged). At least a portion of the 3D object can rest in the pre-transformed material without substantial sinking (e.g., vertical movement). Lack of substantial sinking can amount to a sinking (e.g., vertical movement) of at most about 40%, 20%, 10%, 5%, or 1% layer thickness. Lack of substantial sinking can amount to at most about 100 μm, 30 μm, 10 μm, 3 μm, or 1 μm. At least a portion of the 3D object can rest in the pre-transformed material without substantial movement (e.g., horizontal movement, movement at an angle). Lack of substantial movement can amount to at most 100 μm, 30 μm, 10 μm, 3 μm, or 1 μm. The 3D object can rest on the substrate when the 3D object is sunk or submerged in the material bed.

At least a fraction of the components in the system can be enclosed in the chamber. At least a fraction of the chamber can comprise a gas to create a gaseous environment (i.e., an atmosphere). The gas can comprise an inert gas. The gas can be a non-reactive gas (e.g., an inert gas). The gaseous environment can comprise argon, nitrogen, helium, neon, krypton, xenon, hydrogen, carbon monoxide, or carbon dioxide. The 3D printing system, it apparatuses, and features can be any of those disclosed in Provisional Patent Application Ser. No. 62/396,584, that was filed on Sep. 19, 2016, titled "APPARATUSES, SYSTEMS AND METHODS FOR THREE-DIMENSIONAL PRINTING," which is incorporated herein by reference in its entirety. The features can include, for example, the pressure in the enclosure (e.g., chamber), or its gaseous layers. The apparatuses can comprise the controller, layer dispensing mechanism (and its components), sensor, motor, valve, or pump. The components of the layer dispensing mechanism can comprise the material dispensing mechanism, leveling mechanism, or material removal mechanism. In some cases, the pressure in the chamber is standard atmospheric pressure. In some cases, the pressure in the chamber can be ambient pressure (e.g., neutral pressure). In some examples, the chamber can be under vacuum pressure. In some examples, the chamber can be under a positive pressure.

A thermal control unit (e.g., a cooling member such as a heat-sink (or a cooling plate), a heating plate, or a thermostat) can be provided inside of the region where the 3D object is formed or adjacent to (e.g., above) the region where the 3D object is formed. Additionally, or alternatively, the thermal control unit can be provided outside of the region where the 3D object is formed (e.g., at a predetermined distance). In some cases, the thermal control unit can form at least one section of a boundary region where the 3D object is formed (e.g., the container accommodating the powder bed).

In another aspect, a system for forming a 3D object comprises: a material bed disposed adjacent to a platform comprising a first structure having a bottom surface with a first curvature that is negative, which structure comprises a hardened material; an energy source generating an energy beam that transforms at least a portion of the material bed into a transformed material; and at least one controller operatively coupled to the material bed and to the energy beam and is programmed to direct the energy beam (e.g., along a path) to transform at least a portion of the material bed into a transformed material that couples to the top of the first structure to form a second structure, wherein a bottom of the second structure has a second curvature that is greater than the first curvature, wherein the first curvature is negative when a volume bound from the bottom surface to the platform is a convex object, which bottom surface is disposed above the platform, wherein bottom faces the platform, wherein top faces away from the platform. The transformed material may be part of the 3D object. The transformed material may be a hard material (e.g., in the case of photo-polymerization). The transformed material may subsequently harden into a hardened material as part of the 3D object (e.g., in the case of metal powder being molten and subsequently solidified). The controller may comprise a plurality of controllers.

In another aspect, a system for forming a 3D object comprises: a material dispensing mechanism (e.g., material dispenser) that dispenses a pre-transformed material to form a material bed comprising a first layer of hardened material, (e.g., which material bed is disposed adjacent to (e.g., above) a platform); an energy source generating an energy beam that transforms at least a portion of the material bed into a transformed material; and at least one controller operatively coupled to the material dispensing mechanism and to the energy beam and is programmed to: (i) direct the material dispenser to dispense a layer of pre-transformed material above the first layer of hardened material; (ii) direct the energy beam (e.g., along a path) to generate a second layer of hardened material from at least a portion of the layer of pre-transformed material, wherein the first layer of hardened material is separated from the second layer of hardened material by a gap, wherein the first layer of hardened material and the second layer of hardened material form at least a portion of the 3D object. The gap may comprise a material that is less dense than either the first layer of hardened material and the second layer of hardened material. Above may be relative to a direction away from the platform and/or opposite to the gravitational force. An exposed surface (e.g., top surface) of the disposed layer of pre-transformed material may be substantially leveled. The at least one controller can be a first controller that is operatively coupled to the material dispensing mechanism, and a second controller that is operatively coupled to the energy beam. The first and second controllers can be different controllers. A third controller can be operatively coupled to the energy source. The third controller can be different than at least the first or second controller. The third controller can be the same controller as at least the first or second controller.

In another aspect, a system for forming a 3D object comprises: a material dispensing mechanism that dispenses a pre-transformed material to form a material bed that comprises a hardened material; an energy source generating an energy beam that transforms at least a portion of the material bed into a transformed material; a cooling member; and at least one controller operatively connected to the material dispenser, energy beam, and cooling member and is programmed to: (i) direct the material dispenser to dispense a layer of pre-transformed material adjacent to (e.g., above) the hardened material; (ii) direct the energy beam (e.g., along a path) to transform (e.g., melt) a portion of the layer of pre-transformed material to form a transformed (e.g., molten) portion; (iii) direct the cooling member to harden (e.g., solidify) the exposed surface of the transformed portion while keeping the interior of the transformed portion in the transformed state; and (iv) direct the cooling member to harden the transformed portion to form at least a portion of the 3D object. The at least one controller can be a plurality of controllers, wherein at least two of the operations (i) to (iv) are controlled by different controllers. The at least one controller can be a plurality of controllers, wherein at least two of the operations (i) to (iv) are controlled by the same controller.

In another aspect, a system for forming a 3D object comprises: a material dispensing mechanism that dispenses a pre-transformed material to form a material bed, which material bed comprises a first hardened material; an energy source generating an energy beam that transforms at least a portion of the pre-transformed material; a cooling member; and at least one controller operatively coupled to the material dispenser, the energy beam, and the cooling member, and is programmed to: (i) direct the material dispenser to dispose a layer of pre-transformed material adjacent to (e.g., above) the first hardened material; (ii) direct the energy beam (e.g., along a path) to transform a portion of the layer of pre-transformed material and a portion of the first hardened material to form a transformed (e.g., molten) portion and a remainder of the first hardened material; and (iii) optionally direct the cooling member to harden the transformed portion to form a second hardened material and plastically deform a region comprising (1) a portion of the second hardened material, and (2) a portion of the remainder of the first hardened material that is bordering the second hardened material, wherein the region comprises an exposed surface and an interior. In some examples, the exposed surface ceases to plastically deform before the interior ceases to plastically deform. In some examples, the exposed surface ceases to plastically deform when the interior ceases to plastically deform. In some examples, the exposed surface ceases to plastically deform after the interior ceases to plastically deform. The cooling member may be a heat-sink. The cooling member may be passive or active (e.g., comprise a moving coolant).

In another aspect, a system for forming a 3D object comprises: a material bed comprising pre-transformed material; an energy source generating an energy beam that transforms at least a portion of the material bed; and at least one controller that is operatively coupled to the material bed and to the energy beam, and is programmed to direct the energy beam (e.g., along a path) to transform at least a portion of a material bed and (directly or subsequently) form the 3D object comprising one or more layer portions having successive melt pools of a hardened (e.g., solidified) material, wherein the 3D object comprises a surface, and interior, and a grain structure. The grain structure closer to the surface may be indicative of a greater (e.g., faster) solidification rate than the grain structure in the interior. The grain structure may be a microstructure. The grain structure may comprise a metallurgical and/or crystal structure.

In another aspect, a system for forming a 3D object comprises: a material bed comprising pre-transformed material; an energy source generating an energy beam that transforms at least a portion of the material bed; and at least one controller that is operatively coupled to the material bed and to the energy beam, and is programmed to direct the energy beam (e.g., along a path) to transform at least a portion of a material bed and form the 3D object (or a portion thereof) comprising one or more layer portions having successive solidified melt pools of a material type, wherein the 3D object comprises a surface, an interior, and material microstructures (e.g., crystals. E.g., dendrites or cells). The material microstructures closer to the surface may be indicative of a greater, lower, or substantially equal solidification rate than the material microstructures in the interior. For example, the material microstructures closer to the surface may be indicative of a greater solidification rate than the (e.g., respective) material microstructures in the interior.

In another aspect, a system for forming a 3D object comprises: a material bed disposed adjacent to (e.g., above) a platform, which material bed comprising a first hardened material that comprises a bottom surface facing towards the platform; a first energy source generating a first (e.g., radiation of) heat energy that heats (e.g., but not transforms, such as melts) at least a portion of the first hardened material; a second energy source that generates a second energy beam that melts a portion of the heated portion to form a molten portion; an optional cooling member; and at least one controller operatively coupled to the material bed, the first heating energy, the second energy beam, and the optional cooling member, and is programmed to: (i) direct the first heat energy to heat at least a portion of the first hardened material to form a heated (e.g., but not transformed) portion; (ii) direct the second energy beam to transform (e.g., melt) at least a portion of the heated portion to form a transformed (e.g., molten) portion; and (iii) direct the cooling member to cool the transformed portion to form a second hardened material that comprises a bottom surface facing towards the platform. The bottom surface of the first hardened material may have a first curvature that is of a higher value than a second curvature of the bottom surface of the second hardened material. The bottom surface may have a negative curvature when a volume bound from the bottom surface to the platform is a convex object, which bottom surface is disposed above the platform. The material forming the 3D object (e.g., the first hardened material) may substantially exclude a resin and/or a polymer. The polymer may comprise repeating molecular units. The polymer and/or resin may be organic (e.g., comprise both hydrogen and carbon atoms). The first energy source and the second energy source may be the same energy source. The first energy source and the second energy source may be different energy sources. The first heat energy may not transform the hardened material (e.g., only heat but not transform). The first heat energy may comprise a first energy beam. The first energy beam and the second energy beam may be the same energy beam. The first energy beam and the second energy beam may be different energy beams. The first heat energy may be a radiative heat source. The at least one controller can be a plurality of controllers, wherein at least two of the operations (i) to (iii) are controlled by different controllers (e.g., different controllers). The at least one controller can be a plurality of controllers, wherein at least two of the operations (i) to (iii) are controlled by the same controller.

In another aspect, a system for forming a 3D object comprises: an energy source generating an energy beam that transforms at least a portion of a material bed into a transformed material, which material bed comprises pre-transformed material and is disposed in an enclosure; a first cooling member that (i) cools the material bed, (ii) is translatable, and (iii) is disposed within the enclosure; a second cooling member that cools the first cooling member, which second cooling member is not disposed in the enclosure; and at least one controller that is operatively coupled to the energy source, the first cooling member, and the second cooling member, and is programmed to: (i) direct the energy beam (e.g., along a path) to transform at least a portion of the material bed into a transformed material; (ii) direct the first cooling member to cool the material bed; and (iii) direct the second cooling member to cool the first cooling member. The second cooling member may be disposed outside of the enclosure. The second cooling member may be part of a coating of the enclosure. The coating may be a wall or a rim. The first cooling member may be disposed adjacent to (e.g., above) the material bed. Adjacent may be above, below, or to the side. In some embodiments, adjacent may be above. Above may be in the direction opposite to the building platform. The at least one controller can be a plurality of controllers, wherein at least two of the operations (i) to (iii) are controlled by different controllers. The at least one controller can be a plurality of controller, wherein at least two of the operations (i) to (iii) are controlled by the same controller.

In another aspect, an apparatus for forming a 3D object comprises at least one controller that is operatively coupled to an energy beam and is programmed to direct the energy beam (e.g., along a path) to transform at least a portion of a material bed into a transformed material that couples to (e.g., attaches, merges, and/or contacts) a top of a first structure to form a second structure. The first structure may have a bottom surface having a first curvature that is negative and is disposed in the material bed. In some embodiments, a bottom of the second structure has a second curvature that is greater than the first curvature. In some embodiments, a bottom of the second structure has a second curvature that is smaller, substantially equal, or greater than the first curvature. The first curvature may be negative when a volume bound from the bottom surface to the platform is a convex object. The bottom surface may be disposed above the platform. The bottom may face the platform. The top may face away from the platform. The transformed material may harden into a hardened material as part of the 3D object. The transformed material may form at least a portion of the 3D object.

The at least one controller may be operatively coupled to a leveling member and is programmed to direct the leveling member to level the exposed surface of the material bed. The at least one controller may be operatively coupled to a material removal member and is programmed to direct the material removal member to remove material from the material bed. The removal of the material (e.g., pre-transformed material) from the material bed may result in a substantially planar (e.g., flat) exposed surface of the material bed. The removal may exclude contacting the exposed surface of the material bed. The at least one controller can comprise a plurality of controllers, wherein at least two of the leveling member, material removal member, and energy beam are controlled by different controllers. The at least one controller can comprise a plurality of controllers, wherein at least two of leveling member, material removal member, and energy beam are controlled by the same controller. In some examples, the material removal member comprises a material entrance opening and/or a material reservoir where the removed material is collected. In some examples, the leveling member comprises a blade, roller, or reservoir where removed material is collected.

In another aspect, an apparatus for forming a 3D object comprises at least one controller that is programmed to direct a material dispensing mechanism to dispose an upper layer of pre-transformed material above a first layer of hardened material disposed in a material bed that comprises the pre-transformed material, which material bed is disposed adjacent to a platform; and direct an energy beam (e.g., along a path) to generate a layer of hardened material from at least a portion of the upper layer of pre-transformed material, wherein the first layer of hardened material is separated from the second layer of hardened material by a gap. The gap may comprise a material that is less dense than either the first layer of hardened material and/or the second layer of hardened material. For example, the gap may comprise pre-transformed material, or sintered material (e.g., that is porous). The at least one controller may be operatively coupled to the material dispenser and/or to the energy beam. Above may be relative to a direction away from the platform and/or a direction opposite to the gravitational field. The at least one controller can comprise a first controller that is operatively coupled to the material dispensing mechanism, and a second controller that is operatively coupled to the energy beam. The first and second controllers can be different controllers. A third controller can be operatively coupled to the energy source. The third controller can be different than at least the first or second controller. The third controller can be the same controller as at least the first or second controller.

In some examples, the material dispensing mechanism is integrated in a layer dispensing mechanism. The layer dispensing mechanism may comprise a material dispensing mechanism, a leveling mechanism, or a material removal mechanism. The at least one controller may be operatively coupled to a leveling member and may be programmed to direct the leveling member to level the exposed surface of the material bed. The at least one controller may be operatively coupled to a material removal member and may be programmed to direct the material removal member to remove material from the material bed. The removal of the material from the material bed may result in a substantially planar (e.g., flat) exposed surface of the material bed. The removal may exclude contacting the exposed surface of the material bed (e.g., by using electrostatic force, magnetic force, and/or gas flow. The gas flow may comprise negative pressure). The at least one controller can comprise a plurality of controllers, wherein at least two of the mechanisms and the energy beam are controlled by different controllers. The at least one controller can comprise a plurality of controllers, wherein at least two of the mechanisms and the energy beam are controlled by the same controller. The material dispensing mechanism may comprise an external 3D surface (e.g., planar surface) that is slanted, an exit opening through which pre-transformed material exits an internal reservoir of the material dispensing mechanism, an entrance opening through which pre-transformed material enters the internal reservoir of the material dispensing mechanism, or an internal reservoir in which the pre-transformed material resides within the material dispensing mechanism. The material removal mechanism may comprise an exit opening through which removed material exits an internal reservoir of the material dispensing mechanism, an entrance opening through which removed material enters the internal reservoir of the material dispensing mechanism, or an internal reservoir in which the removed material resides within the material removal mechanism. The removed material may comprise pre-transformed mater. The removed material may be removed from the material bed (e.g., during the 3D printing process). The leveling mechanism comprises a blade or a roller.

In another aspect, an apparatus for forming a 3D object comprises at least one controller that is programmed to direct a material dispensing mechanism to dispose a layer of pre-transformed material on a hardened material disposed in a material bed, which at least one controller is operatively coupled to the material dispensing mechanism; direct an energy beam (e.g., along a path) to melt a portion of the layer of pre-transformed material to form a transformed (e.g., molten) portion, which at least one controller is operatively coupled to the energy beam; optionally direct a cooling member to harden the exposed surface of the transformed portion while keeping the interior of the transformed portion in a transformed state (e.g., molten), which cooling member is operatively coupled to the at least one controller; and direct the cooling member to harden the transformed portion to form at least a portion of the 3D object.). The at least one controller can comprise a plurality of controllers, wherein at least two of the material dispensing mechanism, optional cooling member and the energy beam are controlled by different controllers. The at least one controller can comprise a plurality of controller, wherein at least two of the material dispensing mechanism, optional cooling member and the energy beam are controlled by the same controller.

In another aspect, an apparatus for forming a 3D object comprises at least one controller that is programmed to: direct a layer dispensing mechanism to dispense a layer of pre-transformed material on a hardened material that is disposed in the material bed, wherein the at least one controller is operatively coupled to the layer dispensing mechanism; direct an energy beam (e.g., along a path) to transform (e.g., melt) a portion of the layer of pre-transformed material and a portion of the first hardened material to form a transformed (e.g., molten) portion and a remainder of the first hardened material, wherein the at least one controller is operatively coupled to the energy beam; and direct an optional cooling member to harden (e.g., solidify) the transformed portion to form a second hardened material and plastically deform a region comprising (i) a portion of the second hardened material, and/or (ii) a portion of the remainder of the first hardened material that is bordering the second hardened material. The region may comprise an exposed surface and an interior. The exposed surface may cease to plastically deform before the interior ceases to plastically deform. The hardening may form at least a portion of the 3D object. The at least one controller may be operatively coupled to the cooling member. The at least one controller can comprise a plurality of controllers, wherein at least two of the layer dispensing mechanism, optional cooling member and the energy beam are controlled by different controllers. The at least one controller can be a plurality of controllers, wherein at least two of the layer dispensing mechanism, optional cooling member and the energy beam are controlled by the same controller.

The controller may be operatively coupled and/or direct the function of any of the components of the layer dispensing mechanism. The controller may be operatively coupled to a leveling member (e.g., mechanism) and is programmed to direct the leveling member to level the exposed surface of the material bed (e.g., to form a planar exposed surface of the material bed). The controller may be operatively coupled to a material removal member. The controller may be operatively coupled to a material dispensing mechanism.

In another aspect, an apparatus for forming a 3D object comprises at least one controller that is programmed to direct an energy beam (e.g., along a path) to transform at least a portion of a material bed and form a 3D object comprising one or more layer portions (e.g., FIG. 11E, 1117a and 1117b) having successive solidified melt pools of a material wherein the 3D object comprises a surface, and interior, and a grain structure, wherein the grain structure closer to the surface is indicative of a greater solidification rate than the grain structure in the interior, wherein the controller is operatively coupled to the material bed and to the energy beam. The one or more layer portions may be one, two or more layer portions. An example of material melt pools can be seen in the examples in FIGS. 8A and 8B. A portions may be a part, segment, fraction, piece, and/or section.

The interior may be a symmetric interior (e.g., in the center of the 3D object or a cross section thereof), or an asymmetric interior. The asymmetric interior is not in the center of the 3D object or a portion thereof. The asymmetric interior is at a side of the 3D object or a section thereof. In some examples, the interior may be close to the rim and/or surface of the 3D object.

In another aspect, an apparatus for forming a 3D object comprises at least one controller that is programmed to direct an energy beam (e.g., along a path) to transform at least a portion of a material bed and form a 3D object (e.g., comprising one or more layer portions having successive solidified melt pools of a material). The 3D object may comprise a surface, an interior, and material microstructures (e.g., dendrites). The material microstructures closer to the surface may be indicative of a greater, smaller, or substantially similar solidification rate than the (e.g., respective) material microstructures in the interior. The material microstructures closer to the surface may be indicative of a greater (e.g., swifter, quicker, and/or faster) solidification rate than the material microstructures in the interior. The at least one controller may be operatively coupled to the material bed and to the energy beam.

In another aspect, an apparatus for forming a 3D object comprises at least one controller that is programmed to direct a material dispensing mechanism to dispense pre-transformed material to form a material bed (e.g., disposed adjacent to a platform), which material bed comprises a first hardened material that includes a bottom surface facing towards the platform; directing a first heat (e.g., radiative) energy to heat at least a portion (e.g., the entire portion) of the first hardened material; direct a second energy beam to transform (e.g., melt) a portion of the heated portion to form a transformed (e.g., molten) portion; direct an optional cooling member to cool the transformed portion to form a second hardened material that comprises a bottom surface facing towards the platform. The bottom surface of the first hardened material may have a first curvature that is higher (e.g., of higher value) than a second curvature of the bottom surface of the second hardened material. The bottom surface may have a negative curvature when a volume bound from the bottom surface to the platform is a convex object. The bottom surface may be disposed adjacent to (e.g., above) the platform. The first hardened material may substantially exclude a resin and/or a polymer. The polymer may comprise repeating molecular units. The polymer and/or resin may be organic. The at least one controller may be operatively coupled to the material dispenser, the first heat energy, the second energy beam, and/or the cooling member. The at least one controller may comprise a plurality of controllers. In some embodiments, at least two of the material dispenser, the first heat energy, the second energy beam, and the cooling member are directed by the same controller. In some embodiments, at least two of the material dispenser, the first heat energy, the second energy beam, and the cooling member are directed by different controllers.

In another aspect, an apparatus for forming a 3D object comprises at least one controller that is programmed to direct an energy beam (e.g., along a path) to transform at least a portion of a material bed into a transformed material; direct a first cooling member to cool the material bed; and direct a second cooling member to cool the first cooling member, wherein the at least one controller is operatively coupled to the energy beam, the first cooling member, and the second cooling member. The cooling member may be translatable (e.g., movable). The translation may be automatic and/or manual. The translation may be controlled (e.g., regulated and/or directed) by the controller. The translation may be at predetermined times (e.g., programmed) or at a whim (e.g., spontaneous). The at least one controller may be a plurality of controllers. In some embodiments, at least two of the energy beam, the first cooling member, and the second cooling member are directed by the same controller. In some embodiments, at least two of the energy beam, the first cooling member, and the second cooling member are directed by different controllers.

In another aspect, an apparatus for forming a 3D object comprises at least one controller that is programmed to direct an energy beam to transform the at least a portion of the material bed to form the 3D object; direct one or more sensors to measure one or more temperatures, energy beam powers, or metrology values (e.g., heights) of one or more points on the at least a portion of the 3D object; and control the energy beam with at least one processor based on the measured one or more temperatures, energy beam powers, or metrology values. The at least one processor may comprise at least 3 Tera floating point operations per second, according to a benchmark. The at least one processor that controls the energy beam may additionally or alternatively be based on the geometry of the at least a portion of the 3D object. The at least one controller may be a plurality of controllers. In some embodiments, the energy beam and the sensors are directed by different controllers. In some embodiments, the energy beam and the sensors are directed by the same controller.

In another aspect, an apparatus for forming a 3D object comprises a material bed comprising a first structure of hardened material; and an energy source generating an energy beam, which energy source is disposed adjacent to the material bed, which energy beam transforms at least a portion of the material bed into a transformed material that couples to (e.g., attaches and/or borders) a top surface of a first structure to form a second structure, which first structure has a bottom surface with a first curvature that is negative. A bottom surface of the second structure may have a second curvature that is greater than the first curvature. The first curvature may be negative when a volume bound from the bottom surface to the platform is a convex object, which bottom surface is disposed above the platform. The bottom may face the platform. The top surface may face away from the platform. The energy beam may travel along a path while it transforms at least a portion of the material bed into a transformed material. The first structure may be disposed in the material bed. The transformed material may harden into a hardened material as part of the 3D object. The transformed material may be the hardened material as part of the 3D object. In some embodiments, the bottom (e.g., surface and/or layer) of the second structure may have a second curvature that is greater, smaller, or substantially equal to the first curvature.

In another aspect, an apparatus for forming a 3D object comprises a material bed comprising an upper layer of pre-transformed material above a first layer of hardened material that is embedded in pre-transformed material within the material bed, which material bed is disposed adjacent to a platform; and an energy source generating an energy beam generates a layer of hardened material from at least a portion of the upper layer of pre-transformed material (e.g., while travels along a path), wherein the first layer of hardened material is separated from the second layer of hardened material by a gap. The gap may comprise a material that is less dense than the first layer of hardened material and/or the second layer of hardened material. The energy source may be disposed adjacent to the material bed.

In another aspect, an apparatus for forming a 3D object comprises a material bed comprising a layer of pre-transformed material on a hardened material; an energy source generating an energy beam that transforms (e.g., melts) a portion of the layer of pre-transformed material to form a transformed (e.g., molten) portion, which energy source is disposed adjacent to the material bed; a cooling member that (i) hardens the exposed surface of the transformed portion while keeping the interior of the transformed portion in a transformed (e.g., molten) state, and/or (ii) hardens the transformed portion to form at least a portion of the 3D object. The cooling member may be disposed adjacent to (e.g., above) the material bed. The energy beam may travel along a path. The material bed may be disposed adjacent to a platform. The cooling member may be disposed above the material bed.

Above may be relative to a direction away from the platform and/or opposite to the direction of the gravitational field.

In another aspect, an apparatus for forming a 3D object comprises a material bed comprising a layer of pre-transformed material on a hardened material; an energy source generating an energy beam that transforms (e.g., melts) a portion of the layer of pre-transformed material and a portion of the first hardened material to form a transformed (e.g., molten) portion and a remainder of the first hardened material; and a cooling member that hardens the transformed portion to form a second hardened material and plastically deform a region comprising (i) a portion of the second hardened material, and/or (ii) a portion of the remainder of the first hardened material that is bordering the second hardened material, wherein the region comprises an exposed surface and an interior. The exposed surface may cease to plastically deform before the interior ceases to plastically deform. The exposed surface may cease to plastically deform before, after, or substantially simultaneously when the interior ceases to plastically deform. The hardening may form at least a portion of the 3D object. The cooling member may be disposed adjacent to the material bed. The portion of the remainder of the first hardened material may contact the second hardened material at one or more positions. The energy beam may be disposed adjacent to the material bed. The material bed may be disposed adjacent to a platform. The cooling member may be disposed above the material bed.

In another aspect, an apparatus for forming a 3D object comprises a material bed comprising pre-transformed material; and an energy source generating a beam that transforms at least a portion of the material bed and forms a 3D object comprising one or more layer portions having successive solidified melt pools of a material, wherein the 3D object comprises a surface, and interior, and a grain structure. The grain structure closer to the surface may be indicative of a greater solidification rate (e.g., faster, quicker, swifter) than the grain structure in the interior. The controller may be operatively coupled to the material bed and/or to the energy beam. The energy beam may be disposed adjacent to the material bed. The energy beam may travel along a path.

In another aspect, an apparatus for forming a 3D object comprises a material bed; and an energy beam that transforms at least a portion of the material bed and form a 3D object comprising one or more layer portions (e.g., having successive solidified melt pools of a material), wherein the 3D object comprises a surface, interior, and material microstructure. The material microstructure closer to the surface may be indicative of a greater, smaller, or substantially similar hardening rate than the (e.g., respective) material microstructure in the interior. The material microstructure closer to the surface may be indicative of a greater hardening rate than the dendrites in the interior. In some examples, the controller is operatively coupled to the material bed and to the energy beam that is disposed adjacent to the material bed. The hardening rate may be a solidification rate (e.g., of the transformed material).

In another aspect, an apparatus for forming a 3D object comprises a material bed disposed adjacent to a platform, which material bed comprises a first hardened material that comprises a first bottom surface facing towards the platform; a first energy source generating a first heat energy that heats (e.g., but doesn't transform) at least a portion of the first hardened material, which first energy source is disposed adjacent to the material bed; a second energy source generating a second energy beam that transforms (e.g., melts) a portion of the heated portion to form a transformed (e.g., molten) portion, which second energy source is disposed adjacent to the material bed; and an optional cooling member that cools the transformed portion to form a second hardened material that comprises a second bottom surface facing towards the platform.

The cooling member may be disposed adjacent to the material bed. The first bottom surface may have a first curvature that is of a higher value than a second curvature of the second bottom surface. The first bottom surface or second bottom surface may have a negative curvature when a volume bound from the bottom surface to the platform is a convex object. The first bottom surface and/or second bottom surface may be disposed above the platform. The first hardened material may substantially exclude a resin and/or a polymer. The first bottom surface may have a first curvature that is of a higher, lower, or substantially similar value as compared to the second curvature of the second bottom surface. The cooling member may be disposed above the exposed surface of the material bed. The cooling member may be movable. For example, the cooling member may be translatable to and away from a position above the transformed (e.g., molten) portion.

In another aspect, an apparatus for forming a 3D object comprises a material bed disposed in an enclosure; an energy source generating an energy beam that travels along a path to transform at least a portion of a material bed into a transformed material; a first cooling member that (i) cools the material bed, (ii) is movable, and/or (iii) is disposed in the enclosure. The apparatus may further comprise a second cooling member that cools the first cooling member and is not disposed in the enclosure.

In another aspect, an apparatus for forming a 3D object comprises an energy beam that transforms at least a portion of a material bed to form at least a portion of the 3D object; one or more sensors that measure temperatures, energy beam power values, and/or metrology values (e.g., heights) of one or more positions on the at least a portion of the 3D object, which one or more sensors are disposed adjacent to the material bed; and at least one controller comprising at least one processor (e.g., respectively) that controls the energy beam based on the measured one or more temperatures, energy beam power values, and/or metrology values. The at least one processor may comprise at least 3 Tera floating point operations per second, according to a benchmark. The at least one controller may be operatively coupled to the energy beam and/or to the one or more sensors. For example, a first controller is operatively coupled to the energy beam and a second controller is coupled to the one or more sensors. For example, the same controller is operatively coupled to the energy beam and to the one or more sensors. The at least one processor may additionally or alternatively control the energy beam based on a geometry of the at least a portion of the 3D object (e.g., position that is susceptible to deformation). The at least one processor may be included in the at least one controller that is programmed to direct an energy beam (e.g., along the path). The 3D object may be formed by hardening the transformed material. The transformed material may be the hardened material that comprises the 3D object.

The system and/or apparatus described herein may comprise at least one energy source. The first energy source may project a first energy (e.g., first energy beam). The first energy beam may travel along a path. The path may be controlled and/or predetermined (e.g., by a controller). The system and/or apparatus may comprise at least a second energy beam. For example, the first energy source may generate a plurality of energy beams (e.g., a first and a second energy beam). For example, the system and/or may comprise at least a second energy source. The second energy source may generate a second energy (e.g., second energy beam). The first and/or second energy may transform at least a portion of the pre-transformed material in the material bed to a transformed material. In some embodiments, the first and/or second energy source heat (e.g., but not transform) at least a portion of the pre-transformed material in the material bed. In some cases, the system can comprise 1, 2, 3, 4, 5, 6, 7, 8, 9, 10, 30, 100, 300, 1000 or more energy beams and/or sources. The system can comprise an array of energy sources (e.g., laser and/or diode array). In some embodiments, the footprint of the first and second energy beams on the material overlaps at least in part. In some instances, the footprint of the first and second energy beams on the material may not overlap. In some examples, the first and second energy beam have a (e.g., substantially the same) similar cross-section. In some examples, the first and second energy beam have a different cross-section.

An energy source (e.g., FIG. 7, 716) can be a source configured to deliver energy to an area (e.g., a confined area). An energy source can deliver energy to the confined area through radiative heat transfer. The energy source can project energy (e.g., heat energy, and/or energy beam). The energy (e.g., beam) can interact with at least a portion of the material (e.g., pre-transformed and/or transformed) in the material bed. The energy can heat the material in the material bed before, during and/or after the material is being transformed. The energy can heat at least a fraction of a 3D object at any point during formation of the 3D object. Alternatively, or additionally, the material bed may be heated by a heating mechanism projecting energy (e.g., radiative heat and/or energy beam). The energy may include an energy beam and/or dispersed energy (e.g., radiator or lamp). The energy may include radiative heat. The radiative heat may be projected by a heating mechanism comprising a lamp, a strip heater (e.g., mica strip heater, or any combination thereof), a heating rod (e.g., quartz rod), or a radiator (e.g., a panel radiator). The heating mechanism may comprise an inductance heater. The heating mechanism may comprise a resistor (e.g., variable resistor). The resistor may comprise a varistor or rheostat. A multiplicity of resistors may be configured in series, parallel, or any combination thereof. In some cases, the system can have a single (e.g., first) energy source. An energy source can be a source configured to deliver energy to an area (e.g., a confined area). An energy source can deliver energy to the confined area through radiative heat transfer (e.g., as described herein).

The energy beam may include a radiation comprising an electromagnetic, or charged particle beam. The energy beam may include radiation comprising electromagnetic, electron, positron, proton, plasma, or ionic radiation. The electromagnetic beam may comprise microwave, infrared, ultraviolet, or visible radiation. The energy beam may include an electromagnetic energy beam, electron beam, particle beam, or ion beam. An ion beam may include a cation or an anion. A particle beam may include radicals. The electromagnetic beam may comprise a laser beam. The energy beam may comprise plasma. The energy source may include a laser source. The energy source may include an electron gun. The energy source may include an energy source capable of delivering energy to a point or to an area. In some embodiments the energy source can be a laser source. The laser source may comprise a carbon dioxide ($CO_2$), neodymium-doped yttrium aluminum garnet (Nd:YAG), Neodymium (e.g., neodymium-glass), or an Ytterbium laser. The energy source may include an energy source capable of delivering energy to a point or to an area. The energy source can provide an energy beam having an energy density of at least about 50 joules/$cm^2$ ($J/cm^2$), 100 $J/cm^2$, 200 $J/cm^2$, 300 $J/cm^2$, 400 $J/cm^2$, 500 $J/cm^2$, 600 $J/cm^2$, 700 $J/cm^2$, 800 $J/cm^2$, 1000 $J/cm^2$, 1500 $J/cm^2$, 2000 $J/cm^2$, 2500 $J/cm^2$, 3000 $J/cm^2$, 3500 $J/cm^2$, 4000 $J/cm^2$, 4500 $J/cm^2$, or 5000 $J/cm^2$. The energy source can provide an energy beam having an energy density of at most about 50 $J/cm^2$, 100 $J/cm^2$, 200 $J/cm^2$, 300 $J/cm^2$, 400 $J/cm^2$, 500 $J/cm^2$, 600 $J/cm^2$, 700 $J/cm^2$, 800 $J/cm^2$, 1000 $J/cm^2$, 500 $J/cm^2$, 1000 $J/cm^2$, 1500 $J/cm^2$, 2000 $J/cm^2$, 2500 $J/cm^2$, 3000 $J/cm^2$, 3500 $J/cm^2$, 4000 $J/cm^2$, 4500 $J/cm^2$, or 5000 $J/cm^2$. The energy source can provide an energy beam having an energy density of a value between the aforementioned values (e.g., from about 50 $J/cm^2$ to about 5000 $J/cm^2$, from about 200 $J/cm^2$ to about 1500 $J/cm^2$, from about 1500 $J/cm^2$ to about 2500 $J/cm^2$, from about 100 $J/cm^2$ to about 3000 $J/cm^2$, or from about 2500 $J/cm^2$ to about 5000 $J/cm^2$). In an example a laser can provide light energy at a peak wavelength of at least about 100 nanometer (nm), 500 nm, 750 nm, 1000 nm, 1010 nm, 1020 nm, 1030 nm, 1040 nm, 1050 nm, 1060 nm, 1070 nm, 1080 nm, 1090 nm, 1100 nm, 1200 nm, 1500 nm, 1600 nm, 1700 nm, 1800 nm, 1900 nm, or 2000 nm. In an example a laser can provide light energy at a peak wavelength of at most about 2000 nm, 1900 nm, 1800 nm, 1700 nm, 1600 nm, 1500 nm, 1200 nm, 1100 nm, 1090 nm, 1080 nm, 1070 nm, 1060 nm, 1050 nm, 1040 nm, 1030 nm, 1020 nm, 1010 nm, 1000 nm, 750 nm, 500 nm, or 100 nm. The laser can provide light energy at a peak wavelength between any of the afore-mentioned peak wavelength values (e.g., from about 100 nm to about 2000 nm, from about 500 nm to about 1500 nm, or from about 1000 nm to about 1100 nm). The energy beam (e.g., laser) may have a power of at least about 0.5 Watt (W), 1 W, 2 W, 3 W, 4 W, 5 W, 10 W, 20 W, 30 W, 40 W, 50 W, 60 W, 70 W, 80 W, 90 W, 100 W, 120 W, 150 W, 200 W, 250 W, 300 W, 350 W, 400 W, 500 W, 750 W, 800 W, 900 W, 1000 W, 1500 W, 2000 W, 3000 W, or 4000 W. The energy beam may have a power of at most about 0.5 W, 1 W, 2 W, 3 W, 4 W, 5 W, 10 W, 20 W, 30 W, 40 W, 50 W, 60 W, 70 W, 80 W, 90 W, 100 W, 120 W, 150 W, 200 W, 250 W, 300 W, 350 W, 400 W, 500 W, 750 W, 800 W, 900 W, 1000 W, 1500, 2000 W, 3000 W, or 4000 W. The energy beam may have a power between any of the afore-mentioned laser power values (e.g., from about 0.5 W to about 100 W, from about 1 W to about 10 W, from about 100 W to about 1000 W, or from about 1000 W to about 4000 W).

The powder density (e.g., power per unit area) of the energy beam may at least about 10000 $W/mm^2$, 20000 $W/mm^2$, 30000 $W/mm^2$, 50000 $W/mm^2$, 60000 $W/mm^2$, 70000 $W/mm^2$, 80000 $W/mm^2$, 90000 $W/mm^2$, or 100000 $W/mm^2$. The powder density of the energy beam may be at most about 10000 $W/mm^2$, 20000 $W/mm^2$, 30000 $W/mm^2$, 50000 $W/mm^2$, 60000 $W/mm^2$, 70000 $W/mm^2$, 80000 $W/mm^2$, 90000 $W/mm^2$, or 100000 $W/mm^2$. The powder density of the energy beam may be any value between the aforementioned values (e.g., from about 10000 $W/mm^2$ to about 100000 $W/mm^2$, from about 10000 $W/mm^2$ to about 50000 $W/mm^2$, or from about 50000 $W/mm^2$ to about 100000 $W/mm^2$). The scanning speed of the energy beam may be at least about 50 millimeters per second (mm/sec), 100 mm/sec, 500 mm/sec, 1000 mm/sec, 2000 mm/sec, 3000 mm/sec, 4000 mm/sec, or 50000 mm/sec. The scanning speed of the energy beam may be at most about 50 mm/sec, 100 mm/sec, 500 mm/sec, 1000 mm/sec, 2000 mm/sec, 3000 mm/sec, 4000 mm/sec, or 50000 mm/sec. The scanning speed of the energy beam may any value between the aforementioned values (e.g., from about 50 mm/sec to about 50000 mm/sec, from about 50 mm/sec to about 3000 mm/sec, or from about 2000 mm/sec to about 50000 mm/sec). The energy beam may be continuous or non-continuous (e.g., pulsing). The energy beam may be modulated before and/or during the formation of a transformed material as part of the 3D object. The energy beam may be modulated before and/or during the 3D printing process (e.g., in real time). The energy beam may be controlled by at least one controller.

An energy beam can be incident on, or be directed perpendicular to, the target surface (e.g., exposed surface of the material bed). An energy beam can be directed at an acute angle within a value of from parallel to perpendicular relative to the target surface. The energy beam can be directed onto a specified area of at least a portion of the source surface and/or target surface for a specified time period (e.g., dwell time). The material in target surface can absorb the energy from the energy beam and, and as a result, a localized region of the material bed can increase in temperature. The energy beam can be moveable such that it can translate relative to the target surface. The energy source may be movable such that it can translate relative to the target surface. The energy beam(s) can be moved via a scanner (e.g., as disclosed herein). At least two (e.g., all) of the energy sources can be movable with the same scanner. A least two (e.g., all) of the energy beams can be movable with different scanners. At least two of the energy beam(s) can be translated independently of each other. In some cases, at least two of the energy beam(s) can be translated at different rates (e.g., velocities). In some cases, at least two of the energy source(s) and/or beam(s) can be comprise at least one different characteristic. The characteristics may comprise dwell time, wavelength, power, power per unit area, amplitude, trajectory, footprint (e.g., at the target surface), cross section, intensity, focus, or charge. The charge can be electrical and/or magnetic charge.

The energy source can be an array, or a matrix, of energy sources (e.g., laser array). Each of the energy sources in the array, or matrix, can be independently controlled (e.g., by at least one control mechanism) such that the energy beams can be turned off and on independently. At least a part of the energy sources in the array or matrix can be collectively controlled such that the at least two (e.g., all) of the energy sources can be turned off and on simultaneously. The energy per unit area or intensity of at least two energy sources in the matrix or array can be modulated independently (e.g., by at least one control mechanism). At times, the energy per unit area (or intensity) of at least two (e.g., all) of the energy sources in the matrix or array can be modulated collectively (e.g., by a control mechanism). The energy beam can scan along the target surface by mechanical movement of the energy source(s), one or more adjustable reflective mirrors, or one or more (e.g., polygon light) scanners. The energy source(s) can project energy using a DLP modulator, a one-dimensional scanner, a two-dimensional scanner, or any combination thereof. The target surface can translate vertically, horizontally, or in an angle (e.g., planar or compound). In some embodiments, the energy source is stationary (e.g., does not translate).

In some embodiments, the energy beam is modulated. For example, the energy beam emitted by the energy source can be modulated. The modulator can comprise an amplitude modulator, phase modulator, or polarization modulator. The modulation may alter the intensity of the energy beam. The modulation may alter the current supplied to the energy source (e.g., direct modulation). The modulation may affect the energy beam (e.g., external modulation such as external light modulator). The modulation may include direct modulation (e.g., by a modulator). The modulation may include an external modulator. The modulator can include an aucusto-optic modulator or an electro-optic modulator. The modulator can comprise an absorptive modulator or a refractive modulator. The modulation may alter the absorption coefficient of the material that is used to modulate the energy beam. The modulator may alter the refractive index of the material that is used to modulate the energy beam.

In some embodiments, the energy beam is translated using a scanner. The scanner can be located in the enclosure or out of the enclosure. FIG. 7 shows an example where the scanner 717 is located outside of the enclosure, and the energy beam 701 travels into the enclosure through an optical window 718. The scanner may comprise a galvanometer scanner, a polygon, a mechanical stage (e.g., X-Y stage), a piezoelectric device, gimbal, or any combination of thereof. The galvanometer may comprise a mirror. The scanner may comprise a modulator. The scanner may comprise a polygonal mirror. The scanner can be the same scanner for two or more energy sources and/or beams. At least two (e.g., each) energy beams may each have a separate scanner. The energy beams can be translated independently of each other. In some cases, at least two energy beams can be translated at different rates, and/or along different paths. For example, the movement of the first energy source may be faster (e.g., greater rate) as compared to the movement of the second energy source.

The systems and/or apparatuses disclosed herein may comprise one or more shutters (e.g., safety shutters). The energy beam(s), energy source(s), and/or the platform can be moved by the scanner. The galvanometer scanner may comprise a two-axis galvanometer scanner. The scanner may comprise a modulator (e.g., as described herein). The energy source(s) can project energy using a DLP modulator, a one-dimensional scanner, a two-dimensional scanner, or any combination thereof. The scanner can be included in an optical system that is configured to direct energy from the energy source to a predetermined position on the target surface (e.g., exposed surface of the material bed). The controller can be programmed to control a trajectory of the energy source(s) with the aid of the optical system. The controller can control (e.g., regulate) a supply of energy from the energy source to the material (e.g., at the target surface) to form a transformed material.

The energy beam(s) emitted by the energy source(s) can be modulated. The modulator can include an amplitude modulator, phase modulator, or polarization modulator. The modulation may alter the intensity of the energy beam. The modulation may alter the current supplied to the energy source (e.g., direct modulation). The modulation may affect the energy beam (e.g., external modulation such as external light modulator). The modulation may include direct modulation (e.g., by a modulator). The modulation may include an external modulator. The modulator can include an aucusto-optic modulator or an electro-optic modulator. The modulator can comprise an absorptive modulator or a refractive modulator. The modulation may alter the absorption coefficient the material that is used to modulate the energy beam. The modulator may alter the refractive index of the material that is used to modulate the energy beam.

Energy (e.g., heat) can be transferred from the material bed to a cooling member (e.g., heat-sink FIG. 7, 713). The cooling member can facilitate transfer of energy away from a least a portion of a pre-transformed material layer. In some cases, the cooling member can be a thermally conductive plate. The cooling member can be passive. The cooling member can comprise a cleaning mechanism (e.g., cleaning device), which removes pre-transformed material and/or process debris from a surface of the cooling member (e.g., to sustain efficient cooling). The debris can comprise dirt, dust, condensed material (e.g., that result from heating, melting, evaporation and/or other process transitions), pre-transformed material, or hardened material that did not form a part of the 3D object. In some cases, the cleaning mechanism can comprise a stationary rotating rod, roll, brush, rake, spatula, or blade that rotates when the heat-sinks moves in a direction adjacent to the platform (e.g., laterally). The cleaning mechanism may comprise a vertical cross section (e.g., side cross section) of a circle, triangle, square, pentagon, hexagon, octagon, or any other polygon. The vertical cross section may be of an amorphous shape. In some cases, the cleaning mechanism rotates when the cooling member moves (e.g., in a direction that is not lateral). In some cases, the cleaning mechanism rotates without or irrespective of a movement of the cooling member. In some cases, the cooling member comprises at least one surface that is coated with a layer that prevents debris from coupling (e.g., attaching) to the at least one surface (e.g., an anti-stick layer).

One or more temperature sensors (e.g., as described herein) can sense the temperature of the cooling member. The cooling member can comprise two or more thermally conductive plates. The cooling member can be made from a thermally conductive material, for example a metal or metal alloy. The cooling member can comprise copper or aluminum. The cooling member (e.g., heat-sink) can comprise a material that conducts heat efficiently. The efficient heat conductivity may be at least about 20 Watts per meter times Kelvin (W/mK), 50 W/mK, 100 W/mK, 150 W/mK, 200 W/mK, 205 W/mK, 300 W/mK, 350 W/mK, 400 W/mK, 450 W/mK, 500 W/mK, 550 W/mK, 600 W/mK, 700 W/mK, 800 W/mK, 900 W/mK, or 1000 W/mK. The efficient heat conductivity may of any value between the aforementioned values (e.g., from about 400 W/mK to about 1000 W/mK, or from about 20 W/mK to about 500 W/mK). The efficient heat conductivity can be measured at ambient temperatures (e.g., R.T. or 20° C.). The cooling member (e.g., heat-sink) can comprise an elemental metal or a metal alloy. The cooling member can disclose a material as disclosed herein. For example, the cooling member can comprise elemental metal, metal alloy, ceramic, an allotrope of elemental carbon, or a polymer. For example, the cooling member can comprise stone, zeolite, clay or glass. The cooling member (e.g., 713) can be placed above the top surface (e.g., 708) of the material bed (e.g., 704). The cooling member can be placed below, to the side, or above the exposed surface of the material bed. In some cases, the cooling member can contact a surface (e.g., top surface) of the material bed. The cooling member can just touch the surface of the material bed. The cooling member can apply a compressive force to the exposed surface of the material bed. In some cases, the cooling member extends up to, or past, the edges of the top surface of the material bed. The cooling member can facilitate a transfer of energy from at least a portion of a material (e.g., powder) layer without substantially changing and initial configuration of the pre-transformed material in the material bed. In some cases, the material (e.g., powder) layer can comprise a fully or partially formed 3D object. The cooling member can facilitate the transfer of energy from at least a portion of a material (e.g., powder) layer without substantially altering the position of the printed 3D object (or a part thereof) by any of the position alteration values disclosed herein.

The cooling member may comprise a heat transfer member that enables heating, cooling or maintaining the temperature of the material bed and/or of the 3D object being formed in the material bed. In some examples, the heat transfer member is a cooling member that enables the transfer of energy out of the material bed. The heat transfer member can enable the transfer of energy to the material bed (e.g., at specified times).

Heat can be transferred from the material bed (e.g., directly or indirectly) to the cooling member through any one or combination of heat transfer mechanisms (e.g., conduction, natural convection, assisted convection, and radiation). The cooling member can be solid, liquid or semi-solid. In some examples, the heat-sink is solid. The cooling member may comprise a gas, liquid, or solid. Alternatively, the cooling member can comprise one or more openings. The openings can be arranged in a pattern or randomly. For example, the openings can be arranged in a striped pattern or a chessboard pattern. In some cases, material (e.g., powder) removal openings (e.g., suction nozzles) can be adjacent to the openings of the cooling member. In an example, the cooling member can be a plate. In some cases, at least as about 5%, 10%, 20%, 30%, 40%, 50%, 60% or 70% of the surface area of the cooling member can be an opening or hole. The holes or openings can be configured to allow the first and the optional second energy sources to access the powder layer.

In the example shown in FIG. 5A, a first cooling member (e.g., heat-sink) 513 is a disposed at a distance from the exposed surface of the material bed 504, which distance constitutes a gap. The cooling member can be separated from the material bed by a gap. The gap can have a variable or adjustable spacing. The cooling member can be controlled (e.g., regulated and/or directed) by a controller (e.g., comprising a processor). The gap can be adjusted by a controller and/or manually. For example, the gap can be adjusted based on an energy per unit area that is suitable to transform at least a portion of the material bed. Alternatively or additionally, the cooling member can contact the material bed. In some instances, the cooling member can be alternately and/or sequentially brought in contact with the material bed.

The distance between the cooling member and the material bed (e.g., exposed surface thereof) can influence the heat transfer between the cooling member and the material bed. The vertical distance of the gap from the exposed surface of the material bed may be at least about 50 μm, 100 μm, 250 μm, 0.5 mm, 1 mm, 2 mm, 3 mm, 4 mm, 5 mm, 6 mm, 7 mm, 8 mm, 9 mm, 10 mm, 20 mm, 30 mm, 40 mm, 50 mm, 60 mm, 70 mm, 80 mm, 90 mm, or 100 mm. The vertical distance of the gap from the exposed surface of the powder bed may be at most about 50 μm, 100 μm, 250 μm, 0.5 mm, 1 mm, 2 mm, 3 mm, 4 mm, 5 mm, 6 mm, 7 mm, 8 mm, 9 mm, 10 mm, 20 mm, 30 mm, 40 mm, 50 mm, 60 mm, 70 mm, 80 mm, 90 mm, or 100 mm. The vertical distance of the gap from the exposed surface of the powder bed may be any value between the aforementioned values (e.g., from about 50 μm to about 100 mm, from about 50 μm to about 60 mm, or from about 40 mm to about 100 mm). In some instances, there is no gap (i.e., the gap is zero). In some cases, the gap can be adjustable. The cross section of the gap can be controlled by a controller and/or manually. The gap can have a substantially uniform dimension across the entire cooling member, and/or across the material bed. In some cases, the gap distance can vary across the material bed. The gap can be adjusted such that the cooling member is in contact with the material bed (e.g., the exposed surface of the material bed). A translation mechanism can be used to (e.g., dynamically or flexibly) move the cooling member, for example, in and out of contact with the material bed. For example, a translation mechanism can be used to move the cooling member in and out of a position above the material bed. The translation mechanism can be manually and/or electronically controlled (e.g., by the controller). In an example, the translation mechanism can be an array of curved leaf springs, flexible needle springs, or a set of rolling cylinders. The contact pressure between the cooling member (e.g., plate) and the material bed can be electronically and/or manually adjusted.

In some embodiments, the gap is filled with at least one gas. The gas(es) can be chosen in order to achieve a specific heat transfer property between the material bed and the cooling member. For example, a gas(es) with high thermal conductivity can be chosen to increase the rate of conductive heat transfer from the material bed to the cooling member. The gases can be air. The gas can be non-reactive (e.g., inert). The gases may constitute an atmosphere. The gas can by any gas mentioned herein. For example, the gas can comprise argon, nitrogen, helium, neon, krypton, xenon, hydrogen, carbon monoxide, carbon dioxide, or oxygen. In some cases, the system and/or apparatus can be stored and operated in a vacuum chamber in which case there will be at most a thin layer (e.g., as compared to ambient atmosphere) between the cooling member and the material bed. The cooling member can be thermally coupled to the material bed through the layer of the gas. A metrological sensor (e.g., distance sensor or height sensor) can measure the distance of the gas gap. For example, a gas with high thermal conductivity can be chosen. The gas gap can be an environment between the cooling member and an exposed surface of the material bed. The size of the gap may be controlled (e.g., manually or electronically). The control may be during and/or before the 3D printing. In some cases, turbulent, rotational, and/or laminar gas flow currents can be generated in the gap. The laminar gas flow can be parallel to the average surface of the material bed. The currents can increase, or aid convective heat transfer between the material bed and the cooling member. In some cases, the currents can be driven by movement of the cooling member with structures (e.g., periodic wedges) present along the cooling member to direct the currents (e.g., towards the material bed, or in a direction parallel to the material bed). The wedges can be periodically spaced along a surface of the cooling member with a spacing distance from about 1 μm to about 100 mm, or from about 10 μm to about 10 mm. Alternatively or additionally, a convective current can be generated in the gas gap by forcing a gas flow in the gap. The gas flow can be forced by a first array or matrix of opening ports (e.g., nozzles) embedded in the cooling member (e.g., in the surface of the cooling member). The opening ports can be oriented towards an exposed surface of the material bed and may allow gas to flow in to the gap (e.g., via release of a pressurized gas). A second array or matrix of opening ports can remove the gas introduced by the first array or matrix of opening ports to create gas flow (e.g., via vacuum mechanism).

In some cases, at least one gas bearing is utilized to increase the cooling rate of the material bed. In this embodiment a planar (e.g., laminar) gas bearing can be created using a set of openings in the cooling plate (e.g., which openings face the material bed). Pressurized gas can be injected from one set of openings to the gap. The pressurized gas may leave the gap through a second set of openings. The gas bearing can induce forced convection. The gas bearing may increase the heat transfer rate from the material bed. In another example, thermo-acoustic heat extraction can be used to increase the cooling rate of the powder bed.

In some cases, the cooling member can comprise a heat exchanger. The heat exchanger (e.g., comprising a thermostat) can be configured to maintain the temperature of the cooling member at a constant target temperature. In some cases, the target temperature (e.g., of the heat sink, heat exchanger, and/or material bed during the 3D printing) can be higher than, lower than, or substantially equivalent to the ambient temperature. The heat exchanger can circulate a cooling fluid through a plumbing system. The plumbing system can be embedded in the cooling member. The plumbing system can be embedded in a position different from the cooling member. The plumbing system may comprise one or more channels (e.g., pipe, or coil). The cooling fluid (e.g., coolant) can be configured to absorb heat from the cooling member through any one or combination of heat transfer mechanisms (e.g., conduction, natural convection, forced convection, and radiation). In some examples, the cooling member is not embedded within the material bed (e.g., in a form of pipes). In some examples, the cooling member (e.g., FIG. 5A, 512) is distant from the material bed (e.g., FIG. 5A, 504).

In some examples, the heat exchanger may be an integral part of the cooling member. At times, the heat exchanger may be separated from the cooling member. For example, the heat exchanger may be disposed at a location that is different than the location of the cooling member. For example, the cooling member can be disposed within the enclosure, and the heat exchanger can be disposed outside of the enclosure. The heat exchanger may be included in a second cooling member. FIG. 5A shows an example of a second cooling member that comprises a heat exchanger 512 having channels (e.g., tubing) 516 and 514 that facilitate rapid flow of heat away from the enclosure 507. The second cooling member (e.g., comprising 512) is not disposed within the enclosure 507. The first cooling member 513, is disposed within the enclosure 507. The first cooling member may be moveable. Movable may comprise movable laterally, horizontally, at an angle (planar or compound), or any combination thereof. FIG. 5A shows an example of one position of the first cooling member (e.g., 513), and FIG. 5B shows an example of a second position of the first cooling member (e.g., 533) in which it contacts the second cooling member 532 (e.g., directly or through a wall of the enclosure). The first cooling member can be designated as an internal cooling member, as it is located within the enclosure. The second cooling member can be designated as an external cooling member, when it is located outside the enclosure, or when it (or any part thereof) forms a part of the body of the enclosure (e.g., wall, rim and/or coating of the enclosure). The second cooling member may be part to the enclosure wall, coating, and/or rim. The second cooling member (or parts thereof) can be movable or stationary. The first and/or second cooling member may be controlled by the controller and/or manually. The first and/or second cooling member (or parts thereof) can be replaceable.

The external cooling member may comprise one or more channels. The channels may comprise channels within a stationary structure (e.g., a block of material), or channels that are external to the stationary structure. The channels may comprise pipes. At least a portion of the channel may be open or closed. FIG. 5A shows an example of a vertical cross section (e.g., 517) of a stationary structure 512 as part of the cooling member that is not disposed within the enclosure 507; and an example of channels (e.g., 514 and 516) that are external to the stationary structure 512. The interior of the channels may comprise a cooling gas, liquid, semi-solid (e.g., gel), or solid (e.g., powder). The interior of the channels may be movable, transferable, and/or flowing. The interior of the channels may comprise a substance that is able to transport and/or evacuate heat. For example, the substance within the channels may have a high specific heat capacity. For example, the substance within the channels may be transportable (e.g., liquid, or gas). The specific heat of the substance within the channels may be at least 1 Kilo-Joule per Kilogram time Kelvin (kJ/kg K), 1.5 kJ/kg K, 2 kJ/kg K, 2.5 kJ/kg K, 3 kJ/kg K, 3.5 kJ/kg K, 4 kJ/kg K, or 4.5 kJ/kg K. The specific heat of the substance within the channels may be any value between the afore-mentioned values (e.g., from about 1 kJ/kg K to about 4.5 kJ/kg K, from about 2 kJ/kg K to about 4.5 kJ/kg K, or from about 3 kJ/kg K to about 4.5 kJ/kg K). The substance within the channels may be a coolant. The coolant may comprise water, ethylene glycol, diethylene glycol, propylene glycol, Betaine, silicon oil, mineral oil (e.g., castor oil), transfer oil, fluorocarbon oil, Freon, fuel (e.g., jet fuel, Kerosene), refrigerant (R-12, R-22, and/or R-134a), ammonia, sulfur dioxide, carbon dioxide, or propane. The substance within the channels may comprise liquid fusible alloys (e.g., NaK, lead-bismuth alloy, or molten salt (e.g., NaF—NaBF$_4$, FLiBe, or FLi-NaK). The coolant may comprise a liquid gas. The coolant may comprise a nanofluid (e.g., comprising nanoparticles).

The first cooling member may contact the second cooling member. The contact may be a direct contact. The contact may be in indirect contact. The indirect contact may be through one or more material. The one or more material may constitute the casing of the enclosure (e.g., 507). The contact may be effectuated using a physical, magnetic, electrical, or hydraulic force. For example, the internal cooling member may comprise a material that is magnetically and/or electrically attracted to the force exerted adjacent to the position where the external cooling member is disposed. The force can be exerted by the external cooling member. Additionally, or alternatively, the force may be exerted by a force generator located adjacent to the external cooling member. For example, the force generator can comprise an electrostatic force generator, electric field generator, or an electrical conductor (e.g., an electrode). The electric field generator may comprise a magnet. The electric field generator may comprise time varying magnetic fields. The force generator can comprise a magnet, or a magnetic force generator. The force generator can be a vacuum exit port (e.g., nozzle). The force generator can be located in or adjacent to the coating, and/or rim of the enclosure. The coating may comprise a surface of the enclosure. The generated force may be located such that the internal cooling member may couple (e.g., attach) itself to a specified position adjacent to the external cooling member. The external cooling member may couple (e.g., attach) itself due to its response to being attracted to the generated force. For example, the external cooling member may contain a metal that is attracted to the magnetic field exerted by a magnet located on the second cooling member. Additionally, or alternatively, the force may be a chemical force (e.g., chemical attraction). The chemical attraction may be based on polarity based attraction and/or complexation.

Figure 18A:
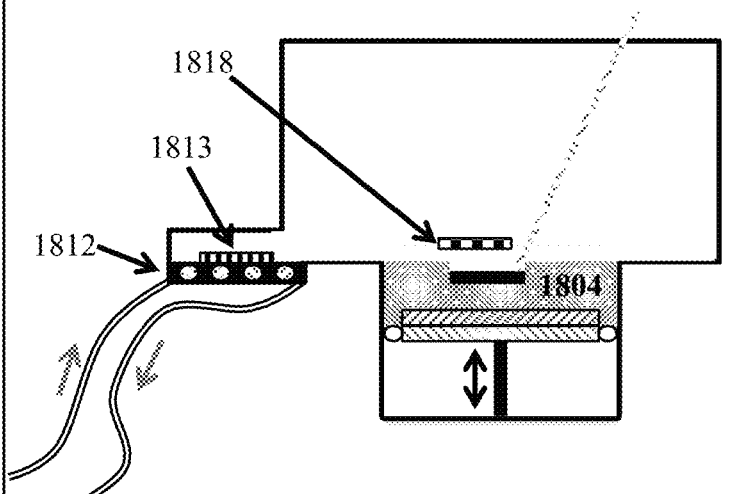
FIGS. 18A-18B illustrate schematic side views of systems and apparatuses for forming one or more 3D objects.
Figure 18B:
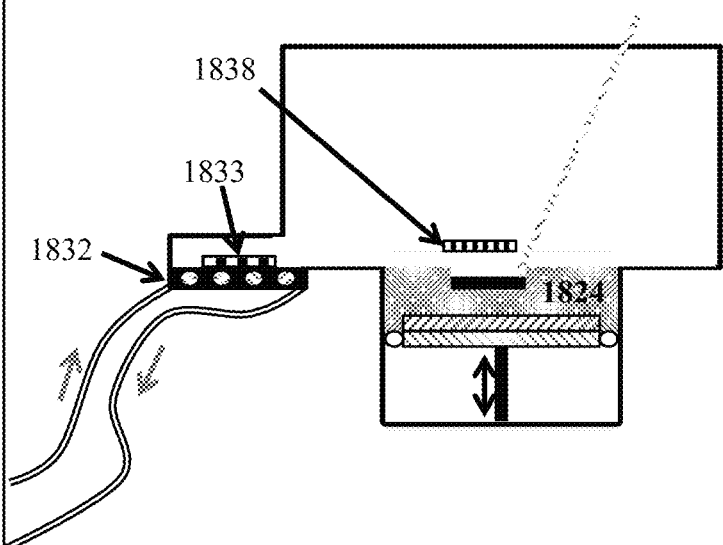

In some examples, the enclosure comprises two or more cooling members within the enclosure (e.g., internal cooling members). In some examples, more than one (e.g., two or more) cooling member is disclosed not within the enclosure (e.g., external cooling members). FIG. 18A shows an example of a system an apparatuses showing an external cooling member 1812 and two internal cooling members (e.g., 1813 and 1818). In some examples, a first internal cooling member (e.g., 1813) is being cooled with the aid of an external cooling member (e.g., 1812), while a second internal cooling member (e.g., 1818) absorbs heat from the material bed (e.g. 1804). In some examples, a first cooling member is being cooled with the aid of an external cooling member, while a second internal cooling member absorbs heat (e.g., that is dissipated during the 3D printing process). The cooling member that is being cooled with the aid of an external cooling member can be used as a heat depleting cooling member. The internal cooling member that absorbs heat from the material bed can be a heat absorbing cooling member (e.g., a working cooling member). When the first internal cooling member is sufficiently cooled and/or when the second internal cooling member reaches a maximum heating capacity, the second internal cooling member may become the heat depleting cooling member as it is being cooled with the aid of an external cooling member, while the first internal cooling member may become the heat absorbing cooling member as it absorbs heat from the material bed. When the heat absorbing cooling member reaches a maximum temperature and/or when the heat depletion cooling reaches a minimum temperature, the functions (e.g., and positions) of the internal cooling members may interchange. FIG. 18B shows an example of a system and/or apparatuses showing an external cooling member 1832 and two internal cooling members (e.g., 1833 and 1838). FIG. 18B represents a second position of the cooling members shown in FIG. 18A. In FIG. 18B, the heat absorbing cooling member 1818 of FIG. 18A, became the heat depleting cooling member 1833; and the heat depleting cooling member 1813 of FIG. 18A, became the heat absorbing cooling member 1838 of FIG. 18B.

In some embodiments, various parameters of the cooling member are controlled. The maximal temperature of the heat absorbing cooling member and/or minimal temperature of the heat depleting cooling member may be controlled (e.g., regulated). The control may be manual and/or automatic. For example, the control may be by a controller (e.g., using at least one temperature sensor). The position of the first and/or second internal cooling member may be controlled (e.g., regulated and/or directed) by the controller and/or manually. The position of the first and/or second external cooling member may be controlled (e.g., regulated and/or directed) manually and/or by the controller. The rate of moving the coolant in the external cooling member may be controlled manually and/or by the controller. The maximal temperature of the heat absorbing cooling member may be below a transformation temperature (e.g., melting point) of at least one material within the heat absorbing cooling member. The minimal temperature of the heat depleting cooling member may be above a temperature causing substantial number of defects (e.g., cracks) in the heat depleting cooling member. Substantial number of defects may be relative to the intended purpose. The cooling member and any of its characteristics can be those disclosed in in Provisional Patent Application Ser. No. 62/396,584, that is incorporated herein by reference in its entirety.

The position of the internal cooling member adjacent (e.g., next) to the external cooling member may be reversible. The internal cooling member may be detached from the external cooling member. The detachment may be due to a force (e.g., as disclosed herein). The detachment may be due to a repelling force. For example, the electrical force generator may reverse its charge and cause repulsion of the internal cooling member from the position adjacent to the external cooling member. The force generator may be controlled manually and/or by the controller. For example, the controller may control (e.g., direct and/or regulate) the magnitude and polarity of the force generated by the force generator. Additionally, or alternatively, the internal cooling member may be mechanically brought to and/or taken away from a position adjacent to the external cooling member. The mechanical position manipulation (e.g., translation) of the internal cooling member may be controlled by the controller. The translation of the internal cooling member may be effectuated by a scanner, motor, force generator, or any combination thereof. The positioning (e.g., translation) of the internal cooling member may be triggered by the temperature of the internal and/or external cooling member, by the position of the energy beam, or by the position of the layer dispensing mechanism (or any of its components). The translation of the internal cooling member may be programmed. The translation of the internal cooling member may be according to an algorithm. The algorithm may incorporate the 3D model of the 3D object. An example of a layer dispensing mechanism is disclosed in application number PCT/US15/36802, titled "Apparatuses, Systems and Methods for 3D Printing," that was filed on Jun. 19, 2015 that is incorporated herein by reference in its entirety.

The specified position of the internal cooling member adjacent to the external cooling member may effectuate an efficient (e.g., optimal) heat transfer between the internal cooling member and the external cooling member. The efficient heat transfer may be able to cool the internal cooling member by about 100° C. in at most 2 seconds (sec), 10 sec, 30 sec, 1 minute (min), 5 min, 10 min, or 30 min. The efficient heat transfer may be able to cool the internal cooling member by about 100° C. in any value between the aforementioned values (e.g., from about 2 secs to about 30 min, from about 2 secs to about 5 min, from about 2 secs to about 30 sec).

The cooling member has a shape. The cooling member can be a plate. The plate may contact the surface of the material bed along a planar dimension. The plate may contact the surface of the enclosure (e.g., coating of the enclosure). In some cases, the cooling member can be a one or more cylinder that roll along the surface (e.g., of the material bed or of the enclosure). Alternatively, or additionally, the cooling member can be a belt that runs along the surface. The cooling member can comprise spikes, ridges, or other protrusions features configured to penetrate into a surface. For example, the protrusions features may be configured to penetrate the material bed to enhance cooling surface area and depth. The protruding features may be bendable (e.g., soft) or non-bendable (e.g., stiff). The protrusion features may be configured to fit into grooves within the coating of the enclosure. The grooves may facilitate efficient transfer of heat from the internal cooling member to the external cooling member.

In some instances, the cooling member does not reside within the material bed. In other examples, the cooling member may reside at least partially within the material bed. The cooling member can be a duct or a pipe. In some instances, the cooling member is not a plate or a slab. The cooling member can be a cooled layer of pre-transformed material. The cooled pre-transformed (e.g., powder) layer can act as a cooling member.

A thermal control unit (e.g., a cooling member such as a heat-sink or a cooling plate, a heating plate, or a thermostat) can be provided inside of the region where the 3D object is formed or adjacent to the region where the 3D object is formed. The thermal control unit can be provided outside of the region where the 3D object is formed (e.g., at a predetermined distance). The thermal control unit can be provided within the enclosure (e.g., outside of the enclosure). The thermal control unit may be in physical contact with at least a portion of the enclosure. In some cases, the thermal control unit can form at least one section of a boundary region where the 3D object is generated (e.g., the container accommodating the material bed).

A cooling of a layer within the material bed can occur by energy transfer from the layer to a cooling member. Energy can be transferred from the layer along a direction that is oriented away from the material bed. In some cases, energy can be transferred in a direction toward a surface of the cooling member (e.g., a surface of the internal cooling member). The energy can be transferred in the direction of the exposed surface of the material bed. The energy can be transferred upwards (e.g., in a direction opposite to the building platform). The energy can be transferred to a cooling member (e.g., internal) located above the material bed, or to the side of the material bed. At times, at least about 20%, 30%, 40%, 50%, 60%, 70%, 70%, 80%, 90%, or 95% of the energy (e.g., heat) is transferred towards the cooling member. At times, at most about 99%, 95%, 90%, 80%, 70%, 60%, 50%, 40%, 30%, 30%, or 20% of the energy is transferred towards the cooling member. Sometimes, the energy transferred towards the cooling member can have a percentage value between any of the aforementioned percentage values (e.g., from about 20% to about 99%, from about 20% to about 60%, from about 50% to about 99%).

The cooling member can cool and/or stabilize the temperature of the portion of the material bed and/or at least a portion of the remainder of the material bed that did not transform to form the 3D object (referred to herein as the "remainder"). The cooling member can be configured to remove energy at a rate greater than or equal to about $P_1$. The cooling member can be maintained at a temperature that is substantially lower than the temperature of the material bed.

In some embodiments, the cooling member cools the material bed during the 3D printing. The cooling member can be adapted to be selectively positioned between the material bed (or the container accommodating the material bed) and the energy source(s). The cooling member can be adapted to be selectively positioned between the platform and the energy source(s). The cooling member can be adapted to be selectively positioned along the vector of the energy beam (e.g., FIG. 7, 701). In some cases, an actuator (e.g., motor) translates the cooling member such that the hole(s) remains in a location that allows the energy beam(s) to access the material bed as it is scanned across it. In some examples, the actuator that controls movement of the cooling member is synchronized with the at least one scanner to permit articulation of the energy source(s). The cooling member can controllably track energy applied to the portion of the material from the energy source(s). Movement of the cooling member can be controlled manually and/or by a controller. The controller (e.g., computer) can be programmed to control movement of the cooling member. In some cases, the controller is programmed to optimize the removal of energy from the material bed. Optimizing removal of energy from the material bed (e.g., before and/or during the 3D printing) can include changing the gap length or width, moving the cooling member, initiating a forced convection system (e.g., fan), adjusting gas composition, any combination thereof, or any other process that can influence time or efficiency variables of producing the 3D object. The controller can be further programmed to control (e.g., before and/or during the 3D printing) a temperature profile of the platform separate from a temperature profile of the material bed. In some instances, the controller is programmed to ensure uniform heat transfer away from the material bed. For example, the controller can be programmed to ensure that regions of the material bed surface are covered by solid portions and open (hole) portions of the cooling member for equal durations of time to maintain uniform heat transfer away from the material bed. In some cases, the cooling member can be substantially transparent. Before and/or during the 3D printing comprises before and/or during formation of a layer of transformed material.

In some examples, one or more sensors (e.g., metrology sensors) detect the topology of the exposed surface of the material bed and/or the exposed surface of the 3D object or any part thereof. The sensor can detect the amount of material deposited in the material bed. The sensor can be a proximity sensor. For example, the sensor can detect the amount of pre-transformed material deposited on the exposed surface of a material bed. The sensor can detect the amount of material dispensed by the material dispensing mechanism. The sensor can detect the amount of material relocated by a leveling mechanism. The sensor can detect the temperature of the material. For example, the sensor may detect the temperature of the material in a material (e.g., powder) dispensing mechanism, and/or in the material bed. The sensor may detect the temperature of the material during and/or after its transformation. The sensor may detect the temperature and/or pressure of the atmosphere within an enclosure (e.g., chamber). The sensor may detect the temperature of the material bed at one or more locations.

In some embodiments, the at least one sensor is operatively coupled to at least one controller. The sensor may comprise light sensor, acoustic sensor, vibration sensor, chemical sensor, electrical sensor, magnetic sensor, fluidity sensor, movement sensor, speed sensor, position sensor, pressure sensor, force sensor, density sensor, distance sensor, or proximity sensor. The sensor may include temperature sensor, weight sensor, material (e.g., powder) level sensor, metrology sensor, gas sensor, or humidity sensor. The metrology sensor may comprise measurement sensor (e.g., height, length, width, angle, and/or volume). The metrology sensor may comprise a magnetic, acceleration, orientation, or optical sensor. The sensor may transmit and/or receive sound (e.g., echo), magnetic, electronic, or electromagnetic signal. The electromagnetic signal may comprise a visible, infrared, ultraviolet, ultrasound, radio wave, or microwave signal. The metrology sensor may measure the tile. The metrology sensor may measure the gap. The metrology sensor may measure at least a portion of the layer of material. The layer of material may be a pre-transformed material (e.g., powder), transformed material, or hardened material. The metrology sensor may measure at least a portion of the 3D object. The gas sensor may sense any of the gas delineated herein. The distance sensor can be a type of metrology sensor. The distance sensor may comprise an optical sensor, or capacitance sensor. The temperature sensor can comprise Bolometer, Bimetallic strip, calorimeter, Exhaust gas temperature gauge, Flame detection, Gardon gauge, Golay cell, Heat flux sensor, Infrared thermometer, Microbolometer, Microwave radiometer, Net radiometer, Quartz thermometer, Resistance temperature detector, Resistance thermometer, Silicon band gap temperature sensor, Special sensor microwave/imager, Temperature gauge, Thermistor, Thermocouple, Thermometer (e.g., resistance thermometer), or Pyrometer. The temperature sensor may comprise an optical sensor. The temperature sensor may comprise image processing. The temperature sensor may comprise a camera (e.g., IR camera, CCD camera). The pressure sensor may comprise Barograph, Barometer, Boost gauge, Bourdon gauge, Hot filament ionization gauge, Ionization gauge, McLeod gauge, Oscillating U-tube, Permanent Downhole Gauge, Piezometer, Pirani gauge, Pressure sensor, Pressure gauge, Tactile sensor, or Time pressure gauge. The position sensor may comprise Auxanometer, Capacitive displacement sensor, Capacitive sensing, Free fall sensor, Gravimeter, Gyroscopic sensor, Impact sensor, Inclinometer, Integrated circuit piezoelectric sensor, Laser rangefinder, Laser surface velocimeter, LIDAR, Linear encoder, Linear variable differential transformer (LVDT), Liquid capacitive inclinometers, Odometer, Photoelectric sensor, Piezoelectric accelerometer, Rate sensor, Rotary encoder, Rotary variable differential transformer, Selsyn, Shock detector, Shock data logger, Tilt sensor, Tachometer, Ultrasonic thickness gauge, Variable reluctance sensor, or Velocity receiver. The optical sensor may comprise a Charge-coupled device, Colorimeter, Contact image sensor, Electro-optical sensor, Infra-red sensor, Kinetic inductance detector, light emitting diode (e.g., light sensor), Light-addressable potentiometric sensor, Nichols radiometer, Fiber optic sensors, Optical position sensor, Photo detector, Photodiode, Photomultiplier tubes, Phototransistor, Photoelectric sensor, Photoionization detector, Photomultiplier, Photo resistor, Photo switch, Phototube, Scintillometer, Shack-Hartmann, Single-photon avalanche diode, Superconducting nanowire single-photon detector, Transition edge sensor, Visible light photon counter, or Wave front sensor. The weight of the material bed can be monitored by one or more weight sensors in, or adjacent to, the material. For example, a weight sensor in the material bed can be at the bottom of the material bed. The weight sensor can be between the bottom of the enclosure (e.g., FIG. 7, 711) and the substrate (e.g., FIG. 7, 709) on which the base (e.g., FIG. 7, 702) or the material bed (e.g., FIG. 7, 704) may be disposed. In some examples, the one or more sensors can sense the level of the exposed surface of the material bed. The material (e.g., powder) level sensor can be in communication with a material dispensing mechanism (e.g., powder dispenser), energy source, scanner, and/or energy beam. One or more position sensors (e.g., height sensors) can measure the height of the material bed (e.g., relative to the platform). The position sensors can be optical sensors. The position sensors can determine a distance between one or more energy beams (e.g., a laser or an electron beam.) and a surface of the material bed and/or 3D object or a portion thereof. The one or more sensors may be connected to at least one controller (e.g., to a processor, to a computer).

The systems, apparatuses, and/or methods described herein can comprise a material recycling mechanism. The recycling mechanism can collect unused pre-transformed material and return the unused pre-transformed material to a reservoir of a material dispensing mechanism (e.g., the material dispensing reservoir), or to the bulk reservoir that feeds the material dispensing mechanism. Unused pre-transformed material may be material that was not used to form at least a portion of the 3D object. At least a fraction of the pre-transformed material removed from the material bed by the leveling mechanism and/or material removal mechanism can be recovered by the recycling system. At least a fraction of the material within the material bed that did not transform to subsequently form the 3D object can be recovered by the recycling system. A vacuum nozzle (e.g., which can be located at an edge of the material bed) can collect unused pre-transformed material. Unused pre-transformed material can be removed from the material bed without vacuum. Unused pre-transformed (e.g., powder) material can be removed from the material bed manually. Unused pre-transformed material can be removed from the material bed by positive pressure (e.g., by blowing away the unused material). Unused pre-transformed material can be removed from the material bed by actively pushing it from the material bed (e.g., mechanically or using a positive pressurized gas). A gas flow can direct unused pre-transformed material to the vacuum nozzle. A material collecting mechanism (e.g., a shovel) can direct unused material to exit the material bed (and optionally enter the recycling mechanism). The recycling mechanism can comprise one or more filters to control a size range of the particles returned to the reservoir. In some cases, a Venturi scavenging nozzle can collect unused material. The nozzle can have a high aspect ratio (e.g., at least about 2:1, 5:1, 10:1, 20:1, 30:1, 40:1, or 100:1) such that the nozzle does not become clogged with material particle(s). In some embodiments, the material may be collected by a drainage mechanism through one or more drainage ports that drain material from the material bed into one or more drainage reservoirs. The material in the one or more drainage reservoirs may be re used (e.g., after filtration and/or further treatment).

In some cases, unused material can surround the 3D object in the material bed. The unused material can be substantially removed from the 3D object. Substantial removal may refer to material covering at most about 20%, 15%, 10%, 8%, 6%, 4%, 2%, 1%, 0.5%, or 0.1% of the surface of the 3D object after removal. Substantial removal may refer to removal of all the material that was disposed in the material bed and remained as material at the end of the 3D printing process (i.e., the remainder), except for at most about 10%, 3%, 1%, 0.3%, or 0.1% of the weight of the remainder. Substantial removal may refer to removal of all the remainder except for at most abbot 50%, 10%, 3%, 1%, 0.3%, or 0.1% of the weight of the printed 3D object. The unused material can be removed to permit retrieval of the 3D object without digging through the material bed. For example, the unused material can be suctioned out of the material bed by one or more vacuum ports (e.g., nozzles) built adjacent to the material bed, by brushing off the remainder of unused material, by lifting the 3D object from the unused material, by allowing the unused material to flow away from the 3D object (e.g., by opening an exit opening port on the side(s) or on the bottom of the material bed from which the unused material can exit). After the unused material is evacuated, the 3D object can be removed and the unused material can be re-circulated to a material reservoir for use in future builds.

In some embodiments, the platform may comprise a mesh. The base and/or substrate may comprise a mesh. The 3D object can be generated on a mesh. The mesh holes can be blocked. The mesh holes can be open-able (e.g., by a controller and/or manually). A solid platform (e.g., base or substrate) can be disposed underneath the mesh such that the material stays confined in the material bed and the mesh holes are blocked. The blocking of the mesh holes may not allow a substantial amount of material to flow through. The mesh can be moved (e.g., vertically or at an angle) relative to the solid platform by pulling on one or more posts connected to either the mesh or the solid platform (e.g., at the one or more edges of the mesh or of the base) such that the mesh becomes unblocked. The one or more posts can be removable from the one or more edges by a threaded connection. The mesh substrate can be lifted out of the material bed with the 3D object to retrieve the 3D object such that the mesh becomes unblocked. Alternatively, or additionally, the platform can be tilted, horizontally moved such that the mesh becomes unblocked. The platform can include the base, substrate, or bottom of the enclosure. When the mesh is unblocked, at least part of the pre-transformed material flows from the material bed through the mesh while the 3D object remains on the mesh. In some instances, two meshes may be situated such that in one position their holes are blocked, and in the other position, opened. The 3D object can be built on a construct comprising a first and a second mesh, such that at a first position the holes of the first mesh are completely obstructed by the solid parts of the second mesh such that no material can flow through the two meshes at the first position, as both mesh holes become blocked. The first mesh, the second mesh, or both can be controllably moved (e.g., horizontally or in an angle) to a second position. In the second position, the holes of the first mesh and the holes of the second mesh are at least partially aligned such that the material disposed in the material bed is able to flow through to a position below the two meshes, leaving the exposed 3D object.

In some cases, cooling gas can be directed to the hardened material (e.g., 3D object) for cooling the hardened material during and/or following its retrieval. The mesh can be of a size such that the unused material will sift through the mesh as the 3D object becomes exposed from the material bed. In some cases, the mesh can be coupled (e.g., attached) to a pulley or other mechanical device such that the mesh can be moved (e.g., lifted) out of the material bed with the 3D part.

In some cases, a layer of the 3D object is formed within at most about 1 hour (h), 30 minutes (min), 20 min, 10 min, 5 min, 1 min, 40 seconds (s), 20 s, 10 s, 9 s, 8 s, 7 s, 6 s, 5 s, 4 s, 3 s, 2 s, or 1 s. A layer of the 3D can be formed within any time between the aforementioned time scales (e.g., from about 1 h to about 1 s, from about 10 min to about 1 s, from about 40 s to about 1 s, from about 10 s to about 1 s, or from about 5 s to about 1 s).

In some examples, the generated 3D object requires very little or no further processing after its retrieval. In some examples, the diminished further processing or lack thereof, will afford a 3D printing process that requires smaller amount of energy and/or less waste as compared to commercially available 3D printing processes. The smaller amount can be smaller by at least about 1.1, 1.3, 1.5, 2, 3, 4, 5, 6, 7, 8, 9, or 10. The smaller amount may be smaller by any value between the aforementioned values (e.g., from about 1.1 to about 10, or from about 1.5 to about 5). Further processing may comprise trimming, as disclosed herein. Further processing may comprise polishing (e.g., sanding) or trimming. For example, in some cases the generated 3D object can be retrieved and finalized without removal of transformed material and/or auxiliary features. Trimming may comprise ablating. Further processing may comprise curing, baking, or annealing.

The methods, apparatuses, and systems provided herein can result in fast and efficient formation of 3D objects. In some cases, the 3D object can be transported within at least about 120 min, 100 min, 80 min, 60 min, 40 min, 30 min, 20 min, 10 min, or 5 min after the last layer of the object hardens. In some cases, the 3D object can be transported within any time between the above-mentioned values (e.g., from about 5 min to about 120 min, from about 5 min to about 60 min, or from about 60 min to about 120 min). The 3D object can be transported once it cools to a temperature of at most about 100° C., 90° C., 80° C., 70° C., 60° C., 50° C., 40° C., 30° C., 25° C., 20° C., 15° C., 10° C., or 5° C. The 3D object can be transported once it cools to a temperature value between the above-mentioned temperature values (e.g., from about 5° C. to about 100° C., from about 5° C. to about 40° C., or from about 15° C. to about 40° C.). Transporting the 3D object can comprise packaging and/or labeling the 3D object. In some cases, the 3D object can be transported directly to a consumer.

Systems, apparatuses, and/or methods presented herein can facilitate formation of custom or stock 3D objects for a customer. A customer can be an individual, a corporation, organization, government, non-profit organization, company, hospital, medical practitioner, engineer, retailer, any other entity, or individual. The customer may be one that is interested in receiving the 3D object and/or that ordered the 3D object. A customer can submit a request for formation of a 3D object. The customer can provide an item of value in exchange for the 3D object. The customer can provide a design or a 3D model for the 3D object. The customer can provide the design in the form of a stereo lithography (STL) file. The customer can provide a design where the design can be a definition of the shape and dimensions of the 3D object in any other numerical or physical form. In some cases, the customer can provide a 3D model, sketch, or image as a design of an object to be generated. The design can be transformed in to instructions usable by the printing system to additively generate the 3D object. The customer can provide a request to form the 3D object from a specific material or group of materials (e.g., a material as described herein). In some cases, the design may not contain auxiliary features or marks of any past presence of auxiliary support features.

The 3D object (e.g., solidified material) that is generated for the customer can have an average deviation value from the intended dimensions of at most about 0.5 microns (μm), 1 μm, 3 μm, 10 μm, 30 μm, 100 μm, or 300 μm. The deviation can be any value between the aforementioned values (e.g., from about 0.5 μm to about 300 μm, from about 10 μm to about 50 μm, from about 15 to about 85 μm, from about 5 μm to about 45 μm, or from about 15 μm to about 35 μm). The 3D object can have a deviation from the intended dimensions in a specific direction, according to the formula $Dv+L/K_{Dv}$, wherein Dv is a deviation value, L is the length of the 3D object in a specific direction, and $K_{Dv}$ is a constant. Dv can have a value of at most about 300 μm, 200 μm, 100 μm, 50 μm, 40 μm, 30 μm, 20 μm, 10 μm, 5 μm, 1 μm, or 0.5 μm. Dv can have a value of at least about 0.5 μm, 1 μm, 3 μm, 5 μm, 10 μm, 20 μm, 30 μm, 50 μm, 70 μm, 100 μm, or 300 μm. Dv can have any value between the aforementioned values (e.g., from about 0.5 μm to about 300 μm, from about 10 μm to about 50 μm, from about 15 μm to about 85 μm, from about 5 μm to about 45 μm, or from about 15 μm to about 35 μm). $K_{dv}$ can have a value of at most about 3000, 2500, 2000, 1500, 1000, or 500. $K_{dv}$ can have a value of at least about 500, 1000, 1500, 2000, 2500, or 3000. $K_{dv}$ can have any value between the aforementioned values (e.g., from about 3000 to about 500, from about 1000 to about 2500, from about 500 to about 2000, from about 1000 to about 3000, or from about 1000 to about 2500). The intended dimensions can be derived from a model design. The 3D part can have the stated accuracy value immediately after its formation, without additional processing (e.g., further processing) or manipulation. Receiving the order for the object, formation of the object, and delivery of the object to the customer can take at most about 7 days, 6 days, 5 days, 3 days, 2 days, 1 day, 12 hours, 6 hours, 5 hours, 4 hours, 3 hours, 2 hours, 1 hour, 30 min, 20 min, 10 min, 5 min, 1 min, 30 seconds, or 10 seconds. In some cases, the 3D object can be additively generated in a period between any of the aforementioned time periods (e.g., from about 10 seconds to about 7 days, from about 10 seconds to about 12 hours, from about 12 hours to about 7 days, or from about 12 hours to about 10 minutes). The time can vary based on the physical characteristics of the object, including the size and/or complexity of the object.

In some embodiments, the system and/or apparatus comprises at least one controlling system (e.g., comprising a controller). In some examples, the controller controls one or more of the components described herein. In some instances, at least two apparatuses are controlled by one controller. In some instances, each of at least two apparatuses has a different controller. The controller may comprise a computer-processing unit (e.g., at least one computer) coupled to any of the systems, apparatuses, and/or their respective components (e.g., the energy source(s)). The computer can be operatively coupled through a wired and/or wireless connection. In some cases, the computer can be on board a user device. A user device can be a laptop computer, desktop computer, tablet, smartphone, or another computing device. The controller can be in communication with a cloud computer system and/or a server. The controller can be programmed to selectively direct the energy source(s) to apply energy to the at least a portion of the target surface at a power per unit area. The controller can be in communication with the scanner configured to articulate the energy source(s) to apply energy to at least a portion of the target surface at a power per unit area.

The controller may control the layer dispensing mechanism and/or any of its components. The control may comprise controlling (e.g., directing and/or regulating) the speed (velocity) of movement of an apparatus or any of its components. The movement may be horizontal, vertical, and/or in an angle. The controller may control the cooling member (e.g., external and/or internal). The control may be manual and/or automatic. The control may be programmed and/or be effectuated a whim. The control may be according to an algorithm. The algorithm may comprise a printing algorithm, or motion control algorithm. The algorithm may take into account the control-model of the 3D object.

Figure 13:
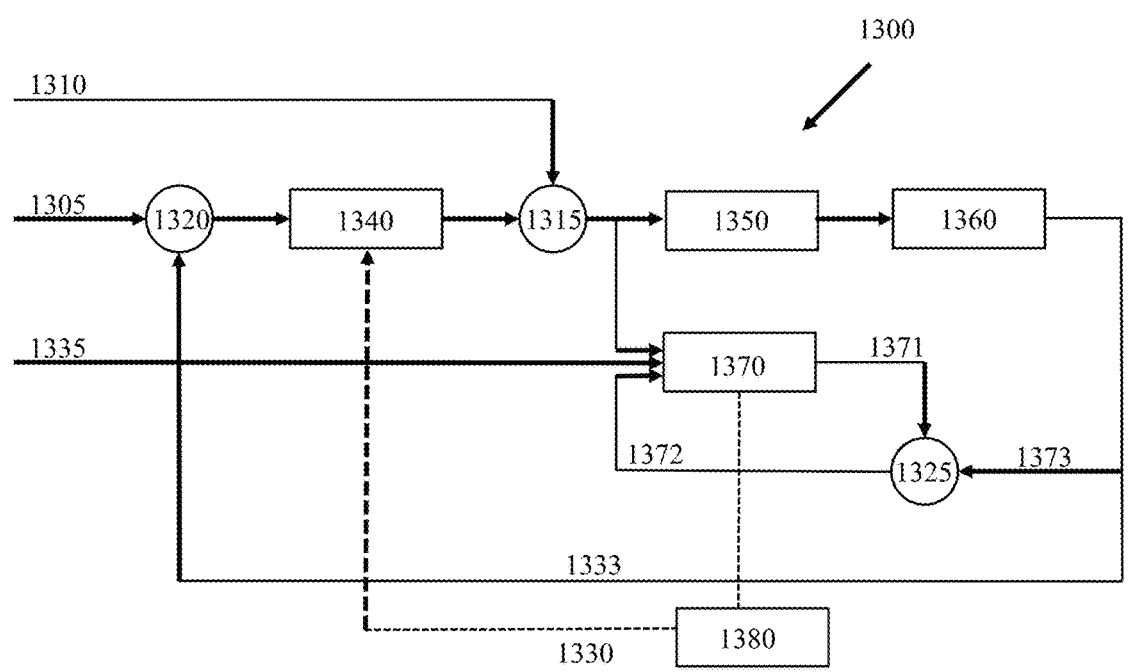
FIG. 13 schematically illustrates a controller (e.g., control system) used in the formation of one or more 3D objects.

FIG. 13 shows a schematic example of a (e.g., automatic) controller (e.g., a control system, or a first-controller) 1300 that is programmed or otherwise configured to facilitate formation of one or more 3D objects. In this example, the controller 1300 comprises a subordinate-controller 1340, at least one forming 3D object 1350, one or more sensors (e.g. temperature sensor) 1360, one or more control-models 1370 for the physical process of 3D printing and optionally at least one feedback control loop (e.g., 1330, and 1333). The subordinate-controller may be an internal-controller. The subordinate-controller can be a second-controller as part of the first controller. The subordinate-controller (e.g., 1340) can be a linear controller. The controller 1300 may be configured to control (e.g., in real time during at least a portion of the 3D printing) a controllable property comprising: (i) an energy beam power (e.g., delivered to the material bed), (ii) temperature at a position in the material bed (e.g., on the forming 3D object), (iii) energy beam speed, (iv) energy beam power density, (v) energy beam dwell time, (vi) energy beam footprint (e.g., on the exposed surface of the material bed), (vii) energy beam focus, or (viii) energy beam cross-section. The controllable property may be a control variable. The control may be to maintain a target parameter (e.g., temperature) of one or more forming 3D objects. The target parameter may vary in time (e.g., in real time) and/or in location. The location may comprise a location at the exposed surface of the material bed. The location may comprise a location at the top surface of the (e.g., forming) 3D object. The target parameter may correlate to the controllable property. The (e.g., input) target parameter may vary in time and/or location in the material bed (e.g., on the forming 3D object). The subordinate-controller may receive a pre-determined power per unit area (of the energy beam), temperature, and/or metrological (e.g., height) target value. For example, the subordinate-controller may receive a target parameter 1305 (e.g. temperature) to maintain at least one characteristic of the forming 3D object (e.g., dimension in a direction, and/or temperature). In the example shown in FIG. 13, the controller receives three types of target inputs: (i) energy beam power 1310 (which may be user defined), (ii) temperature (e.g., 1305), and (iii) geometry (e.g., 1335). The geometry may comprise geometrical object pre-print correction. The geometric information may derive from the 3D object (or a correctively deviated (e.g., altered) model thereof). The geometry may comprise geometric information of a previously printed portion of the 3D object (e.g., comprising a local thickness below a given layer, local build angle, proximity to an edge on a given layer, or proximity to layer boundaries). The geometry may be an input to the controller (e.g., via an open loop control scheme). Some of the target values may be used to form 3D printing instructions for generating the 3D object (e.g., 1350). The printing instructions may be dynamically adjusted in real time. The controller may monitor (e.g., continuously) one or more signals from one or more sensors (e.g., 1360). For example, the controller may monitor the energy beam power, temperature of a position in the material bed, and/or metrology (e.g., height) of a position in the material bed. The position in the material bed may be of the forming 3D object. The monitor may be continuous or discontinuous. The monitor may be in real-time during the 3D printing. The monitor may be using the one or more sensors. The printing instructions may be dynamically adjusted in real time (e.g., using the signals from the one or more sensors). A variation between the target parameter and the sensed parameter may be used to estimate an error in the value of that parameter (e.g., 1320). The variation (e.g., error) may be used by the subordinate-controller (e.g., 1340) to adjust the printing instructions. The controller may control (e.g., continuously) one or more parameters (e.g., in real time). The controller may use historical data (e.g., for the parameters). The historical data may be of previously printed 3D objects, or of previously printed layers of the 3D object. The control-model may comprise free parameters which may be estimated using a characterization process. The characterization process may be before, during (e.g., in real time), or after the 3D printing. The control-model may be wired to the controller. The control model can be configured into the controller (e.g., before and/or during the 3D printing). Configured may comprise built, constructed, designed, patterned, or arranged. The hardware of the controller may comprise the control-model. The control-model may be linear or non-linear. For example, the control-model may be non-linear. The control-model may comprise linear or non-linear modes.

A control-model may predict and/or estimate one or more physical parameters (e.g., 1371) of the forming 3D object (e.g., in real time). In some embodiments, the control-model is a reduced form of the 3D model of the desired 3D object. In some embodiments, the control-model is a simplified 3D model compared to the complete 3D model of the desired 3D object. The physical parameters may comprise shape. For example, the control-model may comprise the shape (e.g., geometry) of the 3D object. The control-model may be used to adjust the 3D printing. The control-model may comprise a simulation. The simulation may comprise an imitation of a real-world process (e.g., 3D printing) over time. The simulation may comprise finite element analysis. For example, the control-model may comprise a thermal and/or mechanical (e.g., elastic and/or plastic) simulation. For example, the control-model may comprise thermo-mechanical (e.g., thermo-elastic and/or thermo-plastic) simulation. The simulation may comprise the material(s) of the forming 3D object (e.g., material(s) in the material bed). For example, the simulation may comprise the material properties of the desired 3D object. The simulation and/or control-model may be adjusted (e.g., using the control loop) using one or more measured parameters. The simulation and/or control-model may be adjusted in real-time. The control-model may output an estimation of the parameter. The simulation and/or control-model may use an input from the one or more sensors (e.g., power, temperature, and/or metrology sensors). The control-model can comprise one or more free parameters. The one or more free parameters can be optimized in real time (e.g., using one or more sensor signals). The controller may comprise an internal-state-system that provides an estimate of an internal state of the 3D printer and/or 3D printing. The internal state can be derived from one or more measurements of the control variable and/or input parameters. The internal-state-system may be implemented using a computer. The internal-state-system may comprise a state-observer. The controller may comprise a state-observer. The control-model can be a state-observer-model. The controller may comprise a reconfigurable firm-ware (e.g., flash memory). The controller may comprise a microprocessor. The controller may comprise a (e.g., programmable and/or reconfigurable) circuit. The estimated parameter may be compared (e.g., 1325) with the measured parameter (e.g., 1373). The comparison may be used to alter (e.g., 1372) the control-model. The control-model may dynamically be adjusted in real time. The simulation may be dynamically adjusted in real-time. The prediction of the parameter may be done offline (e.g. pre-determined) and/or in real-time (e.g., during the 3D printing). The control-model may receive the sensed parameter (s) value(s). The control-model may use the sensed parameter(s) value(s) for a prediction and/or adjustment of at least one target parameter. For example, the control-model may use geometric information (e.g., 1335) associated with the requested and/or forming 3D object. The control-model may set up a feedback control loop (e.g., 1330) to adjust one or more target parameters in order to achieve convergence (e.g., with the desired 3D object). The feedback loop(s) control may comprise one or more comparisons with an input parameter (e.g., 1320) and/or threshold value (e.g., 1380). Real time may be during formation of at least one: 3D object, a layer within the 3D object, dwell time of an energy beam along a path, dwell time of an energy beam along a hatch line, and dwell time of an energy beam forming a melt pool. The one or more forming 3D objects can be generated (e.g., substantially) simultaneously, or sequentially. The one or more 3D objects can be formed in a (e.g., single) material bed.

The subordinate-controller 1340 may output one or more parameters as part of the 3D printing instructions. The output of the subordinate-controller may be based on one or more parameter input (e.g., of a different type). For example, the subordinate-controller may receive a temperature input and output a power parameter. The output parameter may be compared with the same type of parameter that was input. For example, the output power parameter, may be compared with (e.g., 1315) a power input to generate the printing instructions for the portion of the 3D object. The comparison may be a dynamic comparison in real time. The comparison may be prior or subsequent to the 3D printing.

The controller may be implemented in a processor hardware (e.g., GPU, CPU, or FPGA). The controller may have a band width of at least about 1 Kilo-Hertz (KHz), 5 KHz, 10 KHz, 20 KHz, 30 KHz, 30 KHz, 40 KHz, 50 KHz, 60 KHz, 70 KHz, or 80 KHz. The controller may have a band width between any of the aforementioned values (e.g., from about 1 KHz to about 80 KHz, from about 1 KHz to about 50 KHz, from about 10 KHz, to about 50 KHz, from about 30 KHz to about 60 KHz, or from about 50 KHz to about 80 KHz).

Figure 12:
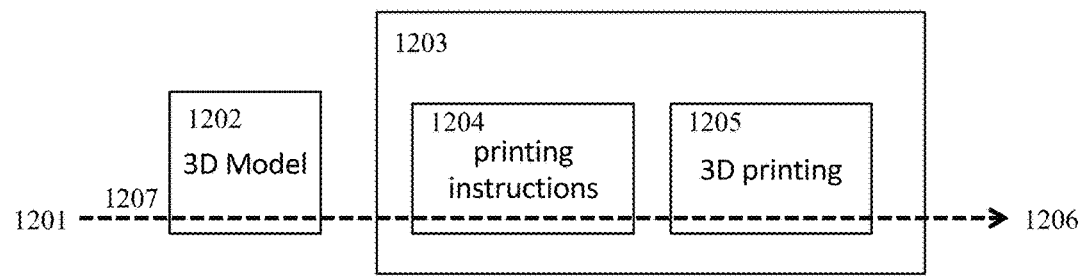
FIG. 12 schematically illustrates a flow chart for the formation of one or more 3D objects.

The systems, methods, and/or apparatuses disclosed herein may comprise receiving a request for a 3D object (e.g., from a customer). The request can include a 3D model (e.g., CAD) of the desired 3D object. Alternatively or additionally, a 3D model of the desired 3D object may be generated. The 3D model may be used to generate 3D printing instructions. The 3D printing instructions may exclude the 3D model. The 3D printing instructions may be based on the 3D model. The 3D printing instructions may take the 3D model into account. The 3D printing instructions may be based on simulations (e.g., as disclosed herein). In some embodiments, the 3D printing instructions may use more than one 3D model. The 3D printing instructions may comprise using an algorithm (e.g., embedded in a software) that takes into account the 3D model. The algorithm may comprise the simulation. The algorithm may take into account a deviation in shape (e.g., geometry) from the model. The deviation may be a structural (e.g., geometrical) deviation. In some embodiments, the 3D model may comprise feedback or feed forward controls based on an algorithm (e.g., comprised in a script). The algorithm may be embedded in a script. In some examples, a script is a language specific computer readable media (e.g., software) implementation of the algorithm. For example, the control-model may combine feedback and feed-forward controls based on an algorithm (e.g., FIG. 13). The deviation may be a corrective deviation. The corrective (structural) deviation may be such that at least a portion of the 3D object is printed according to a deviation from the 3D model of the desired 3D object; and upon hardening, the at least a portion of the 3D object (and/or the entire 3D object) will not (e.g., substantially) deviate from the 3D model of the desired 3D object. The deviation may span one or more layers of the 3D object. For example, the deviation in shape (e.g., in geometry) may span a multiplicity of layers. At times, at least a portion of the layer (e.g., slice thereof) is deviated from the 3D model. A slice is a virtual reality representation of the layer of the 3D object in the 3D model. The 3D model is a virtual reality representation of a desired 3D object. Virtual reality may comprise computerized, or computer generated. At least the first derivative of the difference between the deviated model and the requested model of the 3D object, may be continuous (e.g., smooth). At least the first derivative can be smooth (e.g., continuous). The at least the first derivative can be a plurality of derivatives. The plurality of derivatives can comprise at least the $2^{nd}$, $3^{rd}$, $4^{th}$, $5^{th}$, $6^{th}$, $7^{th}$, $8^{th}$, $9^{th}$, or $10^{th}$ derivative. At times, at least the first degree gradient of the geometrical deviation field is smooth (e.g., continuous). The geometrical deviation field can include a difference between the deviated model and the requested model of the 3D object. At times, the at least the first derivative may be infinitely smooth. At times, all the derivatives are continuous. At times, the at least the first degree comprises a plurality of degrees. The deviation may exclude inserting one or more kinks in the 3D object. The smooth one or more derivatives is of the deviation from the 3D object (e.g., to differentiate from a structural derivative(s) of the 3D object). The derivative and/or gradient may be sensitive to the change in geometry between the desired 3D object, and the deformed 3D object. The deviation may be a corrective deviation that at least in part compensates for deformation during the 3D printing. The deformation may be an accumulated deformation. The accumulated deformation may be a residually accumulated deformation during the 3D printing. Such corrective (e.g., compensatory) deviation is termed herein as "object pre-print correction." The deviation may be an adjustment or alteration In some embodiments, the printed deviation is cancelled out due to deformation of the 3D object (or portion thereof) during the 3D printing. In some embodiments, the algorithm used to form the 3D printing instructions excludes a feedback control loop (e.g., closed loop). In some embodiments, 3D printing instructions may exclude taking into account metrology and/or temperature measurements of the generated 3D object (e.g., measurements of the 3D object) or parts thereof. In some embodiments, 3D printing instructions may include taking into account metrology and/or temperature measurements of the generated 3D object (e.g., measurements of the 3D object) or parts thereof. In some embodiments, the 3D printing instructions may comprise an open loop control. The algorithm may use historical (e.g., empirical) data. The empirical data may be of characteristic structures (e.g., that are included in the desired 3D object). The characteristic structures may be (e.g., substantially) similar to at least portions of the 3D object. The empirical data may be previously obtained. In some embodiments, the algorithm may comprise a feed forward control loop. The feed forward control loop may override one or more model parameters (for example, measurements and/or corrections). In some embodiments, the algorithm may comprise feed forward control loop (e.g., elements thereof), feedback control loop (e.g., elements thereof), or a combination of feed forward and feedback control loop (e.g., elements thereof). In some embodiments, the algorithm may use a theoretical model. The algorithm may use a model of energy flow (e.g., heat flow). At times, the algorithm comprises thermal, or mechanical algorithm. The mechanical algorithm may comprise elastic or plastic algorithm. In some examples, the generation of the 3D object using a (e.g., structurally) altered 3D model may exclude an iterative process. In some examples, the generation of the 3D object using an altered 3D model may include an iterative process. The generation of the 3D object may not involve an alteration of the 3D model (e.g., CAD), but rather generate a new set of 3D printing instructions. In some embodiments, the algorithm is used to alter 3D printing instructions received by at least one of the components involved in the 3D printing process (e.g., energy beam). In some embodiments, the algorithm does not (e.g., structurally) alter the 3D model. The algorithm may comprise a generic approach to printing a desired 3D object (or portions thereof.) In some embodiments, the algorithm is not based on at least one of (i) altering 3D printing instructions that are based on printing the desired 3D object, (ii) measuring errors in the printed 3D object, and (iii) revising the printing instructions. In some embodiments, the algorithm is not based on an iterative process that takes into account the desired and printed 3D object (e.g., in real-time). The algorithm may be based on an estimation of one or more errors (e.g., deformation errors) during the printing of the desired 3D object. The algorithm may comprise correcting the estimated errors through the generation of respective 3D printing instructions that take into account the anticipated errors. In some examples, the algorithm comprises circumventing the estimated errors through the generation of respective 3D printing instructions. The correction of errors may be prior and/or during the 3D printing (e.g., in real-time). In this manner, the algorithm may circumvent generation of errors (e.g., structural errors such as deformations). The algorithm may be based on an estimation of one or more errors (e.g., before or during the printing of the desired 3D object) and correcting them through the generation of respective 3D printing instructions that take into account the anticipated errors, and thus circumvent the generation of the errors. The error may comprise the deviation from the 3D model of the desired 3D object. The estimation may be based on simulation, modeling, and/or historical data (e.g., of representative 3D structures or 3D structure segments). In some embodiments, the error(s) may not be anticipated (e.g. in real-time). In some embodiments, one or more sensors operatively coupled to the at least one controllably monitor the forming 3D object (e.g., and detect errors). The 3D printing instructions may be altered in real time to correct the detected errors. FIG. 12 shows an example of a flow chart representing at least a portion of the 3D printing process operations that are executed by a 3D printing system and/or apparatus described herein. The desired 3D object is requested in operation 1201. A 3D model is provided or generated in operation 1202. Operation 1204 illustrates the generation of printing instruction(s) for the 3D object, in which at least one of the 3D model and the algorithm is utilized. In this example, the 3D object is subsequently generated using the printing instruction(s) in operation 1205. In this example, the desired 3D object is delivered in operation 1206. Arrow 1207 designates the direction of the execution of the operations from operation 1201 to operation 1206. The absence of back feeding arrow represents the lack of a feedback loop control.

In some embodiments, the controller comprises a processing unit. The processing unit may be central. The processing unit may comprise a central processing unit (herein "CPU"). The controller (e.g., comprising a computer system) may be programmed to implement methods of the disclosure. The controller may control at least one component of the systems and/or apparatuses disclosed herein. FIG. 14 is a schematic example of a computer system 1400 that is programmed or otherwise configured to facilitate the formation of a 3D object according to the methods provided herein. The computer system 1400 can control (e.g., direct and/or regulate) various features of printing methods, apparatuses and systems of the present disclosure, such as, for example, regulating force, translation, heating, cooling and/ or maintaining the temperature of a material bed, process parameters (e.g., chamber pressure), energy beam characteristic, scanning route of the energy source, position and/or temperature of the cooling member(s), application of the amount of energy emitted to a selected location, or any combination thereof. The computer system can be part of, or be in communication with, a printing system or apparatus, such as a 3D printing system or apparatus of the present disclosure. The computer may be coupled to one or more mechanisms disclosed herein, and/or any parts thereof. For example, the computer may be coupled to one or more sensors, valves, switches, motors, pumps, or any combination thereof.

The computer system 1400 can include a processing unit 1406 (also "processor," "computer" and "computer processor" used herein). The computer system may include memory or memory location 1402 (e.g., random-access memory, read-only memory, flash memory), electronic storage unit 1404 (e.g., hard disk), communication interface 1403 (e.g., network adapter) for communicating with one or more other systems, and peripheral devices 1405, such as cache, other memory, data storage and/or electronic display adapters. In some examples, the memory 1402, storage unit 1404, interface 1403, and peripheral devices 1405 are in communication with the processing unit 1406 through a communication bus (solid lines), such as a motherboard. The storage unit can be a data storage unit (or data repository) for storing data. The computer system can be operatively coupled to a computer network ("network") 1401 with the aid of the communication interface. The network can be the Internet, an Internet and/or extranet, or an intranet and/or extranet that is in communication with the Internet. The network in some cases is a telecommunication and/or data network. The network can include one or more computer servers, which can enable distributed computing, such as cloud computing. The network, in some cases with the aid of the computer system, can implement a peer-to-peer network, which may enable devices coupled to the computer system to behave as a client or a server.

The processing unit can execute a sequence of machine-readable instructions, which can be embodied in a program or software. The instructions may be stored in a memory location, such as the memory 1402. The instructions can be directed to the processing unit, which can subsequently program or otherwise configure the processing unit to implement methods of the present disclosure. Examples of operations performed by the processing unit can include fetch, decode, execute, or write back. The processing unit may interpret and/or execute instructions. The processor may include a microprocessor, data processor, central processing unit (CPU), graphical processing unit (GPU), system-on-chip (SOC), co-processor, network processor, application specific integrated circuit (ASIC), application specific instruction-set processor (ASIPs), controller, programmable logic device (PLD), chipset, field programmable gate array (FPGA), or any combination thereof. The processing unit can be part of a circuit, such as an integrated circuit. One or more other components of the system 1400 can be included in the circuit.

The storage unit 1404 can store files, such as drivers, libraries and saved programs. The storage unit can store user data, e.g., user preferences and user programs. The computer system in some cases can include one or more additional data storage units that are external to the computer system, such as located on a remote server that is in communication with the computer system through an intranet or the Internet.

The computer system can communicate with one or more remote computer systems through the network. For instance, the computer system can communicate with a remote computer system of a user (e.g., operator). Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system via the network.

Methods as described herein can be implemented by way of machine (e.g., computer processor) executable code stored on an electronic storage location of the computer system, such as, for example, on the memory 1402 or electronic storage unit 1404. The machine executable or machine-readable code can be provided in the form of software. During use, the processor 1406 can execute the code. In some cases, the code can be retrieved from the storage unit and stored on the memory for ready access by the processor. In some situations, the electronic storage unit can be precluded, and machine-executable instructions are stored on memory.

The code can be pre-compiled and configured for use with a machine have a processer adapted to execute the code, or can be compiled during runtime. The code can be supplied in a programming language that can be selected to enable the code to execute in a pre-compiled or as-compiled fashion.

The processing unit may include one or more cores. The computer system may comprise a single core processor, multi core processor, or a plurality of processors for parallel processing. The processing unit may comprise one or more central processing unit (CPU) and/or a graphic processing unit (GPU). The multiple cores may be disposed in a physical unit (e.g., Central Processing Unit, or Graphic Processing Unit). The processing unit may include one or more processing units. The physical unit may be a single physical unit. The physical unit may be a die. The physical unit may comprise cache coherency circuitry. The multiple cores may be disposed in close proximity. The physical unit may comprise an integrated circuit chip. The integrated circuit chip may comprise one or more transistors. The integrated circuit chip may comprise at least 0.2 billion transistors (BT), 0.5 BT, 1BT, 2 BT, 3 BT, 5 BT, 6 BT, 7 BT, 8 BT, 9 BT, 10 BT, 15 BT, 20 BT, 25 BT, 30 BT, 40 BT, or 50 BT. The integrated circuit chip may comprise any number of transistors between the afore-mentioned numbers (e.g., from about 0.2 BT to about 100 BT, from about 1 BT to about 8 BT, from about 8 BT to about 40 BT, or from about 40 BT to about 100 BT). The integrated circuit chip may have an area of at most 50 mm$^2$, 60 mm$^2$, 70 mm$^2$, 80 mm$^2$, 90 mm$^2$, 100 mm$^2$, 200 mm$^2$, 300 mm$^2$, 400 mm$^2$, 500 mm$^2$, 600 mm$^2$, 700 mm$^2$, or 800 mm$^2$. The integrated circuit chip may have an area of any value between the afore-mentioned values (e.g., from about 50 mm$^2$ to about 800 mm$^2$, from about 50 mm$^2$ to about 500 mm$^2$, or from about 500 mm$^2$ to about 800 mm$^2$). The close proximity may allow substantial preservation of communication signals that travel between the cores. The close proximity may diminish communication signal degradation. A core as understood herein is a computing component having independent central processing capabilities. The computing system may comprise a multiplicity of cores, which are disposed on a single computing component. The multiplicity of cores may include two or more independent central processing units. The independent central processing units may constitute a unit that read and execute program instructions. The multiplicity of cores can be parallel cores. The multiplicity of cores can function in parallel. The multiplicity of cores may include at least 2, 10, 40, 100, 400, 1000, 2000, 3000, 4000, 5000, 6000, 7000, 8000, 9000, or 10000 cores. The multiplicity of cores may include cores of any number between the afore-mentioned numbers (e.g., from 2 to 40000, from 2 to 400, from 400 to 4000, from 2000 to 4000, or from 4000 to 10000 cores). The cores may communicate with each other via on chip communication networks; and/or control, data and communication channels. The processor may comprise low latency in data transfer (e.g., from one core to another). Latency may refer to the time delay between the cause and the effect of a physical change in the processor (e.g., a signal). Latency may refer to the time elapsed from the source (e.g., first core) sending a packet to the destination (e.g., second core) receiving it (also referred as two point latency). One point latency may refer to the time elapsed from the source (e.g., first core) sending a packet (e.g., signal) to the destination (e.g., second core) receiving it, and the designation sending a packet back to the source (e.g., the packet making a round trip). The latency may be sufficiently low to allow a high number of floating point operations per second (FLOPS). The number of FLOPS may be at least about 1 Tera Flops (T-FLOPS), 2 T-FLOPS, 3 T-FLOPS, 5 T-FLOPS, 6 T-FLOPS, 7 T-FLOPS, 8 T-FLOPS, 9 T-FLOPS, or 10 T-FLOPS. The number of flops may be at most about 5 T-FLOPS, 6 T-FLOPS, 7 T-FLOPS, 8 T-FLOPS, 9 T-FLOPS, 10 T-FLOPS, 20 T-FLOPS, or 30 T-FLOPS. The number of FLOPS may be any value between the afore-mentioned values (e.g., from about 1 T-FLOP to about 30 T-FLOP, from about 4 T-FLOPS to about 10 T-FLOPS, from about 1 T-FLOPS to about 10 T-FLOPS, or from about 10 T-FLOPS to about 30 T-FLOPS. The FLOPS can be measured according to a benchmark. The benchmark may be a HPC Challenge Benchmark. The benchmark may comprise mathematical operations (e.g., equation calculation such as linear equations), graphical operations (e.g., rendering), or encryption/decryption benchmark. The benchmark may comprise a High Performance LINPACK, matrix multiplication (e.g., DGEMM), sustained memory bandwidth to/from memory (e.g., STREAM), array transposing rate measurement (e.g., PTRANS), RandomAccess, rate of Fast Fourier Transform (e.g., on a large one-dimensional vector using the generalized Cooley-Tukey algorithm), or Communication Bandwidth and Latency (e.g., MPI-centric performance measurements based on the effective bandwidth/latency benchmark). LINPACK refers to a software library for performing numerical linear algebra on a digital computer. DGEMM refers to double precision general matrix multiplication. STREAM convention may sum the amount of data that an application code explicitly reads and the amount of data that the application code explicitly writes. PTRANS may measure the rate at which the system can transpose a large array (e.g., matrix). MPI refers to Message Passing Interface.

The computer system may include hyper-threading technology. The computer system may include a chip processor with integrated transform, lighting, triangle setup, triangle clipping, rendering engine, or any combination thereof. The rendering engine may be capable of processing at least about 10 million polygons per second. The rendering engines may be capable of processing at least about 10 million calculations per second. As an example, the GPU may include a GPU by Nvidia, ATI Technologies, S3 Graphics, Advanced Micro Devices (AMD), or Matrox. The processing unit may be able to process algorithms comprising a matrix or a vector. The core may comprise a complex instruction set computing core (CISC), or reduced instruction set computing (RISC).

The computer system may include one or more electronic chips that is reprogrammable (e.g., field programmable gate array (FPGA)). For example, the FPGA may comprise Tabula, Lattice, Altera, or Xilinx FPGA. The electronic chips may comprise one or more programmable logic blocks (e.g., an array). The logic blocks may compute combinational functions, logic gates, or any combination thereof. The computer system may include custom hardware. The custom hardware may comprise an algorithm. The computer system may include custom software that may comprise an algorithm.

The computer system may include configurable computing, partially reconfigurable computing, reconfigurable computing, or any combination thereof. The computer system may include a FPGA. The computer system may include an integrated circuit that performs the algorithm. For example, the reconfigurable computing system may comprise FPGA, CPU, GPU, or multi-core microprocessors. The reconfigurable computing system may comprise a High-Performance Reconfigurable Computing architecture (HPRC). The partially reconfigurable computing may include module-based partial reconfiguration, or difference-based partial reconfiguration.

The computing system may include an integrated circuit that performs the algorithm (e.g., control algorithm). The computing system may include application specific software that performs the algorithm. The physical unit (e.g., the cache coherency circuitry within) may have a clock time of at least about 0.1 Gigabits per second (Gbit/s), 0.5 Gbit/s, 1 Gbit/s, 2 Gbit/s, 5 Gbit/s, 6 Gbit/s, 7 Gbit/s, 8 Gbit/s, 9 Gbit/s, 10 Gbit/s, or 50 Gbit/s. The physical unit may have a clock time of any value between the afore-mentioned values (e.g., from about 0.1 Gbit/s to about 50 Gbit/s, or from about 5 Gbit/s to about 10 Gbit/s). The physical unit may produce the algorithm output in at most 0.1 microsecond (µs), 1 µs, 10 µs, 100 µs, or 1 millisecond (ms). The physical unit may produce the algorithm output in any time between the above mentioned times (e.g., from about 0.1 µs, to about 1 ms, from about 0.1 µs, to about 100 µs, or from about 0.1 µs to about 10 µs). In some instances, the controller may use calculations, real time measurements, or any combination thereof to control the energy beam(s). In some instances, the real time measurements (e.g., temperature measurements) may provide input at a rate of at least about 0.1 KHz, 1 KHz, 10 KHz, 100 KHz, 1000 KHz, or 10000 KHz). In some instances, the real time measurements may provide input at a rate between any of the above-mentioned rates (e.g., from about 0.1 KHz to about 10000 KHz, from about 0.1 KHz to about 1000 KHz, or from about 1000 KHz to about 10000 KHz). The memory bandwidth of the processing unit may be at least about 1 gigabytes per second (Gbytes/s), 10 Gbytes/s, 100 Gbytes/s, 200 Gbytes/s, 300 Gbytes/s, 400 Gbytes/s, 500 Gbytes/s, 600 Gbytes/s, 700 Gbytes/s, 800 Gbytes/s, 900 Gbytes/s, or 1000 Gbytes/s. The memory bandwidth of the processing unit may any value between the aforementioned values (e.g., from about 1 Gbytes/s to about 1000 Gbytes/s, from about 100 Gbytes/s to about 500 Gbytes/s, from about 500 Gbytes/s to about 1000 Gbytes/s, or from about 200 Gbytes/s to about 400 Gbytes/s).

Aspects of the systems, apparatuses, and/or methods provided herein, such as the computer system, can be embodied in programming. Various aspects of the technology may be thought of as "product," "object," or "articles of manufacture" typically in the form of machine (or processor) executable code and/or associated data that is carried on or embodied in a type of machine-readable medium. Machine-executable code can be stored on an electronic storage unit, such memory (e.g., read-only memory, random-access memory, flash memory) or a hard disk. The storage may comprise non-volatile storage media. "Storage" type media can include any or all of the tangible memory of the computers, processors or the like, or associated modules thereof, such as various semiconductor memories, tape drives, disk drives, external drives, and the like, which may provide non-transitory storage at any time for the software programming.

The memory may comprise a random access memory (RAM), dynamic random access memory (DRAM), static random access memory (SRAM), synchronous dynamic random access memory (SDRAM), ferroelectric random access memory (FRAM), read only memory (ROM), programmable read only memory (PROM), erasable programmable read only memory (EPROM), electrically erasable programmable read only memory (EEPROM), a flash memory, or any combination thereof. The flash memory may comprise a negative-AND (NAND) or NOR logic gates. The storage may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links, or the like, also may be considered as media bearing the software. As used herein, unless restricted to non-transitory, tangible "storage" media, terms such as computer or machine "readable medium" refer to any medium that participates in providing instructions to a processor for execution.

Hence, a machine-readable medium, such as computer-executable code, may take many forms, including but not limited to, a tangible storage medium, a carrier wave medium, or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables, wire (e.g., copper wire), and/or fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. The memory and/or storage may comprise a storing device external to and/or removable from device, such as a Universal Serial Bus (USB) memory stick, or a hard disk. Many of these forms of computer readable media may be involved in carrying one or more sequences of one or more instructions to a processor for execution.

The computer system can include or be in communication with an electronic display that comprises a user interface (UI) for providing, for example, a model design or graphical representation of a 3D object to be printed. Examples of UI's include, without limitation, a graphical user interface (GUI) and web-based user interface. The computer system can monitor and/or control various aspects of the 3D printing system. The control may be manual and/or programmed. The control may rely on feedback mechanisms that have been pre-programmed. The feedback mechanisms may rely on input from sensors (described herein) that are connected to the control unit (e.g., control system. E.g., computer). The computer system may store historical data concerning various aspects of the operation of the 3D printing system. The historical data may be retrieved at predetermined times and/or at a whim. The historical data may be accessed by an operator and/or by a user. The historical and/or operative data may be provided in an output unit such as a display unit. The output unit (e.g., monitor) may output various parameters of the 3D printing system (as described herein) in real time or in a delayed time. The output unit may output the current 3D printed object, the ordered 3D printed object, or both. The output unit may output the printing progress of the 3D printed object. The output unit may output at least one of the total time, time remaining, and time expanded on printing the 3D object. The output unit may output (e.g., display, voice, and/or print) the status of sensors, their reading, and/or time for their calibration or maintenance. The output unit may output the type of material(s) used and various characteristics of the material(s) such as temperature and flowability of the pre-transformed material. The output unit may output the amount of oxygen, water, and pressure in the printing chamber (i.e., the chamber where the 3D object is being printed). The computer may generate a report comprising various parameters of the 3D printing system, method, and or objects at predetermined time(s), on a request (e.g., from an operator), and/or at a whim. The output unit may comprise a screen, printer, or speaker. The controller may provide a report. The report may comprise any items recited as optionally output by the output unit.

The system and/or apparatus described herein (e.g., controller) and/or any of their components may comprise an output and/or an input device. The input device may comprise a keyboard, touch pad, or microphone. The output device may be a sensory output device. The output device may include a visual, tactile, or audio device. The audio device may include a loudspeaker. The visual output device may include a screen and/or a printed hard copy (e.g., paper). The output device may include a printer. The input device may include a camera, a microphone, a keyboard, or a touch screen. The system and/or apparatus described herein and/or any of their components may comprise Bluetooth technology. The system and/or apparatus described herein and/or any of their components may comprise an electronic circuit. The system and/or apparatus described herein and/or any of their components may comprise a communication port. The communication port may be a serial port or a parallel port. The communication port may be a Universal Serial Bus port (i.e., USB). The system and/or apparatus described herein (e.g., controller) and/or any of their components may comprise USB ports. The USB can be micro or mini USB. The USB port may relate to device classes comprising 00h, 01h, 02h, 03h, 05h, 06h, 07h, 08h, 09h, 0Ah, 0Bh, 0Dh, 0Eh, 0Fh, 10h, 11h, DCh, E0h, EFh, FEh, or FFh. The system and/or apparatus described herein and/or any of their components may comprise a plug and/or a socket (e.g., electrical, AC power, DC power). The system and/or apparatus described herein and/or any of their components may comprise an adapter (e.g., AC and/or DC power adapter). The system and/or apparatus described herein and/or any of their components may comprise a power connector. The power connector can be an electrical power connector. The power connector may comprise a magnetically coupled (e.g., attached) power connector. The power connector can be a dock connector. The connector can be a data and power connector. The connector may comprise pins. The connector may comprise at least 10, 15, 18, 20, 22, 24, 26, 28, 30, 40, 42, 45, 50, 55, 80, or 100 pins.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations, or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations, or equivalents. It is intended that the following claims define the scope of the invention and that methods and structures within the scope of these claims and their equivalents be covered thereby.

What is claimed is:

1. A system for forming at least one three-dimensional object, comprising:
    an energy source that is configured to generate an energy beam that transforms at least a portion of a material bed to form the at least one three-dimensional object; and
    a controller comprising a control model that comprises a simulation for formation of the at least one three-dimensional object, which controller is programmed to execute the simulation for the formation of the at least one three-dimensional object, which control model (i) is configured in the controller and (ii) adjusts the simulation in real time upon receiving an input from a feedback loop, wherein the controller is operatively coupled to the energy source and is programmed to direct the energy source to generate the energy beam to transform the at least the portion of the material bed to form the at least one three-dimensional object using the control model.

2. The system of claim 1, wherein the control model is adjustable in real time during the formation of the at least one three-dimensional object.

3. The system of claim 2, wherein the control model is adjustable in real time during a dwell time of the energy beam along a hatch line as the energy beam forms a melt pool.

4. The system of claim 1, wherein the input comprises a temperature, height, or power density signal.

5. The system of claim 1, wherein the at least one three-dimensional object is a plurality of three-dimensional objects.

6. The system of claim 5, wherein the plurality of three-dimensional objects is formed in the same material bed.

7. The system of claim 5, wherein the plurality of three-dimensional objects is formed simultaneously.

8. The system of claim 1, wherein the controller comprises open loop control.

9. The system of claim 1, wherein the controller comprises a feedback or feed-forward control.

10. The system of claim 1, wherein the simulation comprises use of a temperature, mechanical, geometrical, or material property of the at least one three-dimensional object.

11. The system of claim 1, wherein the controller comprises an internal state system that provides an estimate of an internal state of formation of the at least one three-dimensional object.

12. The system of claim 11, wherein the internal state system comprises a state observer.

13. The system of claim 11, wherein the internal state of the internal state system is derived from one or more measurements comprising a measurement of a control variable or a measurement of the input.

14. The system of claim 13, wherein the input comprises a power, temperature, or a metrologyrelated signal.

15. The system of claim 1, wherein the controller comprises a graphical processing unit (GPU), system-on-chip (SOC), application specific integrated circuit (ASIC), application specific instruction-set processor (ASIPs), programmable logic device (PLD), or field programmable gate array (FPGA).

16. The system of claim 1, wherein the controller is programmed to direct the energy source to generate the energy beam to transform the at least the portion of the material bed to the at least one three-dimensional object in a manner such that, upon formation, the at least one three-dimensional object deviates from at least one requested three-dimensional object at a side of the at least one three-dimensional object having a length L, by at most 50+L/2500 micrometers.

17. The system of claim 1, wherein the control model comprises a state observer model.

18. A method for forming at least one three-dimensional object, comprising:
(a) transforming a portion of a material bed with an energy beam to form the at least one three-dimensional object; and
(b) controlling in real time at least one characteristic of the energy beam with a controller comprising a control model that comprises a simulation for formation of the at least one three-dimensional object, which controller executes the simulation for the formation of the at least one three-dimensional object, wherein the control model (i) is configured in the controller and (ii) adjusts the simulation in real time upon receiving an input from a feedback loop.

19. The method of claim 18, wherein the control model is adjusted in real time during a dwell time of the energy beam along a hatch line forming a melt pool.

20. The method of claim 18, wherein controlling uses a processor performing at least 3 Tera floating point operations per second.

21. The method of claim 18, further comprising adjusting the at least one characteristic of the energy beam and repeating (a) and (b).

22. The method of claim 18, wherein the feedback loop uses at least one threshold value.

23. The method of claim 18, wherein the control model comprises a simplified model relative to a virtual model of the at least one three-dimensional object.

24. The method of claim 18, wherein the control model is adjusted in real time during the formation of the at least one three-dimensional object.

25. The method of claim 18, wherein the control model comprises a state observer model.

26. The method of claim 18, wherein the input comprises a power, temperature, or a metrologyrelated signal.

27. The method of claim 18, wherein the simulation comprises a temperature simulation or a mechanical simulation of forming the at least one three-dimensional object.

28. The method of claim 18, wherein the simulation comprises use of a material property of the at least one three-dimensional object.

29. The method of claim 18, wherein the simulation comprises use of a geometry of the at least one three-dimensional object.

30. The method of claim 18, wherein the control model is dynamically adjusted in the real time during the formation of the at least one three-dimensional object.

* * * * *

UNITED STATES PATENT AND TRADEMARK OFFICE
CERTIFICATE OF CORRECTION

PATENT NO. : 10,065,270 B2
APPLICATION NO. : 15/339712
DATED : September 4, 2018
INVENTOR(S) : Benyamin Buller et al.

It is certified that error appears in the above-identified patent and that said Letters Patent is hereby corrected as shown below:

In the Claims

In Claim 30, Column 100, Line 30, delete "the" before "real time"

Signed and Sealed this
Fourth Day of December, 2018

Andrei Iancu
*Director of the United States Patent and Trademark Office*